(12) United States Patent
Omata et al.

(10) Patent No.: US 11,004,394 B2
(45) Date of Patent: May 11, 2021

(54) DISPLAY APPARATUS

(71) Applicant: JAPAN DISPLAY INC., Minato-ku (JP)

(72) Inventors: Kazuyoshi Omata, Tokyo (JP); Hiroyuki Kimura, Tokyo (JP); Makoto Shibusawa, Tokyo (JP); Hiroshi Tabatake, Tokyo (JP)

(73) Assignee: JAPAN DISPLAY INC., Minato-ku (JP)

(*) Notice: Subject to any disclaimer, the term of this patent is extended or adjusted under 35 U.S.C. 154(b) by 0 days.

(21) Appl. No.: 16/784,693

(22) Filed: Feb. 7, 2020

(65) Prior Publication Data
US 2020/0175915 A1    Jun. 4, 2020

Related U.S. Application Data

(63) Continuation of application No. 16/119,655, filed on Aug. 31, 2018, now Pat. No. 10,573,239, which is a
(Continued)

(30) Foreign Application Priority Data

| Oct. 19, 2012 | (JP) | ................................. 2012-231740 |
| Jan. 25, 2013 | (JP) | ................................. 2013-012286 |
| Feb. 21, 2013 | (JP) | ................................. 2013-032359 |

(51) Int. Cl.
G09G 3/32        (2016.01)
G09G 3/20        (2006.01)
(Continued)

(52) U.S. Cl.
CPC ........... *G09G 3/325* (2013.01); *G09G 3/2003* (2013.01); *G09G 3/32* (2013.01); *G09G 3/3233* (2013.01);
(Continued)

(58) Field of Classification Search
CPC ........ G09G 3/32; G09G 3/3233; G09G 3/325; G09G 3/3258; H01L 27/124;
(Continued)

(56) References Cited

U.S. PATENT DOCUMENTS 6,229,506 B1    5/2001    Dawson et al.
6,677,613 B1    1/2004    Yamazaki et al.
(Continued)

FOREIGN PATENT DOCUMENTS

CN    1741114 A    3/2006
CN    104508548 A    4/2015
(Continued)

OTHER PUBLICATIONS

Office Action dated Mar. 27, 2015 in Korean Patent Application No. 10-2013-124052 (with English language translation).
(Continued)

*Primary Examiner* — Xuemei Zheng
(74) *Attorney, Agent, or Firm* — Oblon, McClelland, Maier & Neustadt, L.L.P.

(57) ABSTRACT

According to one embodiment, a display apparatus includes a plurality of semiconductor layers, a first insulation film, a first conductive layer, a second insulation film and a display element includes a second conductive layer. The first conductive layer and the second conductive layer are opposed to each other to form a capacitance unit.

6 Claims, 32 Drawing Sheets

Related U.S. Application Data continuation of application No. 15/365,428, filed on Nov. 30, 2016, now Pat. No. 10,096,283, which is a continuation of application No. 15/167,401, filed on May 27, 2016, now Pat. No. 9,542,888, which is a continuation of application No. 14/056,282, filed on Oct. 17, 2013, now Pat. No. 9,368,058.

(51) Int. Cl.

| | | |
|---|---|---|
| H01L 27/32 | (2006.01) | |
| G09G 3/325 | (2016.01) | |
| H05B 33/08 | (2020.01) | |
| G09G 3/3233 | (2016.01) | |
| H05B 45/20 | (2020.01) | |
| H05B 45/00 | (2020.01) | |
| G09G 3/3258 | (2016.01) | |
| H01L 27/12 | (2006.01) | |

(52) U.S. Cl.
CPC ....... *G09G 3/3258* (2013.01); *H01L 27/3213* (2013.01); *H01L 27/3248* (2013.01); *H01L 27/3262* (2013.01); *H01L 27/3265* (2013.01); *H01L 27/3276* (2013.01); *H05B 33/08* (2013.01); *H05B 45/20* (2020.01); *H05B 45/60* (2020.01); *G09G 2300/0426* (2013.01); *G09G 2300/0452* (2013.01); *G09G 2300/0819* (2013.01); *G09G 2300/0852* (2013.01); *G09G 2300/0861* (2013.01); *G09G 2310/0262* (2013.01); *G09G 2320/0233* (2013.01); *G09G 2320/0252* (2013.01); *G09G 2320/043* (2013.01); *H01L 27/124* (2013.01); *H01L 27/1255* (2013.01)

(58) Field of Classification Search
CPC ............. H01L 27/1255; H01L 27/3262; H01L 27/3265; H01L 27/3276; H01L 27/3248
See application file for complete search history.

(56) References Cited

U.S. PATENT DOCUMENTS

| | | |
|---|---|---|
| 6,956,324 B2 | 10/2005 | Yamazaki |
| 7,427,833 B2 | 9/2008 | Fish |
| 7,534,261 B2 | 5/2009 | Friedman |
| 2002/0057055 A1 | 5/2002 | Yamazaki |
| 2002/0104995 A1 | 8/2002 | Yamazaki et al. |
| 2005/0012097 A1 | 1/2005 | Yamazaki |
| 2006/0066530 A1 | 3/2006 | Azami |
| 2006/0132051 A1 | 6/2006 | Fish |
| 2008/0203311 A1 | 8/2008 | Watanabe |
| 2009/0322216 A1 | 12/2009 | Yanagihara |
| 2010/0026170 A1* | 2/2010 | Kim ................... H01L 51/5281 313/504 |
| 2010/0193691 A1 | 8/2010 | Ishii |
| 2010/0238096 A1 | 9/2010 | Jeon |
| 2010/0309401 A1 | 12/2010 | Morita |
| 2011/0108837 A1 | 5/2011 | Yamazaki |
| 2011/0109351 A1 | 5/2011 | Yamazaki |
| 2011/0297945 A1 | 12/2011 | Jung et al. |
| 2012/0176045 A1 | 7/2012 | Omoto |
| 2012/0261684 A1 | 10/2012 | Koshihara |
| 2014/0054562 A1* | 2/2014 | Lee ................... H01L 27/3276 257/40 |
| 2014/0117340 A1 | 5/2014 | Kim |

FOREIGN PATENT DOCUMENTS

| | | |
|---|---|---|
| JP | 10-161140 A | 6/1998 |
| JP | 11-312808 A | 11/1999 |
| JP | 2000-312007 A | 11/2000 |
| JP | 2001-13522 A | 1/2001 |
| JP | 2001-249361 A | 9/2001 |
| JP | 2002-117971 A | 4/2002 |
| JP | 2002-122857 A | 4/2002 |
| JP | 2003-255399 A | 9/2003 |
| JP | 2005-77822 A | 3/2005 |
| JP | 2005-227562 A | 8/2005 |
| JP | 2007-148215 A | 6/2007 |
| JP | 2007-164162 A | 6/2007 |
| JP | 2007-265972 A | 10/2007 |
| JP | 2007-310311 | 11/2007 |
| JP | 2008-33091 A | 2/2008 |
| JP | 2008-171907 A | 7/2008 |
| JP | 2009-25832 A | 2/2009 |
| JP | 2009-69325 A | 4/2009 |
| JP | 2009-103794 A | 5/2009 |
| JP | 2009-266395 A | 11/2009 |
| JP | 2010-79075 A | 4/2010 |
| JP | 2010-152221 A | 7/2010 |
| JP | 2010-191163 A | 9/2010 |
| JP | 2011-145622 | 7/2011 |
| JP | 2011-181938 A | 9/2011 |
| JP | 2012-94485 A | 5/2012 |
| JP | 2012-189828 A | 10/2012 |
| KR | 10-2006-0107151 A | 10/2006 |
| TW | 200506450 A | 2/2005 |
| TW | 200509021 A | 3/2005 |
| WO | WO 2010/137298 A1 | 12/2010 |

OTHER PUBLICATIONS

Combined Taiwanese Office Action and Search Report dated Nov. 2, 2015 in Patent Application No. 102134352 (with English language translation).

Combined Chinese Office Action and Search Report dated Oct. 28, 2015 in Patent Application No. 201310487901.3 (with English language translation).

Office Action dated Sep. 6, 2016, in Japanese Patent Application No. 2012-231740 (with English-language translation).

Office Action dated Oct. 25, 2016, in Japanese Patent Application No. 2013-032359 (with English-language translation).

Office Action dated Nov. 15, 2016, in Japanese Patent Application No. 2013-012286 (with English-language translation).

\* cited by examiner

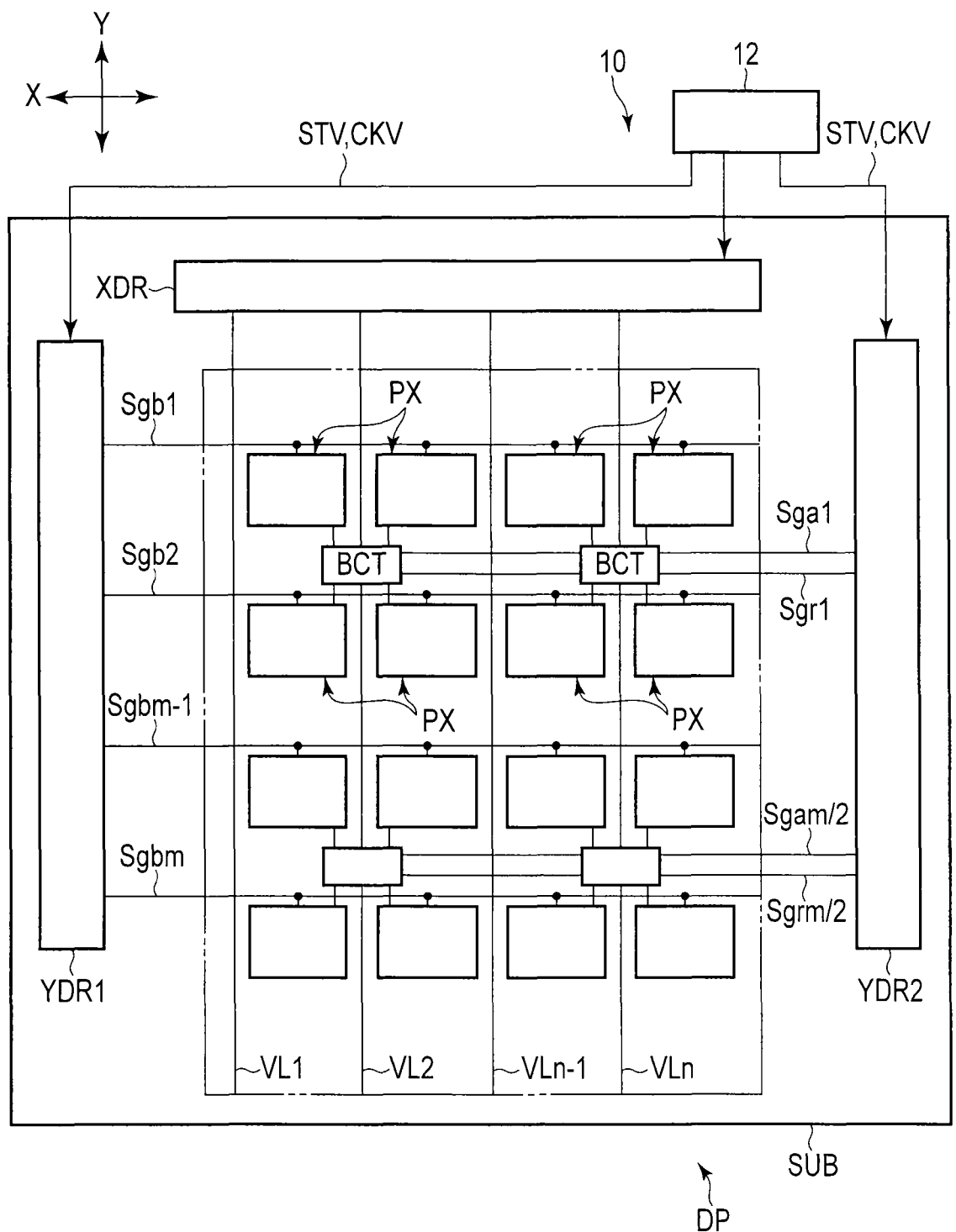
F I G. 1

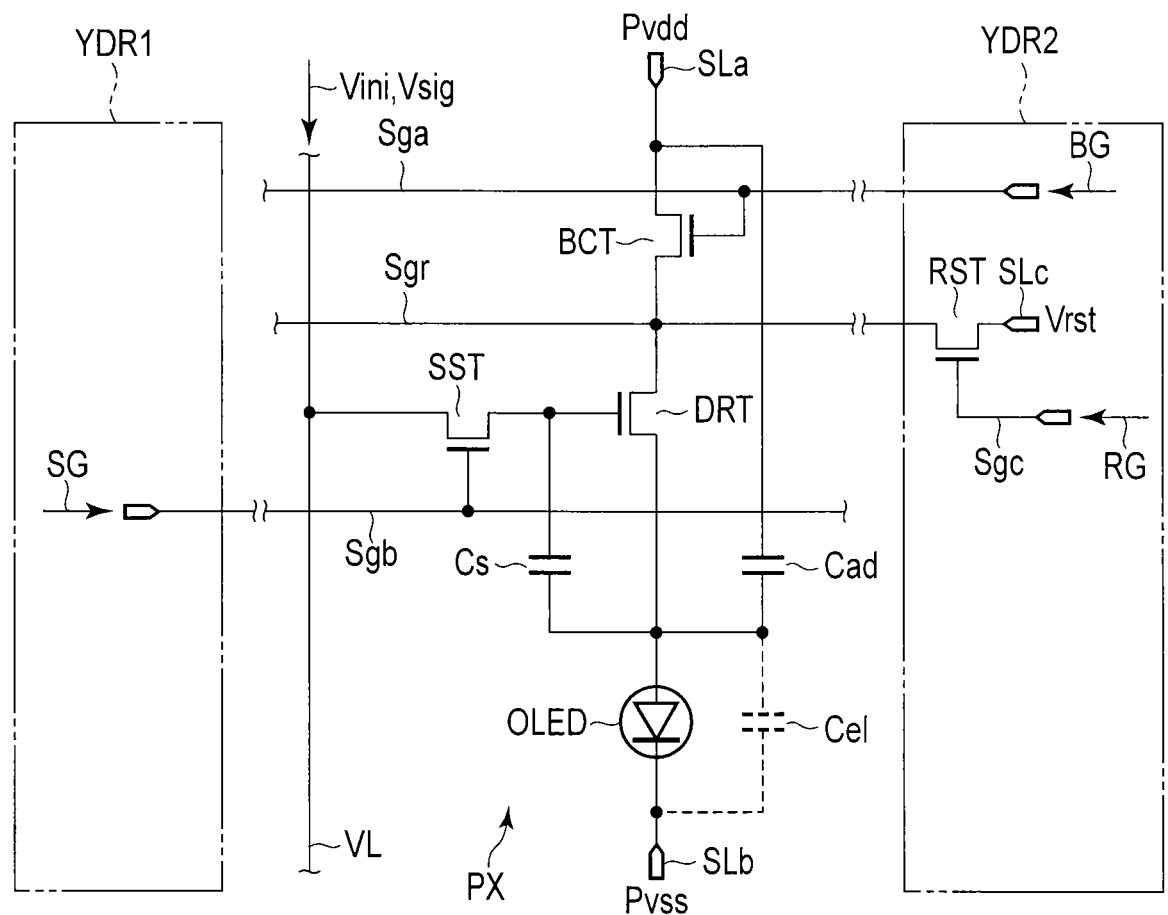
F I G. 2

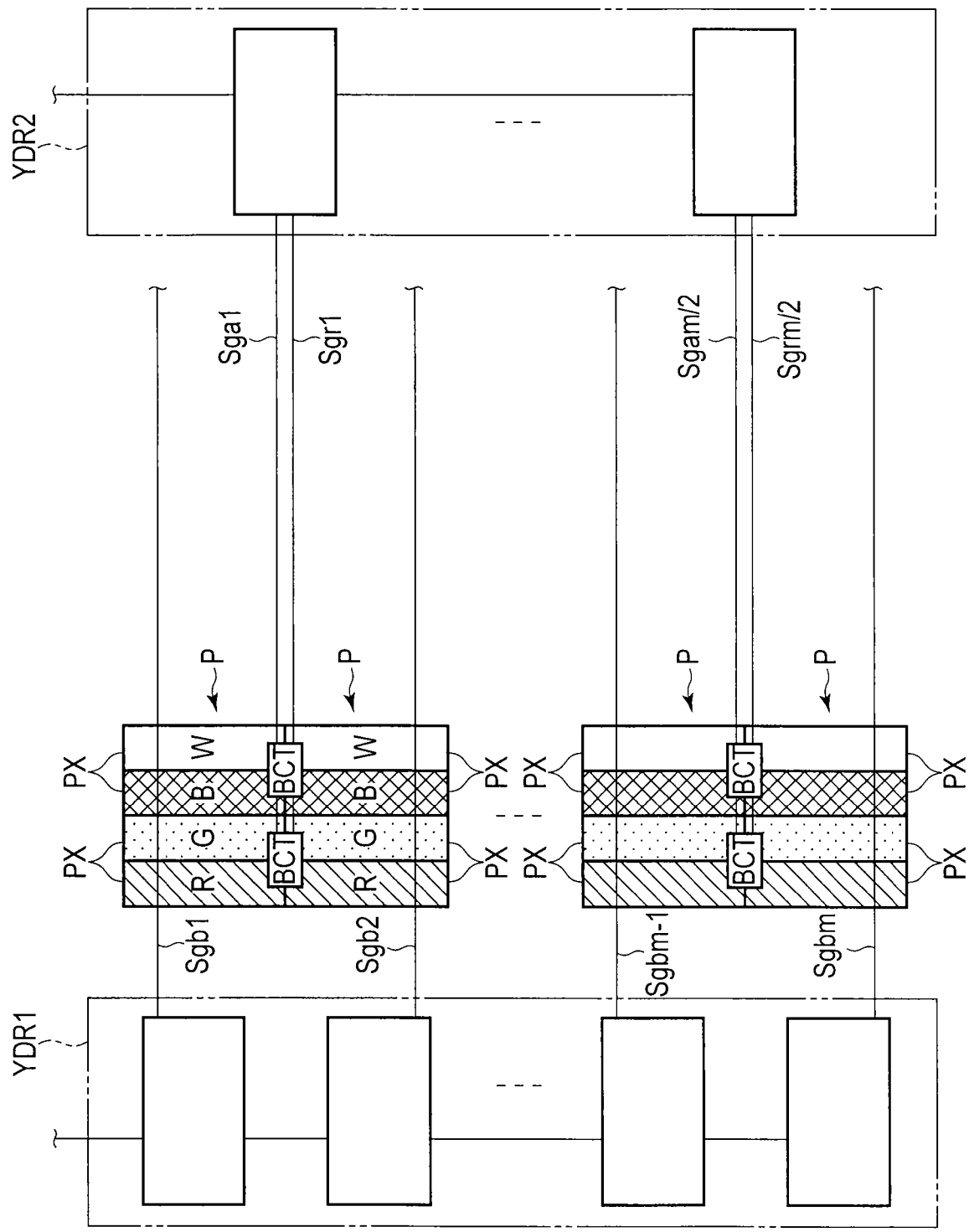
F I G. 7

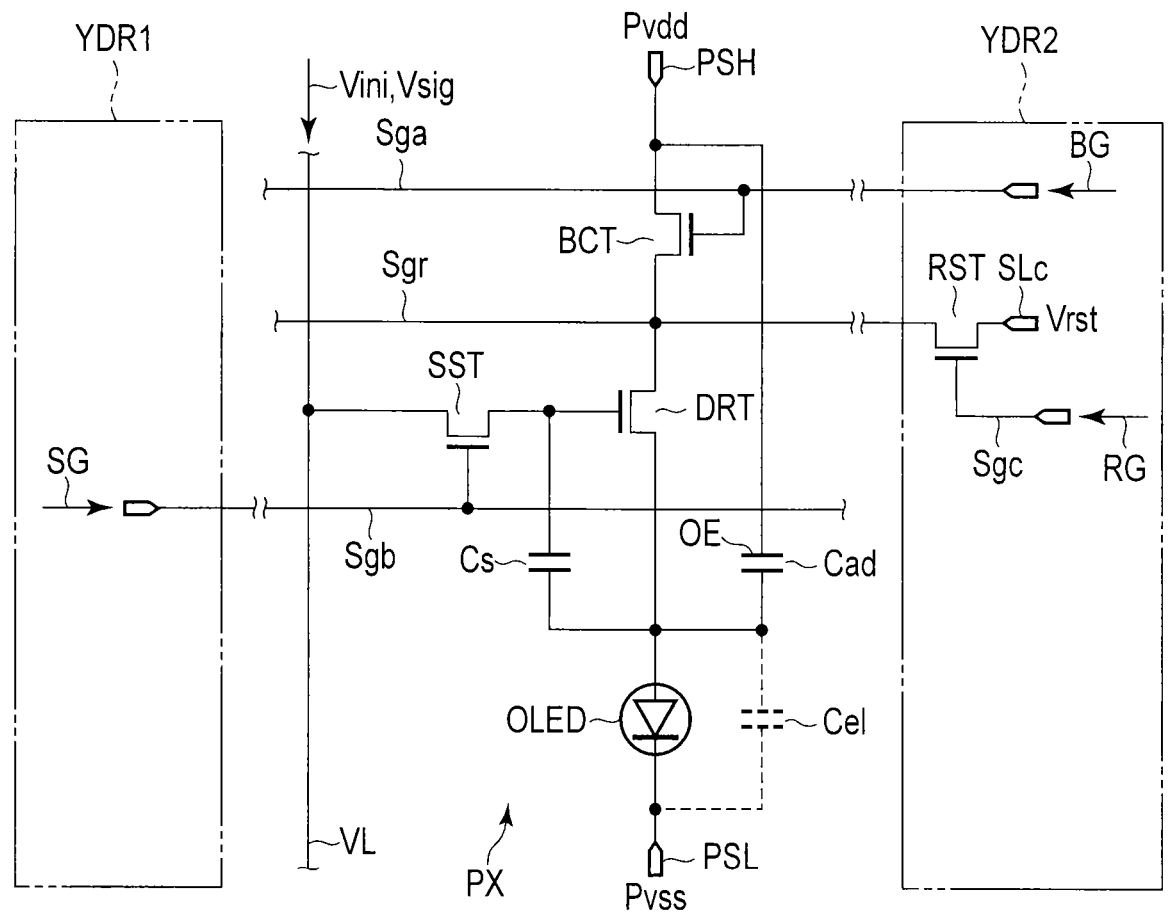
F I G. 16

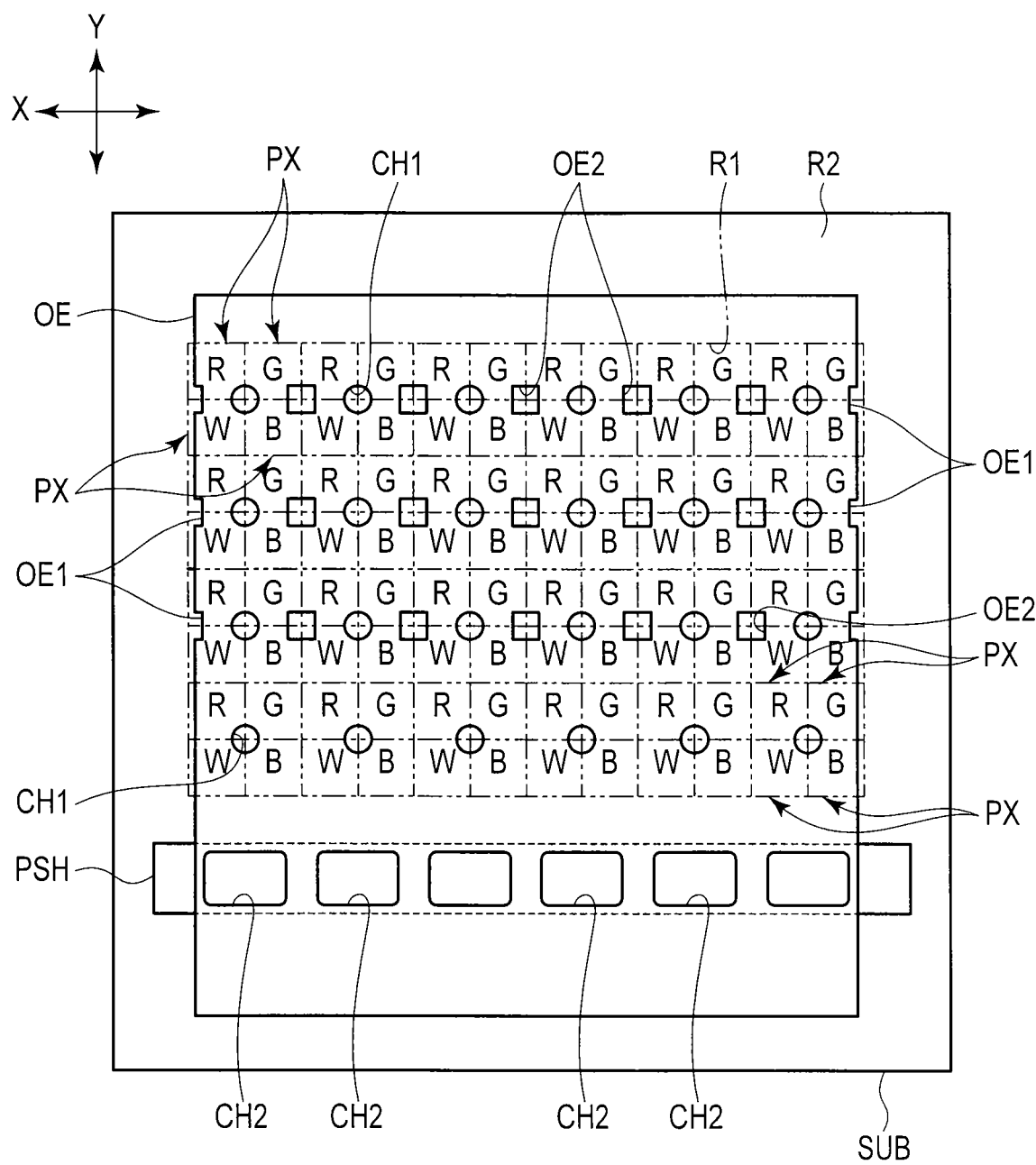
F I G. 19

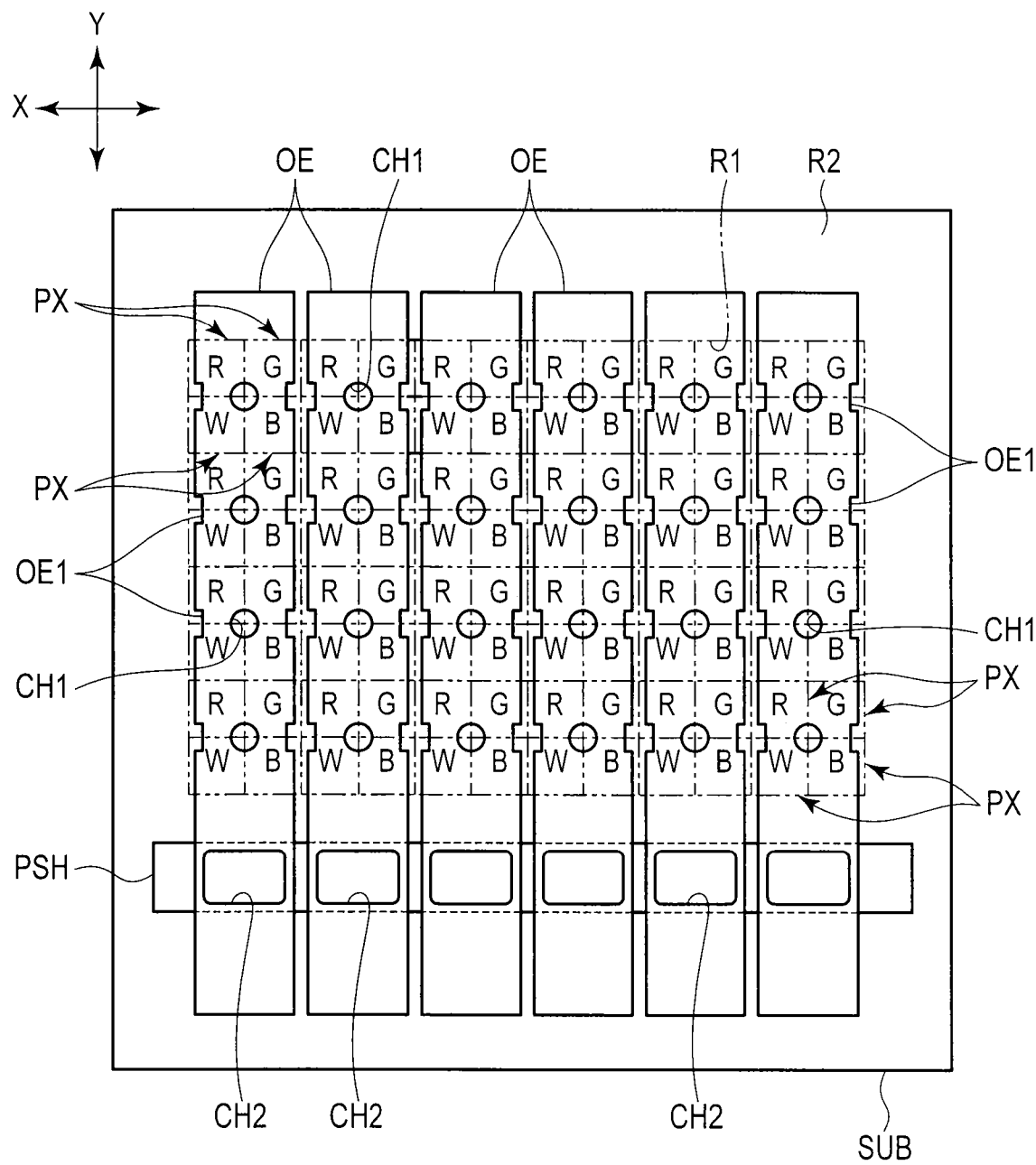
F I G. 20

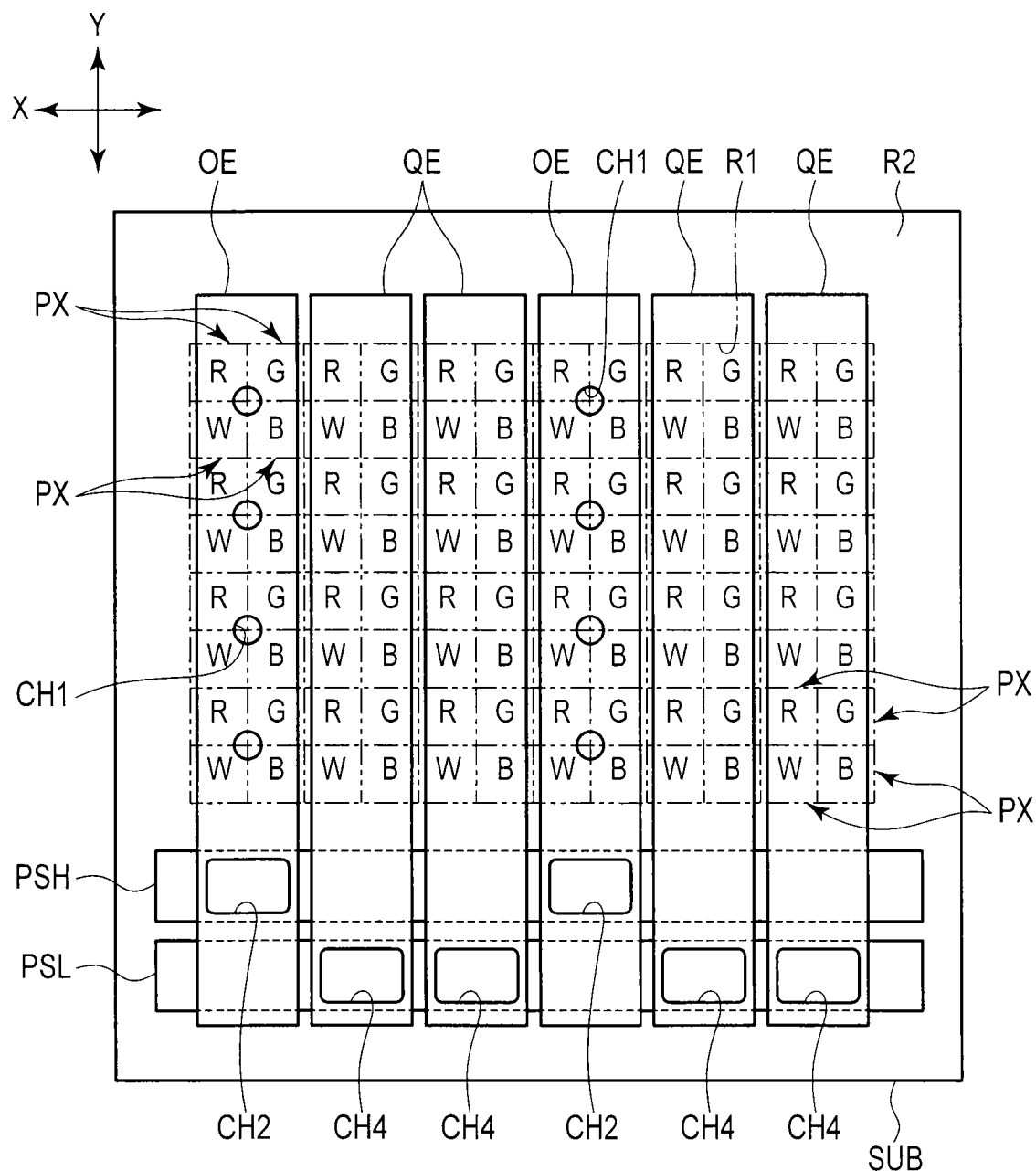
F I G. 27

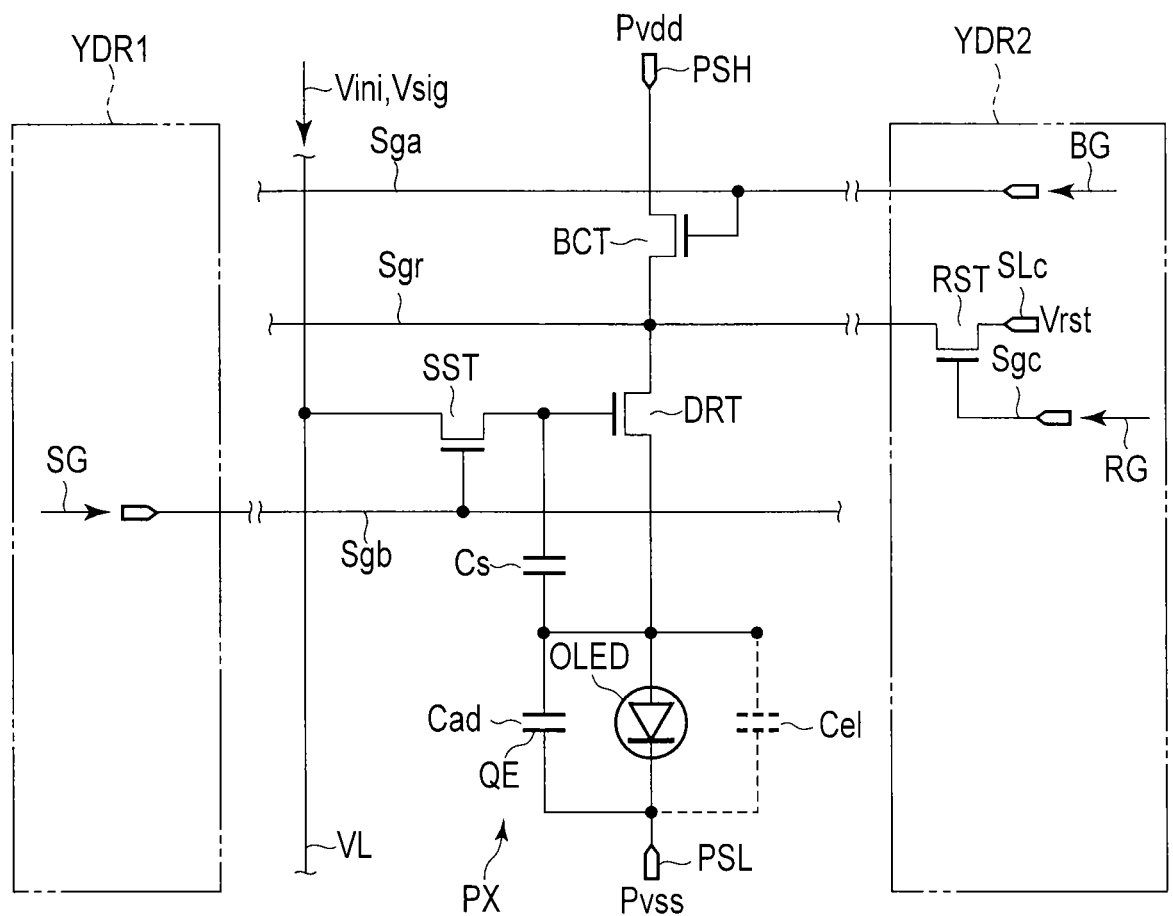
F I G. 28

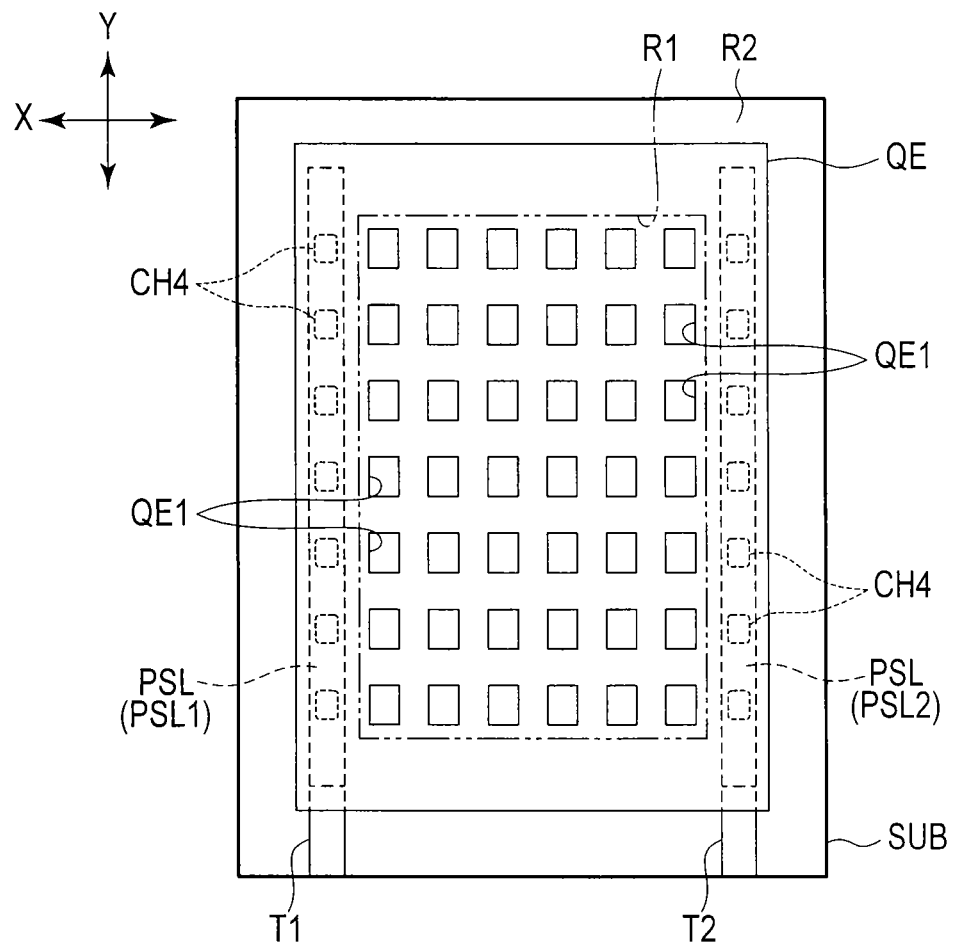
F I G. 32

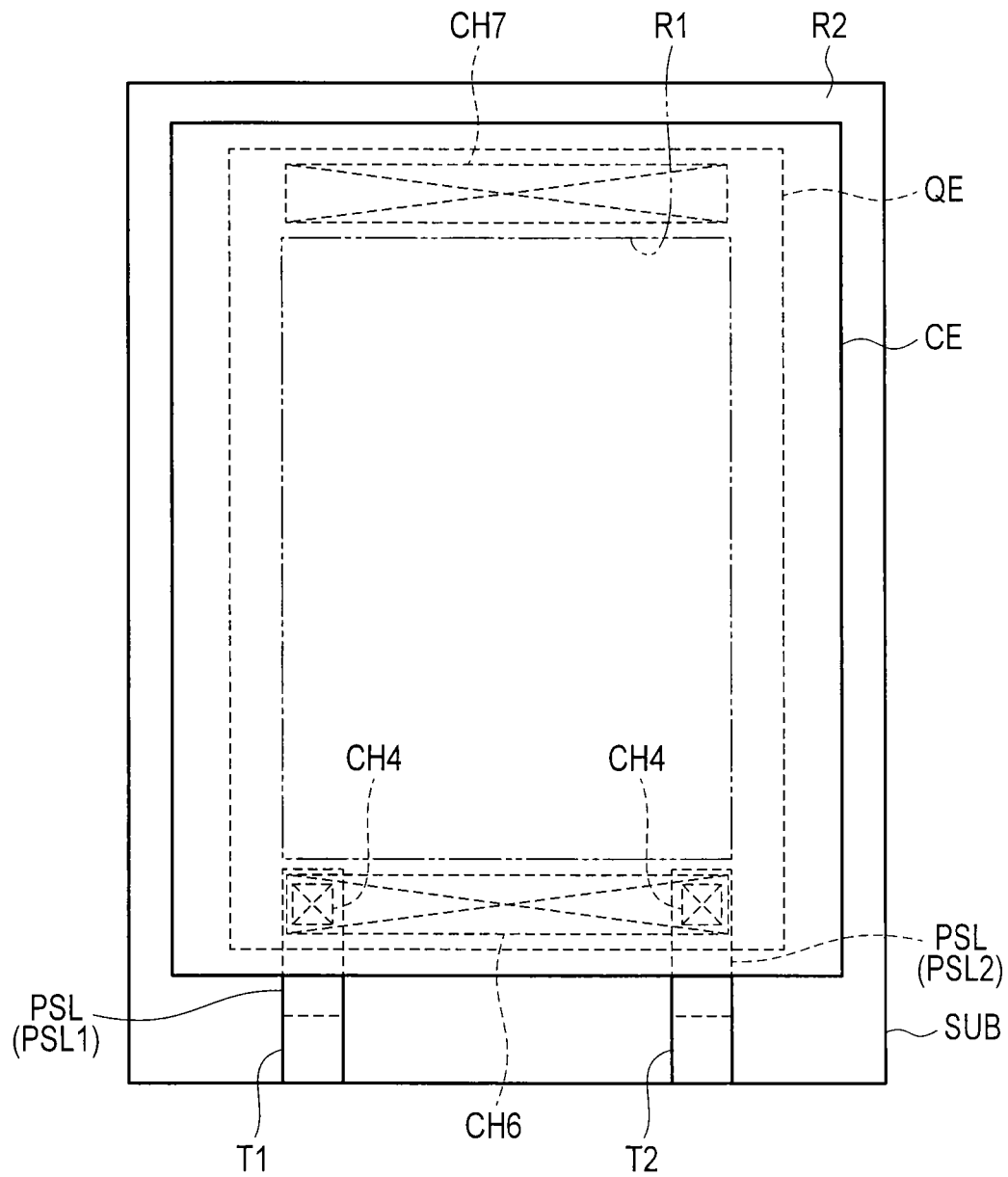
F I G. 34

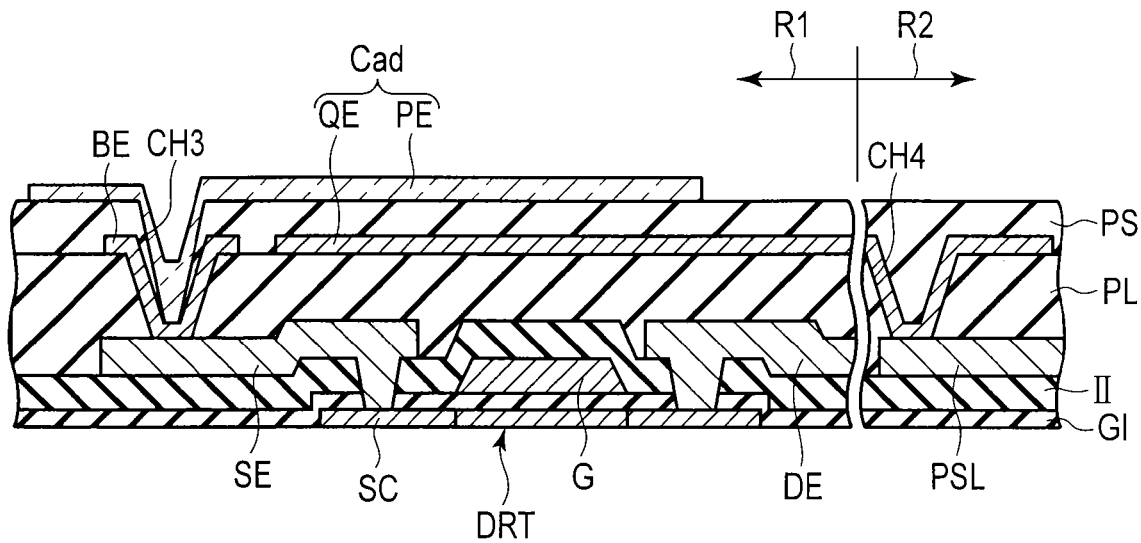
F I G. 35
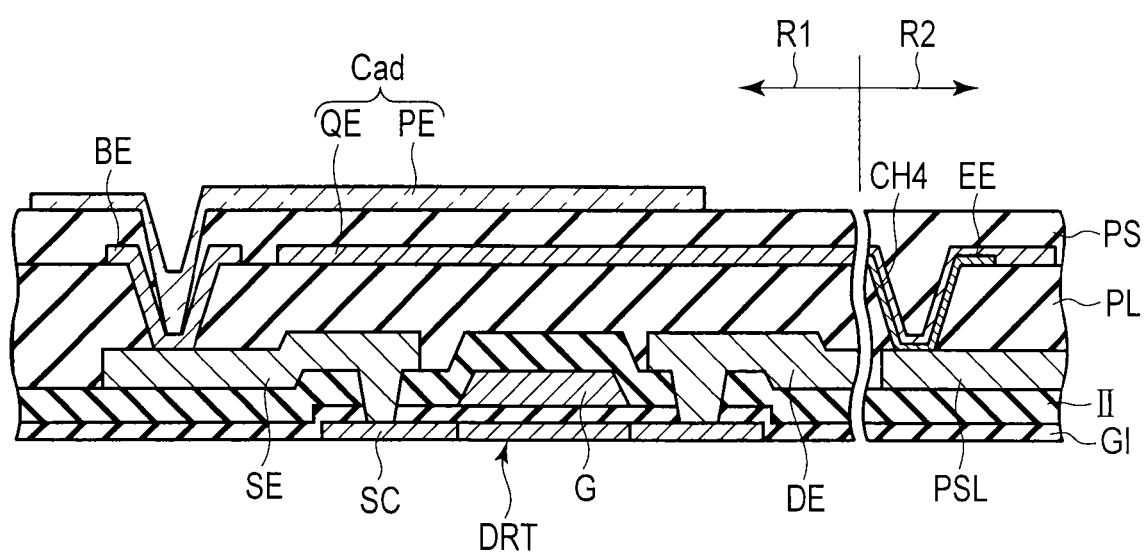
F I G. 36

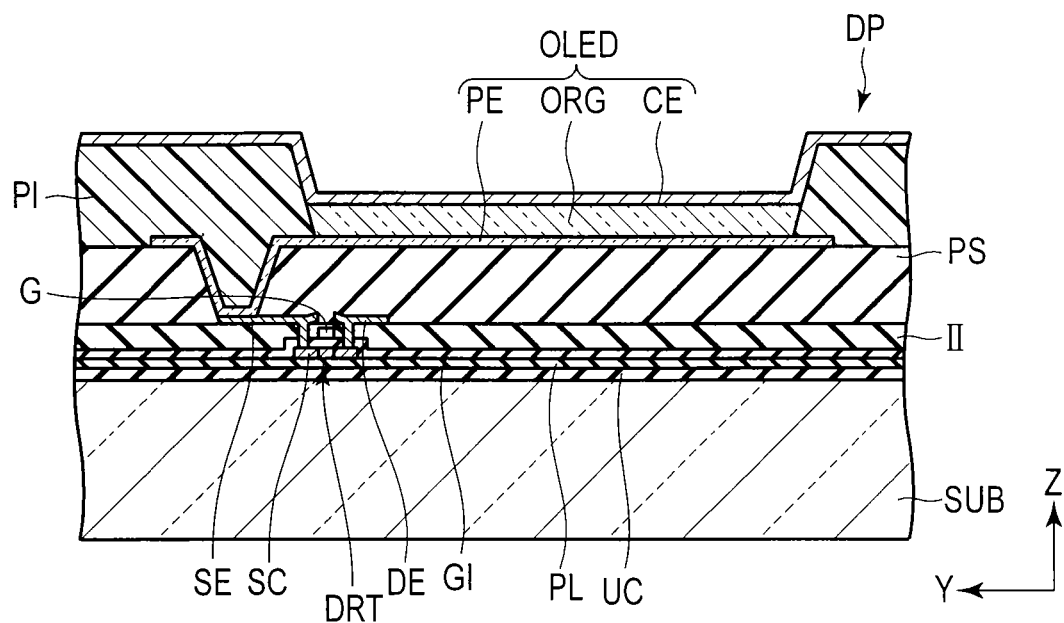
F I G. 37

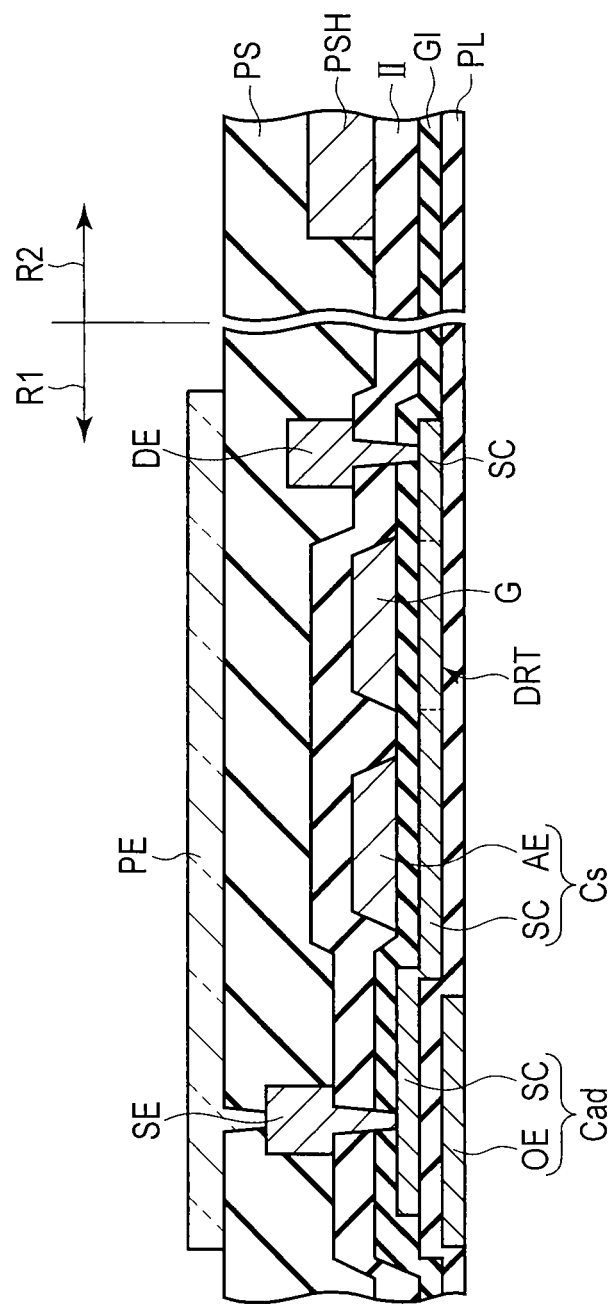
F I G. 38

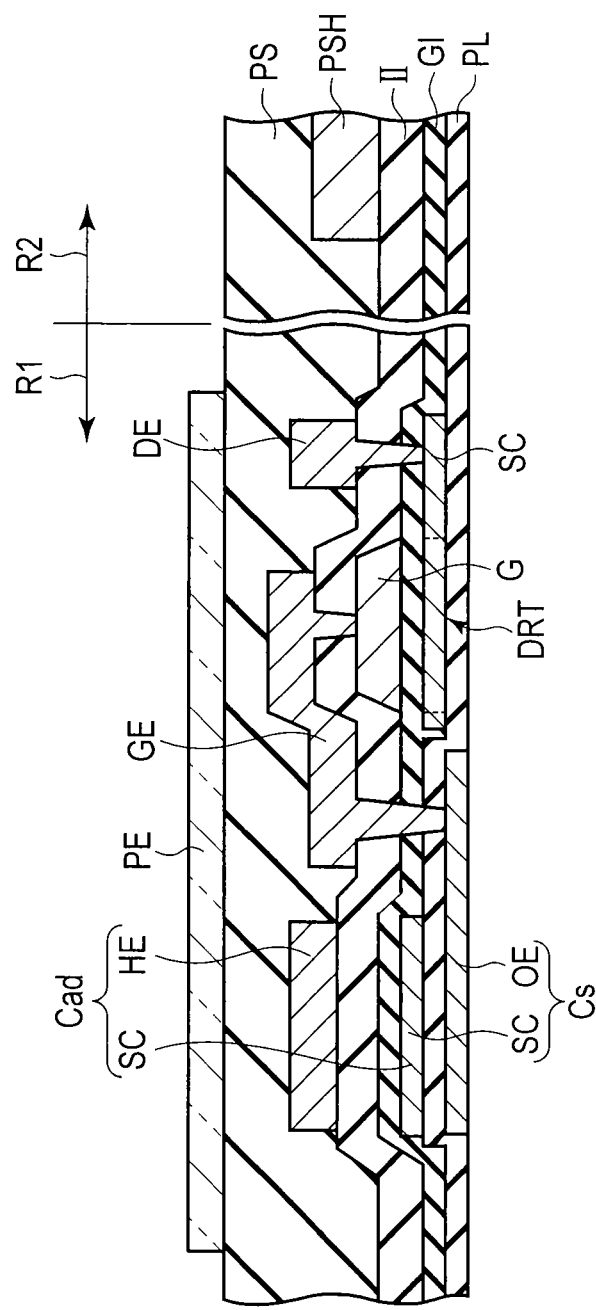
F I G. 39

DISPLAY APPARATUS

CROSS-REFERENCE TO RELATED APPLICATIONS

This application is a continuation of U.S. application Ser. No. 16/119,655 filed Aug. 31, 2018, which is a continuation of U.S. application Ser. No. 15/365,428 filed Nov. 30, 2016, which is a continuation of U.S. application Ser. No. 15/167,401 filed May 27, 2016, which is a continuation of U.S. application Ser. No. 14/056,282 filed Oct. 17, 2013, and is based upon and claims the benefit of priority from Japanese Patent Applications No. 2012-231740, filed Oct. 19, 2012; No. 2013-012286, filed Jan. 25, 2013; and No. 2013-032359, filed Feb. 21, 2013, the entire contents of all of which are incorporated herein by reference.

FIELD

Embodiments described herein relate generally to a display apparatus.

BACKGROUND

Recently, demands for flat display devices represented by a liquid crystal display, which takes advantage of the slim, lightweight, and low power consumption features, are rapidly growing. Above all, an active matrix type display device, which includes, in each pixel, a pixel switch having a function of electrically isolating an on pixel and an off pixel and maintaining a video signal to the on pixel, is utilized for various displays, such as a portable information device.

As such flat active matrix type display device, an organic EL display device which uses a self-luminous element is receiving attention, and research and development of this type of device have been conducted vigorously. The organic EL display device has the features that it requires no backlight, is suitable for moving image reproduction by virtue of high-speed response, and is suitable for use even in a cold district since luminance does not decrease at low temperatures.

Generally, the organic EL display device comprises a plurality of pixels arranged side by side over a plurality of lines and rows. Each of the pixels comprises an organic EL element, which is a self-luminous element, and a pixel circuit which supplies a driving current to the organic EL element. Each of the pixels performs a display operation by controlling emission brightness of the organic EL element.

As a method of driving a pixel circuit, performing the driving by a voltage signal is known. Further, proposals are made for a display device which achieves the high-definition property. That is, by structuring a display device such that "Low" and "High" are switched by switching of a voltage power source, and both a video signal and an initialization signal are output from video signal wiring, the number of constituent element pixels and the number of wiring lines are reduced, and a layout area of the pixel is also reduced. Based on this structure, a proposal for a high-definition display device is made.

BRIEF DESCRIPTION OF THE DRAWINGS

FIG. 1 is a plan view schematically showing a display apparatus according to a first embodiment;
FIG. 2 is an equivalent circuit diagram of a pixel in the display apparatus in FIG. 1;
FIG. 7 is a schematic diagram showing an example of a pixel arrangement according to the first embodiment;
FIG. 16 is an equivalent circuit diagram of a pixel in a display apparatus according to a third embodiment;
FIG. 19 is a plan view of a display apparatus of Example 1 according to the third embodiment, showing a schematic overall structure of a first example of the conductive layer;
FIG. 20 is a plan view of a display apparatus of the Example 1 according to the third embodiment, showing a schematic overall structure of a second example of the conductive layer.

FIG. 27 is a plan view of a display apparatus of Example 2 according to the fourth embodiment, showing a schematic overall structure of conductive layers;

FIG. 28 is an equivalent circuit diagram of a pixel in a display apparatus according to a fifth embodiment;

FIG. 32 is a plan view of the display apparatus of Example 3 according to the fifth embodiment, showing a schematic overall structure of the conductive layer and the power supply line;

FIG. 34 is a plan view of a display apparatus according to a sixth embodiment, showing a schematic overall structure of a conductive layer, a counter electrode, and the power supply line;

FIG. 35 is a partially sectional view of a modified example of the display apparatus according to the fifth embodiment, showing the drive transistor, the power supply line, a connected electrode, the conductive layer and the pixel electrode;

FIG. 36 is a partially sectional view of another modified example of the display apparatus according to the fifth embodiment, showing the drive transistor, the power supply line, the conductive layer and the pixel electrode;

FIG. 37 is a partially sectional view schematically showing an example of a structure applicable to a display apparatus according to the seventh embodiment;

FIG. 38 is a partially sectional view of the display apparatus according to the seventh embodiment, showing a drive transistor, a power supply line, a conductive layer and a pixel electrode; and FIG. 39 is a partially sectional view of a modified example of the display apparatus according to the seventh embodiment, showing the drive transistor, the power supply line, a connected electrode, the conductive layer and the pixel electrode.

DETAILED DESCRIPTION

In general, according to one embodiment, there is provided a display apparatus comprising: a plurality of semiconductor layers; a first insulation film provided above the plurality of semiconductor layers; a first conductive layer provided on the first insulation film and formed of metal; a second insulation film provided on the first insulation film and the first conductive layer; and a display element comprising a second conductive layer provided on the second insulation film. The first conductive layer and the second conductive layer are opposed to each other to form a capacitance unit.

According to another embodiment, there is provided a display apparatus comprising: a first insulation film provided above a plurality of semiconductor layers, a first conductive layer and a second conductive layer, which are formed in different layers; a third conductive layer provided on the first insulation film and connected to one of a high-potential power supply and a low-potential power supply; a second insulation film provided on the first insulation film and the third conductive layer; and a display element comprising a fourth conductive layer provided on the second insulation film. The third conductive layer and the fourth conductive layer are opposed to each other to form a capacitance unit.

A display apparatus according to a first embodiment and a method of driving the display apparatus will be hereinafter described in detail with reference to the drawings. In the present embodiment, the display apparatus is an active matrix type display apparatus and, more specifically, an active matrix type organic EL (electroluminescent) display apparatus.

Figure 3:
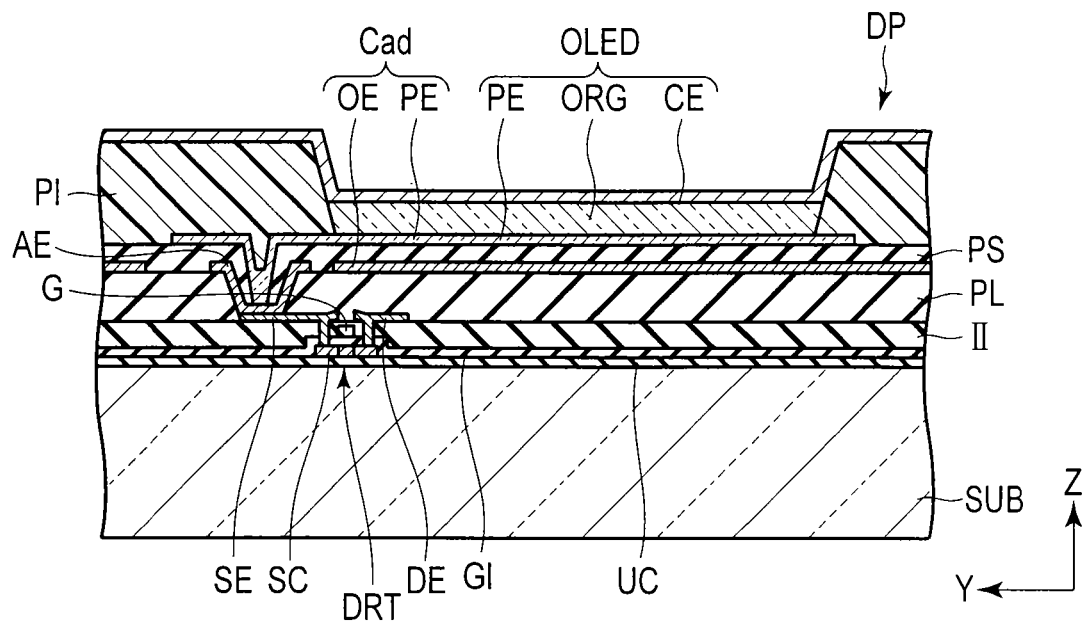
FIG. 3 is a partially sectional view schematically showing an example of a structure applicable to the display apparatus in FIG. 1.

FIG. 1 is a plan view schematically showing the display apparatus according to the present embodiment. FIG. 2 is an equivalent circuit diagram of a pixel in the display apparatus in FIG. 1. FIG. 3 is a partially sectional view schematically showing an example of a structure applicable to the display apparatus in FIG. 1. In FIG. 3, the display apparatus is illustrated such that a display surface, i.e., a front surface or a light emitting surface faces upwardly and a back surface faces downwardly. The display apparatus is a top-surface-emitting type organic EL display apparatus adopting the active matrix type drive.

As shown in FIG. 1, the display apparatus according to the present embodiment is configured as, for example, an active matrix type display apparatus of at least two inches, and comprises a display panel DP and a controller 12 which controls an operation of the display panel DP. In the present embodiment, the display panel DP is an organic EL panel.

The display panel DP comprises an insulation substrate SUB having light transmittance such as a glass plate, m×n pixels PX arrayed in matrix on a rectangular display area R1 of the insulation substrate SUB, a plurality (m/2) of first scanning lines Sga(1–m/2), a plurality (m) of second scanning lines Sgb(1–m), a plurality (m/2) of third scanning lines Sgc(1–m/2), a plurality (m/2) of reset lines Sgr(1–m/2), and a plurality (n) of video signal lines VL(1–n).

There are m pixels PX in a column direction Y and n pixels PX in a row direction X. The first scanning lines Sga, the second scanning lines Sgb, and the reset lines Sgr are provided to extend in the row direction X. The reset lines Sgr are formed by a plurality of electrodes electrically connected to each other. The video signal lines VL are provided to extend along in the column direction Y.

As shown in FIG. 1 and FIG. 2, the display panel DP comprises a high-potential power supply line SLa fixed at a high potential Pvdd, and a low-potential power supply electrode SLb fixed at a low potential Pvss. The high-potential power supply line SLa is connected to a high-potential power supply, and the low-potential power supply electrode SLb is connected to a low-potential power supply (i.e., referential potential power supply).

The display panel DP comprises scanning line driving circuits YDR1 and YDR2 configured to drive the first scanning lines Sga, the second scanning lines Sgb, and the third scanning lines Sgc in order for every row of the pixels PX, and a signal line driving circuit XDR configured to drive the video signal lines VL. The scanning line driving circuits YDR1 and YDR2, and the signal line driving circuit XDR are formed integrally on a non-display area R2 outside the display area R1 on the insulation substrate SUB, and constitute a driver 10 together with a controller 12.

Each of the pixels PX includes a display element and a pixel circuit which supplies a drive current to the display element. The display element is, for example, a self-emitting element. In the present embodiment, an organic EL diode OLED (hereinafter simply called diode OLED) comprising at least an organic light-emitting layer as a photoactive layer is used as the display element.

As shown in FIG. 2, the pixel circuit of each pixel PX is a pixel circuit of a voltage signal type for controlling emission of the diode OLED in response to video signals which are voltage signals, and comprises a pixel switch SST, a drive transistor DRT, a holding capacitance Cs, and an auxiliary capacitance Cad. The holding capacitance Cs and the auxiliary capacitance Cad are capacitors. The auxiliary capacitance Cad is an element provided to adjust an emitting current volume. The capacitance unit Cel is a capacitance of a diode OLED itself (i.e. parasitic capacitance of the diode OLED). The diode OLED also functions as a capacitor.

Each pixel PX comprises an output switch BCT. A plurality of pixels PX adjacent to each other in the columnar direction Y share the output switch BCT. In the present embodiment, four pixels PX which are adjacent to each other in the row direction X and the columnar direction Y share one output switch BCT. Furthermore, a plurality of reset switches RST are provided on the scanning line driving circuit YDR2 (or scanning line driving circuit YDR1). The reset switches RST are connected to the reset lines Sgr in a one-to-one relationship.

The pixel switch SST, the drive transistor DRT, the output switch BCT, and the reset switches RST are constituted by thin film transistors (TFTs) of the same conductive type, for example, N-channel type.

In the display apparatus according to the present embodiment, all of the TFTs which structure each of the drive transistors and each of the switches are thin film transistors of a top-gate structure which are formed in the same process to have the same layer structure and which have semiconductor layers formed of polysilicon.

Each of the pixel switch SST, the drive transistor DRT, the output switch BCT, and the reset switches RST comprises a first terminal, a second terminal, and a control terminal. In the present embodiment, the first terminal serves as a source electrode, the second terminal serves as a drain electrode, and the control terminal serves as a gate electrode.

In a pixel circuit of the pixel PX, the drive transistor DRT and the output switch BCT are connected in series with the diode OLED between the high-potential power supply line SLa and the low-potential power supply electrode SLb. The high-potential power supply line SLa (high potential Pvdd) is set to the potential of, for example, 10V and the low-potential power supply electrode SLb (low potential Pvss) is set to the potential of, for example, 1.5V.

In the output switch BCT, the drain electrode is connected to the high-potential power supply line SLa, the source electrode is connected to the drain electrode of the drive transistor DRT, and the gate electrode is connected to the first scanning lines Sga.

The output switch BCT is therefore controlled to be turned on (conductive state) and off (nonconductive state) by control signals BG(1–m/2) from the first scanning lines Sga. The output switch BCT controls a light emission time of the diode OLED in response to the control signals BG.

In the drive transistor DRT, the drain electrode is connected to the source electrode of the output switch BCT and the reset line Sgr, and the source electrode is connected to one of the electrodes of the diode OLED (i.e. anode). The other electrode of the diode OLED (i.e. cathode) is connected to the low-potential power supply electrode SLb. The drive transistor DRT outputs a driving current having an amount of current corresponding to a video signal Vsig to the diode OLED.

In a pixel switch SST, the source electrode is connected to the video signal lines VL(1–n), the drain electrode is connected to the gate electrode of the drive transistor DRT, and the gate electrode is connected to the second scanning lines Sgb(1–m), which function as gate wiring for signal writing control. The pixel switch SST is on/off controlled by control signals SG(1–m) supplied from the second scanning lines Sgb. Furthermore, in response to the control signals SG(1–m), the pixel switch SST controls connection and disconnection between the pixel circuit and the video signal lines VL(1–n), and captures the video signal Vsig or the initialization signal Vini from the corresponding video signal lines VL(1–n) into the pixel circuit.

The reset switch RST is provided on the scanning line driving circuit YDR2 every two rows. The reset switch RST is connected between the drain electrode of the drive transistor DRT and a reset power source. In the reset switch RST, the source electrode is connected to a reset power source line SLc connected to the reset power source, the drain electrode is connected to the reset line Sgr, and the gate electrode is connected to the third scanning line Sgc which functions as the gate wiring for reset control. As stated above, the reset power source line SLc is connected to the reset power source, and fixed to a reset potential Vrst, which is the constant potential.

Each of the reset switches RST switches a state between the reset power source line SLc and the reset line Sgr to the conductive state (ON) or the nonconductive state (OFF) in accordance with control signals RG(1–m/2) given through the third scanning lines Sgc. As the reset switch RST is switched to the on-state, a potential of the source electrode of the drive transistor DRT is initialized.

On the other hand, the controller 12 shown in FIG. 1 is provided on a printed circuit board (not shown) arranged outside the display panel DP, and controls the scanning line driving circuits YDR1 and YDR2, and the signal line driving circuit XDR. The controller 12 receives a digital video signal and a synchronization signal supplied from the outside, and generates a vertical scanning control signal which controls vertical scanning timing and a horizontal scanning control signal which controls horizontal scanning timing based on the synchronization signal.

Then, the controller 12 supplies the vertical scanning control signal and the horizontal scanning control signal to each of the scanning line driving circuits YDR1 and YDR2, and the signal line driving circuit XDR, and supplies the digital video signal and the initialization signal to the signal line driving circuit XDR in synchronization with the horizontal and vertical scanning timings.

The signal line driving circuit XDR converts the video signals, which are sequentially obtained in each horizontal scanning period under control of the horizontal scanning control signal, into video signals of an analog format, and supplies the video signals Vsig according to gradation to a plurality of video signal lines VL(1-n) in parallel. Further, the signal line driving circuit XDR supplies the initialization signal Vini to the video signal lines VL.

The scanning line driving circuits YDR1 and YDR2 include a shift register, an output buffer, and the like (not shown). They transfer externally supplied horizontal scanning start pulses sequentially to the next state, and supply three types of control signals, namely, control signals BG(1-m/2), SG(1-m), and RG(1-m/2), to the pixels PX of each row via the output buffer (FIG. 2). Further, while the control signals RG are not directly supplied to the pixels PX, at predetermined timing according to the control signals RG, a predetermined voltage is supplied from the reset power source line SLc fixed to the reset potential Vrst.

The first scanning lines Sga, the second scanning lines Sgb, and the third scanning lines Sgc are thereby driven by the control signals BG, SG, and RG, respectively.

Next, the structures of the drive transistor DRT and the diode OLED will be described in detail with reference to FIG. 3.

The N-channel type TFT which forms the drive transistor DRT comprises a semiconductor layer SC. The semiconductor layer SC is provided on an undercoat layer UC provided on the insulation substrate SUB. The semiconductor layer SC is, for example, a polysilicon layer including a p-type region and an n-type region.

The semiconductor layer SC is covered by the gate insulation film GI. On the gate insulation film GI, a gate electrode G of the drive transistor DRT is provided. The gate electrode G is opposed to the semiconductor layer SC. On the gate insulation film GI and the gate electrode G, the interlayer insulation film II is provided.

On the interlayer insulation film II, a source electrode SE and a drain electrode DE are further provided. The source electrode SE and the drain electrode DE are connected to a source region and a drain region of the semiconductor layer SC, respectively, through a contact hole formed in the interlayer insulation film II and the gate insulation film GI.

A planarizing film PL having an insulating property is provided on the interlayer insulation film II, the source electrode SE and the drain electrode DE. The gate insulation film GI, the interlayer insulation film II, and the planarizing film PL function as first insulation films.

A connected electrode AE and a conductive layer OE serving as a conductive layer are provided on the planarizing film PL. In the present embodiment, the conductive layer OE and the connected electrode AE are formed of a metal (for example, Al: aluminum). The connected electrode AE is connected to the source electrode SE of the drive transistor DRT through a contact hole formed in the planarizing film PL. A passivation film PS is provided on the planarizing film PL, the conductive layer OE, and the connected electrode AE. The passivation film PS functions as a second insulation film.

The diode OLED includes a pixel electrode PE, an organic layer ORG, and a counter electrode CE. In the present embodiment, the pixel electrode PE is an anode while the counter electrode CE is a cathode.

The pixel electrode PE is provided on the passivation film PS. The pixel electrode PE is connected to the connected electrode AE through a contact hole formed in the passivation film PS. The pixel electrode PE functions as a second conductive layer. The pixel electrode PE is a back electrode having a light reflecting property. The pixel electrode PE is formed by stacking a transparent electrode layer (for example, ITO: indium tin oxide) and an electrode layer (for example, Al) having the light reflecting property.

When the pixel electrode PE is formed, a transparent conductive material (for example, ITO) is stacked on the passivation film PS, and a conductive material (for example, Al) having a light reflecting property is stacked on the transparent conductive material and is subjected to patterning using photolithography. The pixel electrode PE is thereby formed.

A partition insulation film PI is further provided on the passivation film PS. In the partition insulation film PI, a through hole is formed at a position corresponding to the pixel electrode PE, or a slit is formed at a position corresponding to a column or a row formed by the pixel electrode PE. As an example, the partition insulation film PI has a through hole at a position corresponding to the pixel electrode PE.

On the pixel electrode PE, the organic layer ORG including a luminous layer is provided as an active layer. The luminous layer is, for example, a thin film containing a luminescent organic compound in which a luminous color is red, green, blue or achromatic (white). The organic layer ORG can further include a hole injection layer, a hole transport layer, a hole blocking layer, an electron transport layer, an electron injection layer and the like besides the luminous layer.

The partition insulation film PI and the organic layer ORG are covered with the counter electrode CE. In this embodiment, the counter electrode CE is an electrode connected to a like electrode among the pixels PX, i.e., a common electrode. In addition, the counter electrode CE is also a cathode and a light-transmitting front electrode, in the present embodiment. The counter electrode CE is electrically connected to an electrode line (not shown) formed in the same layer as the source electrode SE and the drain electrode DE through, for example, the contact holes formed in the planarizing film PL the passivation film PS and the partition insulation film PI.

In the diode OLED of this structure, an organic molecule constituting the organic layer ORG is excited to cause exciton to be generated when a hole injected from the pixel electrode PE and an electron injected from the counter electrode CE are recombined with each other inside the organic layer ORG. Light is emitted while the exciton is radiated and inactivated. The light is released from the organic layer ORG to the outside through the transparent counter electrode CE.

Figure 4:
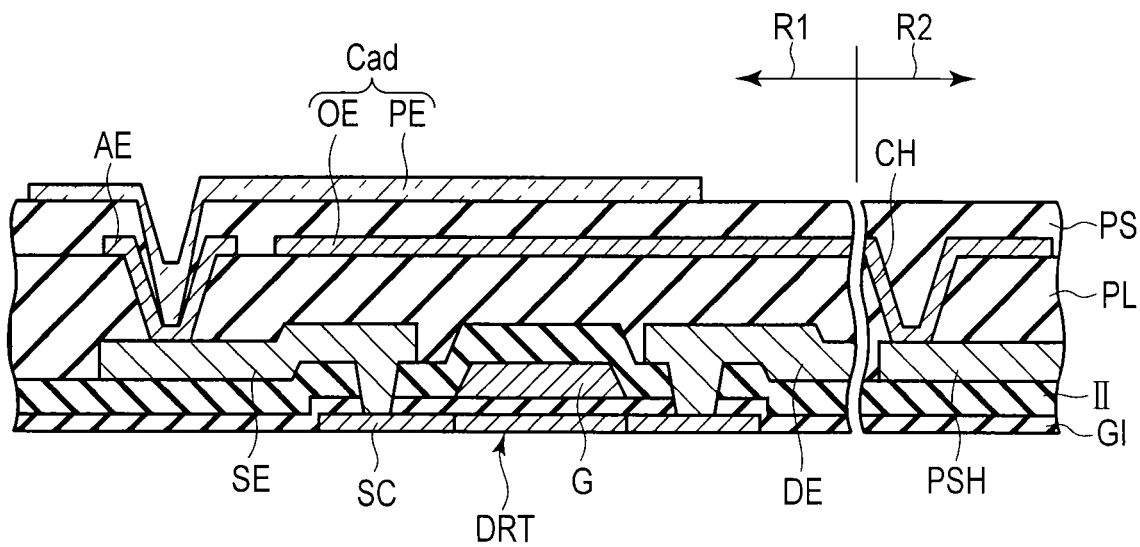
FIG. 4 is a partially sectional view of the display apparatus according to the first embodiment, showing a drive transistor, a power supply line, a connected electrode, a conductive layer and a pixel electrode.
Figure 5:
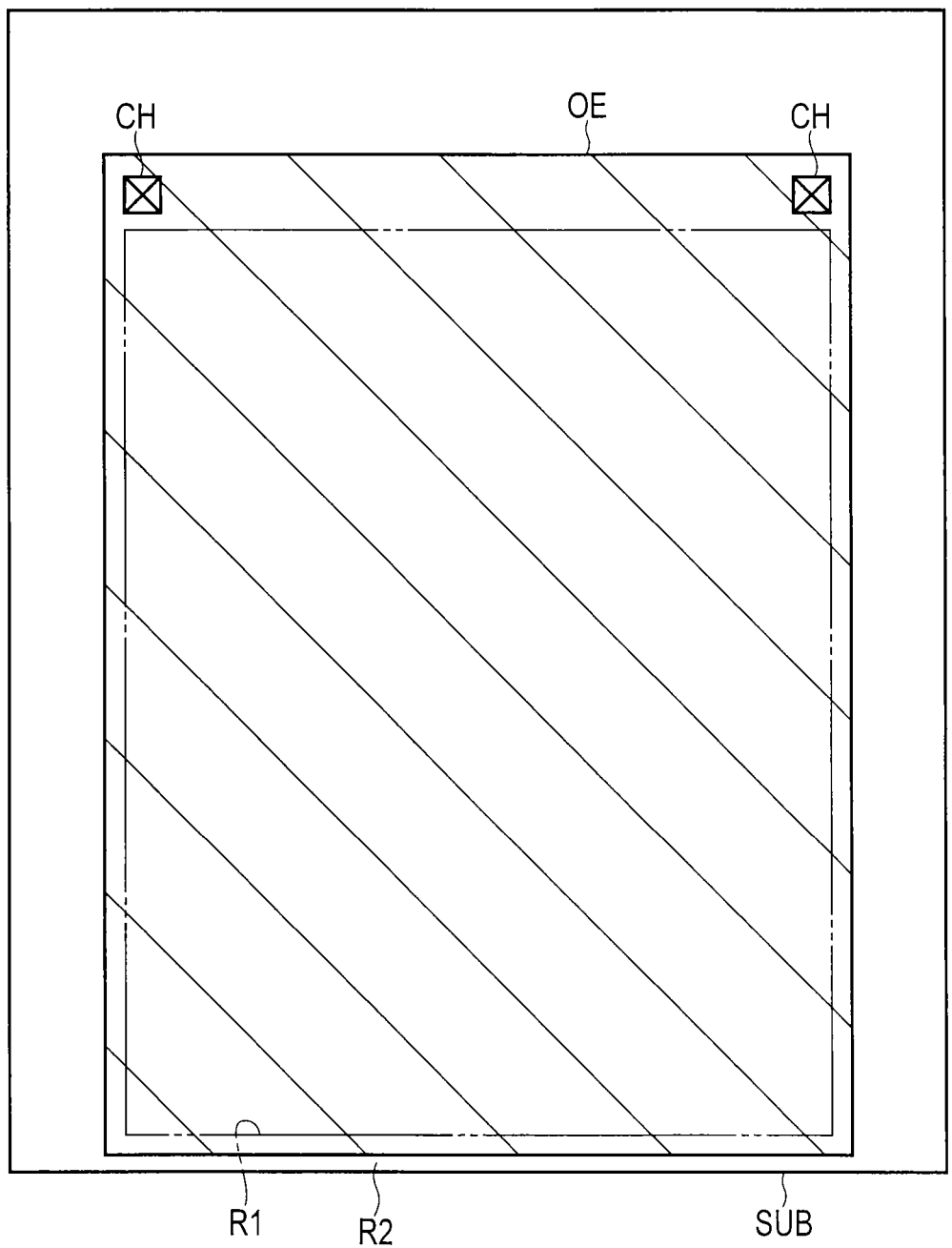
FIG. 5 is a plan view of the display apparatus according to a first embodiment, showing a schematic overall structure of the conductive layer shown in FIG. 3 and FIG. 4.
Figure 6:
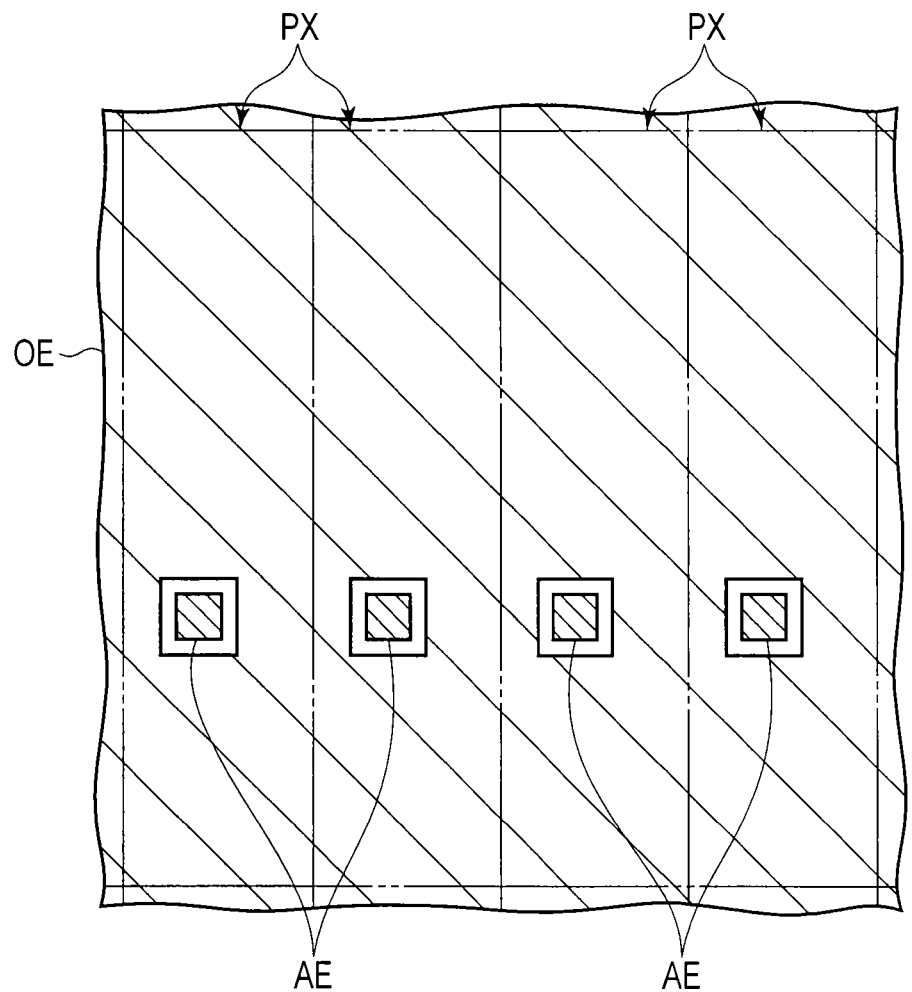
FIG. 6 is an enlarged plan view showing the connected electrode and the conductive layer.

Next, structures of the conductive layer OE and the auxiliary capacitance Cad will be described in detail with reference to FIG. 3 to FIG. 6. FIG. 4 is a partially sectional view of the display apparatus according to the embodiment, showing the drive transistor DRT, the power supply line PSH, the connected electrode AE, the conductive layer OE, and the pixel electrode PE. FIG. 5 is a plan view of the display apparatus according to the embodiment, showing a schematic overall structure of the conductive layer OE shown in FIG. 3 and FIG. 4. FIG. 6 is an expanded plan view showing the connected electrode AE and the conductive layer OE.

As shown in FIG. 3 to FIG. 6, the conductive layer OE is provided to be opposed to an overall display area R1. The conductive layer OE has an opening in each of the pixels PX, and is formed to be spaced apart from a peripheral edge of the connected electrode AE.

The conductive layer OE is connected to the power supply line PSH through the contact hole CH formed in the planarizing film PL, outside the display area R1. The power supply line PSH is connected to a power supply of a constant potential. In the present embodiment, the power supply line PSH is connected to a high-potential power supply and is fixed to the high potential Pvdd.

The conductive layer OE and the pixel electrode PE are opposed to each other to form the auxiliary capacitance Cad (i.e. capacitance unit). The auxiliary capacitance Cad can be formed without using the semiconductor layer. Since the auxiliary capacitance Cad can be formed in the region opposed to the element which uses the semiconductor layer, i.e. since the auxiliary capacitance Cad can be arranged with a good efficiency, use efficiency of space can be increased.

In addition, the conductive layer OE can be formed of metal (for example, Al) since the display apparatus according to the present embodiment is an upper-surface illumination type display apparatus. If the display apparatus is a lower-surface illumination type display apparatus or a light-transmissive type display apparatus such as a liquid crystal display apparatus, the conductive layer OE cannot be formed of metal.

Next, an arrangement of the pixels PX will be described. FIG. 7 is a schematic diagram showing an arrangement of the pixels PX according to the present embodiment.

As shown in FIG. 7, the pixels PX are so called vertical stripe pixels. A pixel PX configured to display a red image, a pixel PX configured to display a green image, a pixel PX configured to display a blue image, and a pixel PX configured to display an achromatic image, are arranged alternately in the row direction X. Pixels PX configured to display images of the same color are arranged in the columnar direction Y.

The red (R) pixel PX, the green (G) pixel PX, the blue (B) pixel PX, and the achromatic (W) pixel PX form a picture element P. In the Example 1, the picture element P comprises four (four-color) pixels PX, but is not limited to these and can be variously modified. For example, if the achromatic pixel PX is not provided, the picture element P may comprise three (three-color) pixels PX of red, green and blue.

The output switch BCT is shared by four adjacent pixels PX (i.e., two pixels adjacent in the columnar direction Y and two pixels adjacent in the row direction X). Thus, each of the number of the first scanning lines Sga and the number of the third scanning lines Sgc is set to m/2.

The arrangement of the pixels PX is not limited to the arrangement of the present embodiment (FIG. 7), but can be variously modified. For example, the pixels PX may be so called RGBW square pixels. In this case, for example, any two of red, green, blue and achromatic color pixels PX are arranged in even-number rows and the remaining two pixels are arranged in odd-number rows.

In the present embodiment, terms such as the pixels PX and the picture element P are used. The "pixels" can be replaced with "sub-pixels". In this case, the "picture element" is a "pixel".

Figure 8:
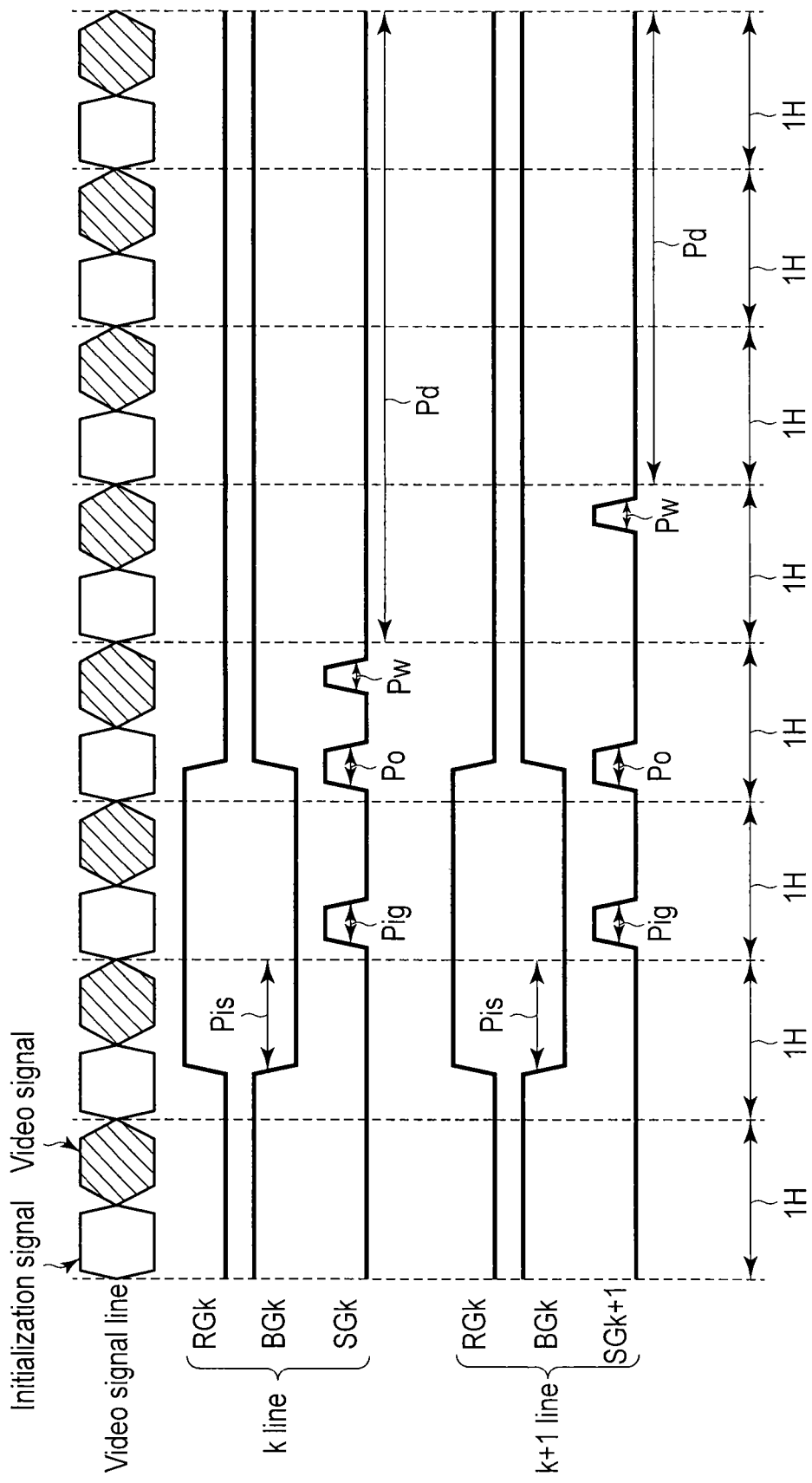
FIG. 8 is a timing chart showing a control signal of a scanning line driving circuit in a case where an offset cancellation is executed once, in the pixel arrangement according to the first embodiment.
Figure 9:
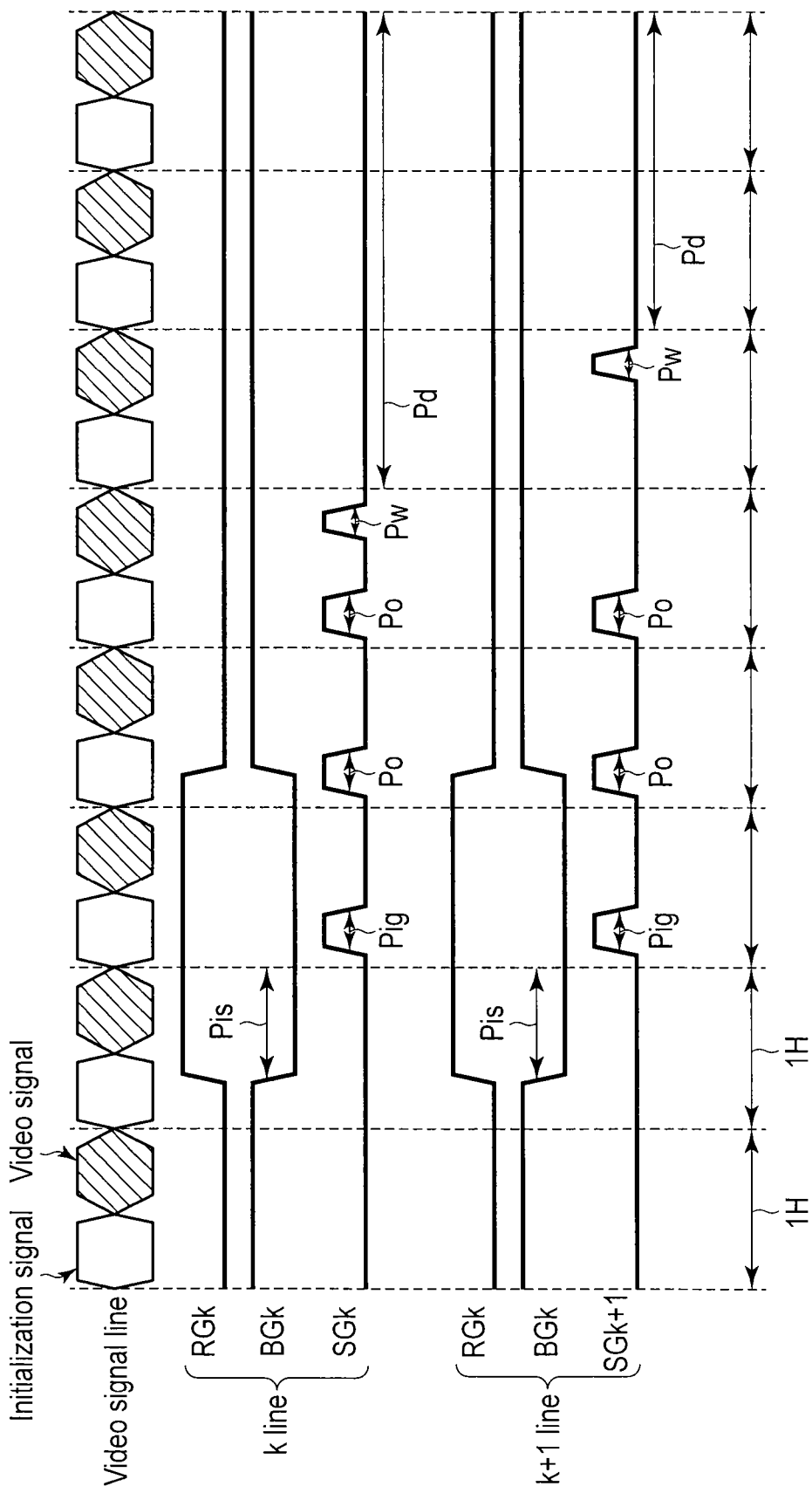
FIG. 9 is a timing chart showing a control signal of a scanning line driving circuit in a case where an offset cancellation is executed twice, in the pixel arrangement according to the first embodiment.

Next, operations of the display apparatus (i.e. organic EL display apparatus) configured as described above will be explained. FIG. 8 is a timing chart showing a control signal of the scanning line driving circuits YDR1 and YDR2 at display operations. FIG. 9 is a timing chart showing a control signal of the scanning line driving circuits YDR1 and YDR2 at displaying the operations.

FIG. 8 shows a case where an offset cancellation is executed once, in the longitudinal stripe element. FIG. 9 shows a case where the offset cancellation is executed at a plurality of times (twice as a typical example in the present embodiment), in the longitudinal stripe element. For this reason, the display apparatus can be driven with the control signal shown in FIG. 8 or FIG. 9 in the present embodiment.

The scanning line driving circuits YDR1 and TDR2 generate, for example, pulses of a width (Tw-Starta) of a single horizontal scanning period corresponding to respective horizontal scanning periods from the start signals (STV1 to STV3) and the clocks (CKV1 to CKV3), and output the pulses as control signals BG(1–m/2), SG(1–m) and RG(1–m/2). The single horizontal scanning period is represented by 1H.

The operations of the pixel circuit are classified into a source initialization operation executed in a source initialization period Pis, a gate initialization operation executed in a gate initialization period Pig, an offset cancellation (OC) operation executed in an offset cancellation period Po, a video signal writing operation executed in a video signal writing period Pw, and a display operation (emission operation) executed in a display period (emission period).

As shown in FIG. 8, FIG. 9, FIG. 1 and FIG. 2, first, the driver 10 executes the source initialization operation. In the source initialization operation, the control signal SG is set to a level (off potential: low level) at which the pixel switch SST is turned off, the control signal BG is set to a level (off potential: low level) at which the output switch BCT is turned off, and the control signal RG is set to a level (on potential: high level) at which the reset switch RST is turned on by the scanning line driving circuits YDR1 and TDR2.

Each of the output switch BCT and the pixel switch SST is turned off (non-conductive state), the reset switch RST is turned on (conductive state), and the source initialization operation is started. By turning on the reset switch RST, the source electrode and the drain electrode of the drive transistor DRT are reset to the same electric potential as the electric potential (reset potential Vrst) of the reset power supply and the source initialization operation is completed. The reset power supply (reset potential Vrst) is set to, for example, –2V.

Next, the driver 10 executes the gate initialization operation. In the gate initialization operation, the control signal SG is set to a level (on potential: high level) at which the pixel switch SST is turned on, the control signal BG is set to the level at which the output switch BCT is turned off, and the control signal RG is set to the level at which the reset switch RST is turned on by the scanning line driving circuits YDR1 and TDR2. The output switch BCT is turned off, each of the pixel switch SST and the reset switch RST is turned on, and the gate initialization operation is started.

In the gate initialization period Pig, the initialization signal Vini (initialization voltage) output from the video signal line VL is applied to the gate electrode of the drive transistor DRT via the pixel switch SST. As a result, the electric potential of the gate electrode of the drive transistor DRT is reset to the electric potential corresponding to the initialization signal Vini, and the information in the previous frame is initialized. The voltage level of the initialization signal Vini is set to, for example, 2V.

Next, the driver 10 executes the offset cancellation operation. The control signal SG is set to the on potential, the control signal BG is set to the on potential (high level), and the control signal RG is set to the off potential (low level). As a result, the reset switch RST is turned off, each of the pixel switch SST and the output switch BCT is turned on, and the offset cancellation operation of the threshold value is started.

In the offset cancellation period Po, the initialization signal Vini is provided to the gate electrode of the drive transistor DRT via the video signal line VL and the pixel switch SST, and the electric potential of the gate electrode of the drive transistor DRT is fixed.

The output switch BCT is turned on and the current flows from the high-potential power supply line SLa to the drive transistor DRT. The electric potential of the source electrode of the drive transistor DRT is gradually shifted to the high-potential side while setting the electric potential (reset potential Vrst) written in the source initialization period Pis to the initial value, gradually decreasing the current flowing between the drain electrode and the source electrode of the drive transistor DRT, and absorbing/compensating for the TFT characteristic variation of the drive transistor DRT. According to the present embodiment, the offset cancellation period Po is set to a period of, for example, approximately 1 μsec.

At the end of the offset cancellation period Po, the electric potential of the source electrode of the drive transistor DRT is Vini-Vth. Vini is a voltage value of the initialization signal Vini, and Vth is a threshold voltage of the drive transistor DRT. As a result, the voltage between the gate electrode and the source electrode of the drive transistor DRT reaches a cancellation point (Vgs=Vth), and the potential difference corresponding to the cancellation point is stored (held) in the holding capacitance Cs. The offset cancellation period Po can be provided at a plurality of times as needed, similarly to the example shown in FIG. 9.

Then, in the video signal writing period Pw, the control signal SG is set to the level at which the pixel switch SST is turned on, the control signal BG is set to the level at which the output signal BCT is turned on, and the control signal RG is set to the level at which the reset switch RST is turned off. As a result, each of the pixel switch SST and the output switch BCT is turned on, the reset switch RST is turned off, and the video signal writing operation is started.

The video signal Vsig is written from the video signal line VL to the gate electrode of the drive transistor DRT via the pixel switch SST, in the video signal writing period Pw. The current flows from the power supply line SLa to the low-potential power supply electrode SLb via the output switch BCT, the drive transistor DRT and the capacity unit (parasitic capacitance) Cel of the diode OLED. The electric potential of the gate electrode of the drive transistor DRT is Vsig(R, G, B) and the electric potential of the source electrode of the drive transistor DRT is Vini−Vth+Cs(Vsig−Vini)/(Cs+Cel+Cad), immediately after the pixel switch SST is turned on.

Vsig represents a voltage value of the video signal Vsig, Cs represents a capacity of the holding capacitance Cs, Cel represents a capacity of the capacity unit Cel, and Cad represents a capacity of the auxiliary capacitance Cad.

After that, the current flows to the low-potential power supply electrode SLb via the capacity unit Cel of the diode OLED. At the end of the video signal writing period Pw, the electric potential of the gate electrode of the drive transistor DRT is Vsig(R, G, B) and the electric potential of the source electrode of the drive transistor DRT is Vini−Vth+ΔV1+Cs(Vsig−Vini)/(Cs+Cel+Cad). The relationship between the current Idrt flowing to the drive transistor DRT and the capacity Cs+Cel+Cad is represented by the following expression. ΔV1 represents a displacement of the electric potential of the source electrode corresponding to the voltage value of the video signal Vsig, the video signal writing period Pw and the mobility of the transistor as determined by the following Expression 1.

$$\int_0^{Pw} I_{drt} dt = \int_{Vs}^{Vs+\Delta V1}(Cs+Cel+Cad)dV \quad \text{(Expression 1)}$$

where $$I_{drt} = \beta \times (Vgs-Vth)^2$$
$$= \beta \times \{(Vsig-Vini) \times (Cel+Cad)/(Cs+Cel+Cad)\}^2.$$

β is defined by the following expression:

$$\beta = \mu \times Cox \times W/2L$$

where W represents a channel width of the drive transistor DRT, L represents a channel length of the drive transistor DRT, μ represents a carrier mobility, and Cox represents a gate capacitance per unit area. The variation of the mobility of the drive transistor DRT is thereby corrected.

Finally, in the display period Pd, the control signal SG is set to the level at which the pixel switch SST is turned off, the control signal BG is set to the level at which the output switch BCT is turned on, and the control signal RG is set to the level at which the reset switch RST is turned off. The output switch BCT is turned on, each of the pixel switch SST and the reset switch RST is turned off, and the display operation is started.

The drive transistor DRT outputs the drive current Ie in an amount corresponding to the gate control voltage written in the holding capacitance Cs. The drive current Ie is supplied to the diode OLED. As a result, the diode OLED emits light in brightness according to the drive current Ie and executes the display operation. The diode OLED maintains the light-emitting state until the control signal BG is set to the off potential again after one frame period.

By repeating the above-described source initialization operation, the gate initialization operation, the offset cancellation operation, the video signal writing operation and the display operation in order in each of the pixels PX, a desirable image is displayed.

According to the display apparatus and the method of driving the display apparatus of the first embodiment configured as described above, the display apparatus comprises a plurality of semiconductor layers (SC), the first insulation film (gate insulation film GI, interlayer insulation film II, and planarizing film PL), the conductive layer OE (first conductive layer), the second insulation film (passivation film PS), and the diode OLED.

The gate insulation film GI, the interlayer insulation film II, and the planarizing film PL are provided above the plurality of semiconductor layers. The conductive layer OE is provided on the planarizing film PL and made of metal. The passivation film PS is provided on the planarizing film PL and the conductive layer OE. The diode OLED comprises the pixel electrode PE (second conductive layer) provided on the passivation film PS.

The conductive layer OE and the pixel electrode PE are opposed to each other and can form the auxiliary capacitance Cad (capacitance unit). Since the auxiliary capacitance Cad can be formed without using the semiconductor layers, the auxiliary capacitance Cad can be formed in a region opposed to the element which uses the semiconductor layers. Since the auxiliary capacitance Cad can be arranged with a good efficiency as compared to the case of forming the auxiliary capacitance Cad by using the semiconductor layer, utilization efficiency of space can be improved, which can contribute to the high definition in the pixels PX.

In the display period Pd, the output current Iel of the saturation region of the drive transistor DRT is provided to the diode OLED so that light is emitted. Here, the output current Iel is represented by the following expression:

$$Iel=\beta \times \{(Vsig-Vini-\Delta V1) \times (Cel+Cad)/(Cs+Cel+Cad)\}^2$$

where β is the gain coefficient of the drive transistor DRT. β is defined by the following expression:

$$\beta = \mu \times Cox \times W/2L$$

where W is the channel width of the drive transistor DRT, L is the channel length of the drive transistor DRT, μ is the carrier mobility, and Cox is the gate capacitance per unit area.

Accordingly, the output current Iel is a value which does not depend on the threshold voltage Vth of the drive transistor DRT, and an influence on the output current Iel caused by variations in the threshold voltage of the drive transistor DRT can be eliminated.

Furthermore, the greater the mobility p of the drive transistor DRT is, the greater the absolute value of the above-mentioned ΔV1 becomes. Thus, an influence of the mobility μ can also be compensated. Accordingly, it is possible to reduce occurrences of display defect, streaks and unevenness on display, and feeling of roughness, which result from the variations, and perform high-quality image display.

Based on the above descriptions, the high-definition display apparatus and the method of driving the display apparatus can be obtained.

Figure 10:
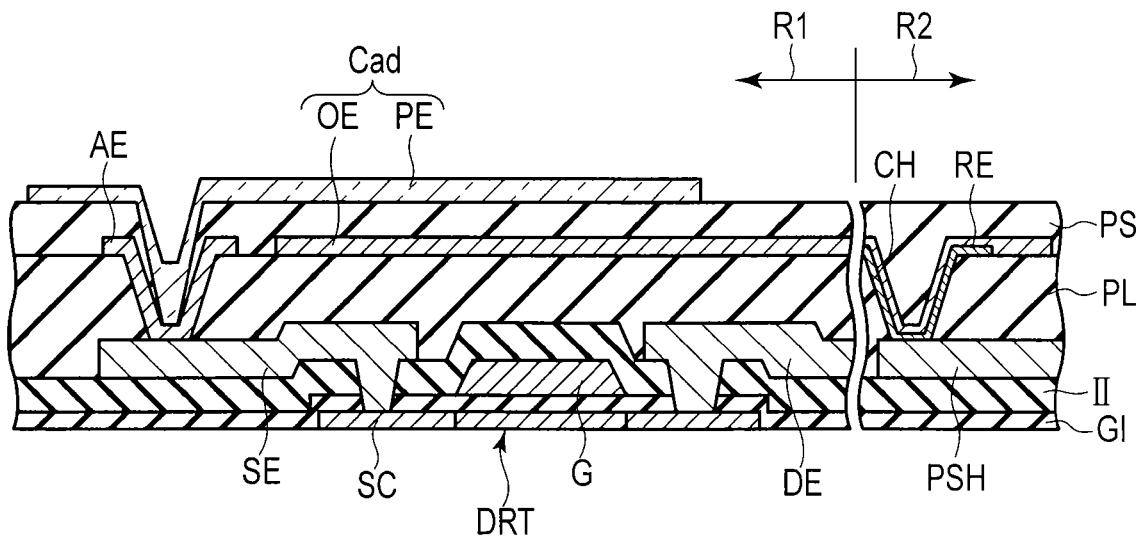
FIG. 10 is a partially sectional view of a modified example of the display apparatus according to the first embodiment, showing the drive transistor, the power supply line, the connected electrode, the conductive layer and the pixel electrode.
Figure 11:
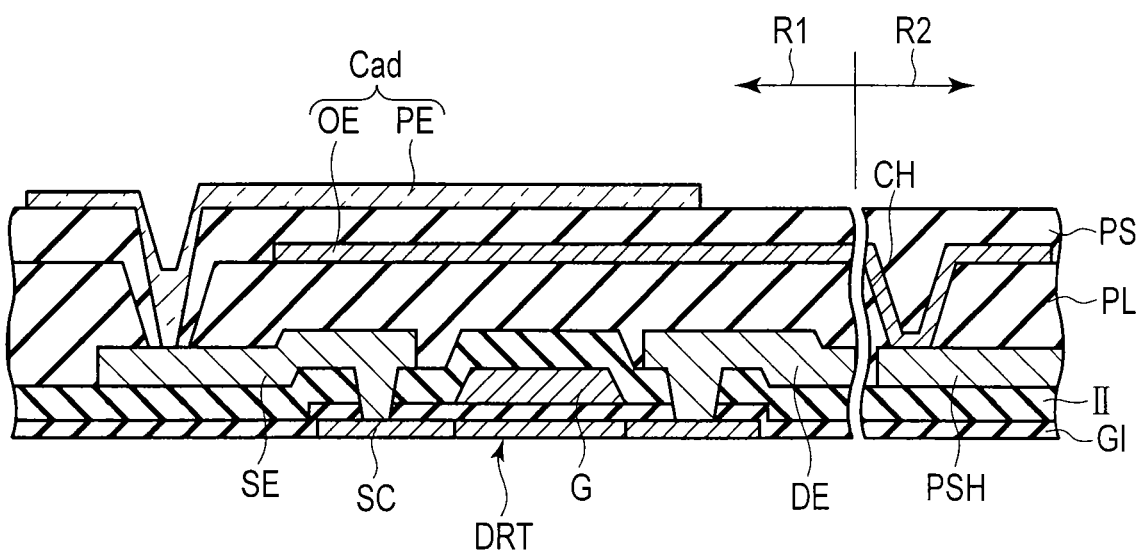
FIG. 11 is a partially sectional view of another modified example of the display apparatus according to the first embodiment, showing the drive transistor, the power supply line, the conductive layer and the pixel electrode.

A modified example of the display apparatus according to the first embodiment will be explained. FIG. 10 is a partially sectional view of the modified example of the display apparatus according to the first embodiment, showing the drive transistor DRT, the power supply line PSH, the connected electrode AE, the connected electrode RE, the conductive layer OE and the pixel electrode PE. FIG. 11 is a partially sectional view of another modified example of the display apparatus according to the first embodiment, showing the drive transistor DRT, the power supply line PSH, the conductive layer OE and the pixel electrode PE.

The conductive layer OE is formed of metal (for example, Al) as shown in FIG. 10. The connected electrode AE and the connected electrode RE are formed of a transparent conductive material (for example, ITO). The connected electrode RE is connected to the power supply line PSH through the contact hole CH formed in the planarizing film PL. The conductive layer OE is formed of Al or the like after the connected electrode AE and the connected electrode RE are formed of ITO or the like.

When the connected electrode AE, the connected electrode RE and the like are formed of a transparent conductive material, an electrode layer may be formed of the same material on the lines such as the power supply line PSH and the video signal line VL outside the display area R1, though not shown in the figures. The electrode layer has moisture-proof and is exposed to air. In other words, since the lines exposed to the air can be covered with the electrode layer, degradation of the lines (products) can be decreased.

The pixel electrode PE may be connected directly to the source electrode SE of the drive transistor DRT, through the contact holes formed in the planarizing film PL and the passivation film PS, as shown in FIG. 11.

Figure 12:
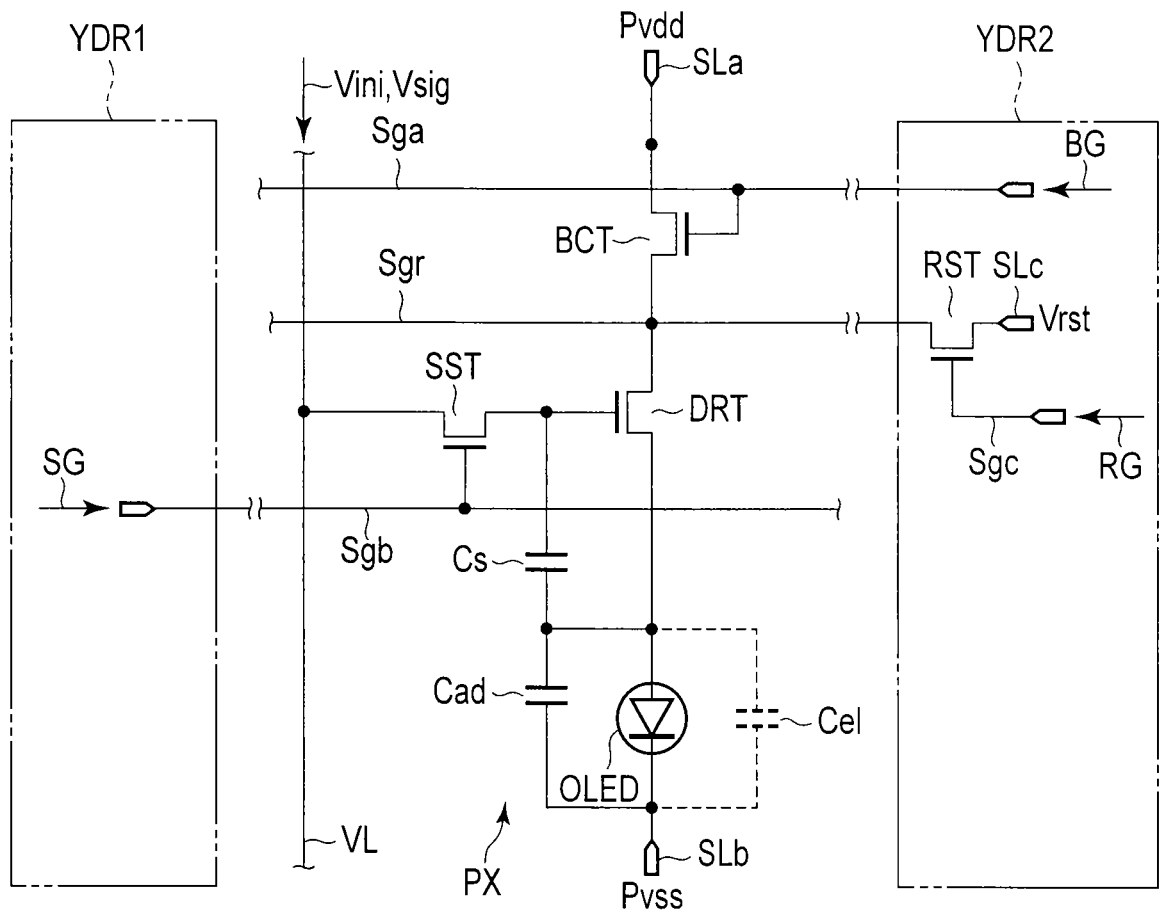
FIG. 12 is an equivalent circuit diagram of a pixel in a display apparatus according to a second embodiment.
Figure 13:
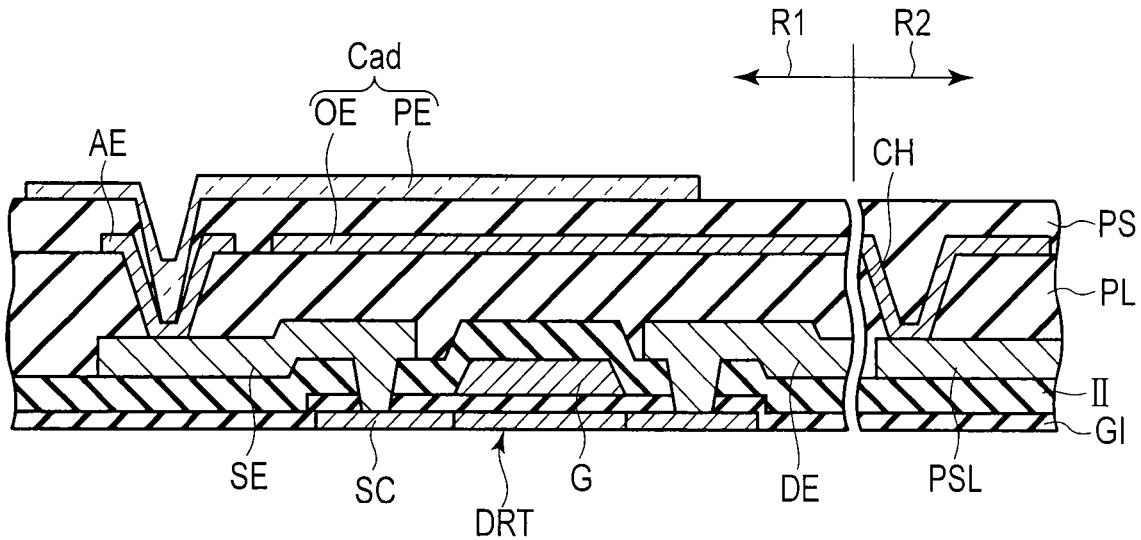
FIG. 13 is a partially sectional view of the display apparatus according to the second embodiment, showing a drive transistor, a power supply line, a connected electrode, a conductive layer and a pixel electrode.

Next, a display apparatus and a method of driving the display apparatus according to a second embodiment will be described. In the present embodiment, the same functional portions as the portions of the above-described first embodiment are represented by the same reference numerals and their detailed descriptions are omitted. FIG. 12 is an equivalent circuit diagram of a pixel in the display apparatus according to the present embodiment. FIG. 13 is a partially sectional view of the display apparatus according to the present embodiment, showing a drive transistor DRT, a power supply line PSL, a connected electrode AE, a conductive layer OE and a pixel electrode PE.

As shown in FIG. 12 and FIG. 13, the conductive layer OE is connected to the power supply line PSL through the contact hole CH formed in the planarizing film PL, outside the display area R1. The power supply line PSL is connected to a power supply of a constant potential. In the present embodiment, the power supply line PSL is connected to a low-potential power supply and is fixed to the low potential Pvss.

The conductive layer OE and the pixel electrode PE are opposed to each other to form the auxiliary capacitance Cad (i.e. capacitance unit). The auxiliary capacitance Cad can be formed without using the semiconductor layer. Since the auxiliary capacitance Cad can be arranged with a good efficiency, use efficiency of space can be increased.

According to the display apparatus and the method of driving the display apparatus of the second embodiment configured as described above, the display apparatus comprises a plurality of semiconductor layers (SC), the first insulation film (gate insulation film GI, interlayer insulation film II, and planarizing film PL), the conductive layer OE (first conductive layer), the second insulation film (passivation film PS), and the diode OLED. The conductive layer OE is connected to the power supply line PSL (low-potential power supply).

The conductive layer OE and the pixel electrode PE are opposed each other to form the auxiliary capacitance Cad (i.e. capacitance unit). Since the auxiliary capacitance Cad can be formed without using the semiconductor layer, the auxiliary capacitance Cad can be formed in the region opposed to the element which uses the semiconductor layer. Since the use efficiency of space can be increased, definition of the pixel PX can be higher.

In addition, the same advantage as the above-described first embodiment can be obtained.

According to the above-described embodiment, the high-definition display apparatus and the method of driving the display apparatus can be obtained.

Figure 14:
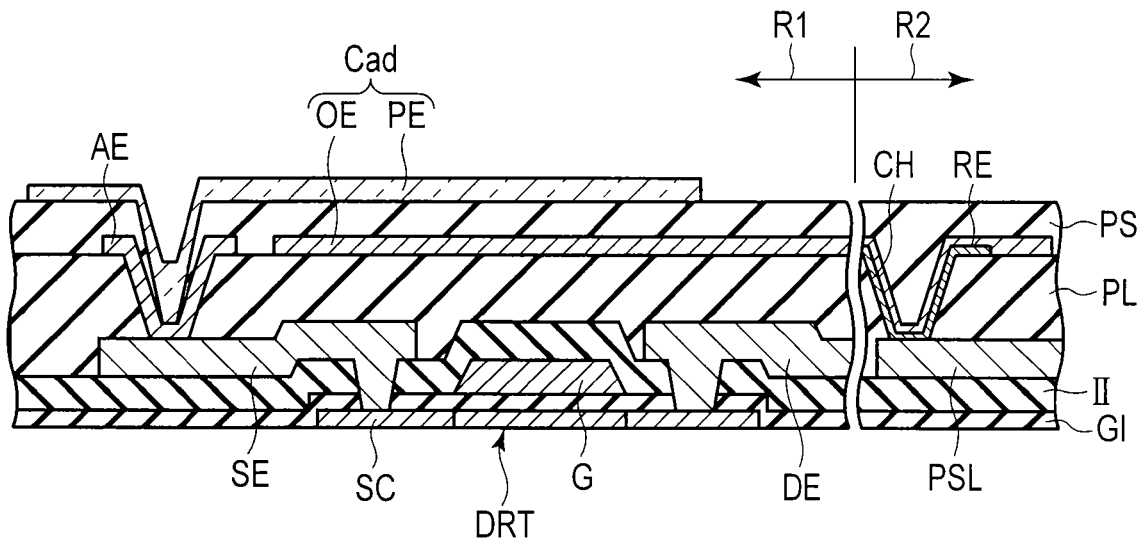
FIG. 14 is a partially sectional view of a modified example of the display apparatus according to the second embodiment, showing a drive transistor, a power supply line, a connected electrode, a conductive layer and a pixel electrode.
Figure 15:
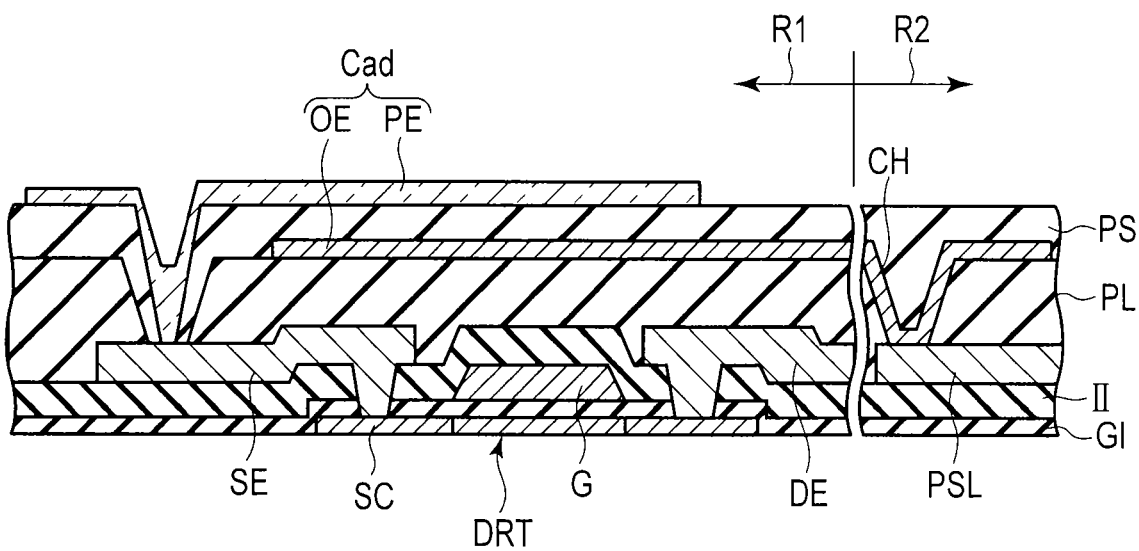
FIG. 15 is a partially sectional view of another modified example of the display apparatus according to the second embodiment, showing a drive transistor, a power supply line, a conductive layer and a pixel electrode.

A modified example of the display apparatus according to the second embodiment will be explained. FIG. 14 is a partially sectional view of the modified example of the display apparatus according to the second embodiment, showing the drive transistor DRT, the power supply line PSL, the connected electrode AE, the connected electrode RE, the conductive layer OE and the pixel electrode PE. FIG. 15 is a partially sectional view of another modified example of the display apparatus according to the second embodiment, showing the drive transistor DRT, the power supply line PSL, the conductive layer OE and the pixel electrode PE.

The conductive layer OE is formed of metal (for example, Al) as shown in FIG. 14. The connected electrode AE and the connected electrode RE are formed of a transparent conductive material (for example, ITO). The connected electrode RE is connected to the power supply line PSL through the contact hole CH formed in the planarizing film PL. The conductive layer OE is formed of Al or the like after the connected electrode AE and the connected electrode RE are formed of ITO or the like.

When the connected electrode AE, the connected electrode RE and the like are formed of a transparent conductive material, an electrode layer may be formed of the same material on the lines such as the power supply line PSL and the video signal line VL outside the display area R1, though not shown in the figures. The electrode layer has moisture-proof and is exposed to air. In other words, since the lines exposed to the air can be covered with the electrode layer, degradation of the lines (products) can be decreased.

The pixel electrode PE may be connected directly to the source electrode SE of the drive transistor DRT, through the contact holes formed in the planarizing film PL and the passivation film PS, as shown in FIG. 15.

The above-described first and second embodiments have been presented as mere examples, and are not intended to limit the scope of the embodiments. The above-described first and second embodiments can be implemented by modifying the constituent elements without departing from the spirit thereof. In addition, various embodiments can be formed by an arbitrary combination of the plurality of constituent elements disclosed in the above-described embodiments. For example, some of the constituent elements disclosed in the embodiments may be deleted. Furthermore, the constituent elements of different embodiments may be arbitrarily combined.

For example, the semiconductor layer of TFT can be formed of not only polysilicon, but also amorphous silicon. TFT that structures each of the switches and the drive transistor DRT are not limited to N-channel type TFT, but may be P-channel type TFT. Similarly, the reset switch RST may be formed of N-channel or P-channel type TFT. The shape and size of the drive transistor DRT and the switches are not limited to the above-described embodiments, but can be changed as needed.

In addition, one output switch BCT is provided for four pixels PX and thereby shared, but the number of output switches BCT can be increased or decreased as needed. For example, one output switch BCT may be provided in each pixel PX. Two pixels PX provided in two rows and one column may share one output switch BCT, and eight pixels PX provided in two rows and four columns may share one output switch.

All pixels PX in a row may share one output switch BCT. In this case, the output switch BCT and the first scanning line Sga may be provided in the scanning line driving circuit YDR2 (YDR1). That is, in the output switch BCT, the source electrode is connected to the high-potential power supply, the drain electrode is connected to the reset line Sgr and the gate electrode is connected to the first scanning line Sga.

Furthermore, the self-emitting element which structures the pixel PX is not limited to the diode (organic EL diode) OLED, but can be formed by applying various self-emitting display elements.

The auxiliary capacitance Cad may be connected between the source electrode of the drive transistor DRT and wiring lines of a constant potential. The wiring lines of the constant potential are the high-potential power supply line SLa, the low-potential power supply line SLb and the reset line Sgr.

The above-described first and second embodiments can be applied not only to the above-described display apparatus and the method of driving the display apparatus, but to various types of display apparatuses and the methods of driving these display apparatuses.

Next, matters on the above-described first and second embodiments and their modified embodiments will be described below in (A1)-(A10).

(A1) A display apparatus comprising:
a plurality of semiconductor layers;
a first insulation film provided above the plurality of semiconductor layers;
a first conductive layer provided on the first insulation film and formed of metal;
a second insulation film provided on the first insulation film and the first conductive layer; and
a display element comprising a second conductive layer provided on the second insulation film,
wherein the first conductive layer and the second conductive layer are opposed to each other to form a capacitance unit.

(A2) The apparatus according to (A1), wherein the second conductive layer is formed by laminating a transparent electrode layer and a light reflective electrode layer.

(A3) The apparatus according to (A1), further comprising a plurality of pixels arrayed in a matrix along a row direction and a columnar direction, each of the plurality of pixels comprising:
the display element connected between a high-potential power supply and a low-potential power supply;
a drive transistor comprising a source electrode connected to the display element, a drain electrode connected to a reset line and a gate electrode;
an output switch connected between the high-potential power supply and the drain electrode of the drive transistor, and configured to change a state between the high-potential power supply and the drain electrode of the drive transistor to a conductive state or a non-conductive state;
a pixel switch connected between a video signal line and the gate electrode of the drive transistor, and configured to discriminate whether a signal provided via the video signal line is input to a side of the gate electrode of the drive transistor; and
a holding capacitance connected between the source electrode and the gate electrode of the drive transistor,
wherein the drive transistor, the output switch, the pixel switch and the holding capacitance are formed by using the semiconductor layers.

(A4) The apparatus according to (A3), further comprising:
a first scanning line connected to the output switch;
a second scanning line connected to the pixel switch;
a scanning line driving circuit connected to the first scanning line and the second scanning line; and
a signal line driving circuit connected to the video signal line.

(A5) The apparatus according to (A3), wherein the output switch is shared by the pixels.

(A6) The apparatus according to (A1), further comprising a plurality of pixels arrayed in a matrix along a row direction and a columnar direction, each of the plurality of pixels comprising:
the display element connected between a high-potential power supply and a low-potential power supply;
a drive transistor comprising a source electrode connected to the display element, a drain electrode connected to a reset line and a gate electrode;
a pixel switch connected between a video signal line and the gate electrode of the drive transistor, and configured to discriminate whether a signal provided via the video signal line is input to a side of the gate electrode of the drive transistor; and
a holding capacitance connected between the source electrode and the gate electrode of the drive transistor,
wherein the drive transistor, the pixel switch and the holding capacitance are formed by using the semiconductor layers.

(A7) The apparatus according to (A6), further comprising:
a scanning line driving circuit which comprises an output switch connected between the high-potential power supply and the reset line, and configured to change a state between the high-potential power supply and the reset line to a conductive state or a non-conductive state, and a first scanning line connected to the output switch;

a second scanning line connected to the scanning line driving circuit and the pixel switch; and a signal line driving circuit connected to the video signal line.

(A8) The apparatus according to (A3) or (A6), wherein each of the pixels further comprises an auxiliary capacitance that is the capacitance unit, the first conductive layer is connected to a constant potential power supply, and the second conductive layer is connected to the source electrode of the drive transistor.

(A9) The apparatus according to (A8), wherein the constant potential power supply is the high-potential power supply or the low-potential power supply, and the first conductive layer is connected to a power supply line connected to the constant potential power supply outside a display area.

(A10) The apparatus according to (A9), further comprising a moisture-proof electrode layer provided on the power supply line outside the display area, wherein the moisture-proof electrode layer is exposed to air.

A display apparatus and a method of driving the display apparatus according to a third embodiment will be hereinafter described in detail with reference to the drawings. In the present embodiment, the display apparatus is an active matrix type display apparatus and, more specifically, an active matrix type organic EL (electroluminescent) display apparatus. In the present embodiment, the same functional portions as those of the first embodiment are denoted by the same reference symbols, and their detailed descriptions are omitted. FIG. 1, FIG. 2, FIG. 7, FIG. 8 and FIG. 9, and the descriptions thereof can also be applied to the descriptions of the present embodiment.

Figure 17:
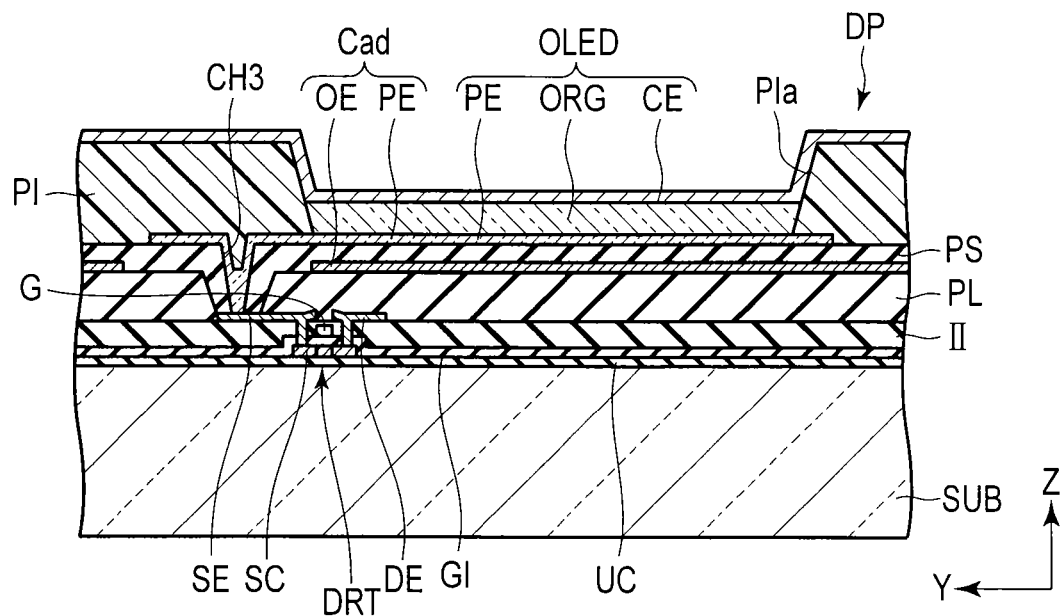
FIG. 17 is a partially sectional view schematically showing an example of a structure applicable to the display apparatus according to the third embodiment.

FIG. 16 is an equivalent circuit diagram of a pixel in the display apparatus according to the present embodiment. FIG. 17 is a partially sectional view schematically showing an example of a structure applicable to the display apparatus according to the present embodiment. In FIG. 3, the display apparatus is illustrated such that a display surface, i.e., a front surface or a light emitting surface faces upwardly and a back surface faces downwardly. The display apparatus is a top-surface-emitting type organic EL display apparatus adopting the active matrix type drive.

As shown in FIG. 16, a display panel DP comprises a power supply line PSH fixed at a high potential Pvdd, and a power supply line PSL fixed at a low potential Pvss. In the present embodiment, the power supply line PSH is hereinafter called a high-potential power supply line PSH, and the power supply line PSL is hereinafter called a low-potential power supply line PSL. The high-potential power supply line PSH is connected to a high-potential power supply, and the low-potential power supply electrode PSL is connected to a low-potential power supply (i.e., referential potential power supply).

In a pixel circuit of a pixel PX, a drive transistor DRT and an output switch BCT are connected in series with a diode OLED between the high-potential power supply line PSH (high-potential power supply) and the low-potential power supply line PSL. The high-potential power supply line PSH (high potential Pvdd) is set to the potential of, for example, 10V and the low-potential power supply line PSL (low potential Pvss) is set to the potential of, for example, 1.5V.

In the output switch BCT, a drain electrode is connected to the high-potential power supply line PSH (i.e. conductive layer OE to be described later), a source electrode is connected to a drain electrode of the drive transistor DRT, and a gate electrode is connected to a first scanning line Sga. The output switch BCT is therefore controlled to be turned on (conductive state) and off (nonconductive state) by a control signal BG(1−m/2) from the first scanning line Sga. The output switch BCT controls a light emission time of the diode OLED in response to the control signal BG.

In the drive transistor DRT, the drain electrode is connected to the source electrode of the output switch BCT and the reset line Sgr, and the source electrode is connected to one of the electrodes of the diode OLED (i.e. an anode). The other electrode of the diode OLED (i.e. a cathode) is connected to the low-potential power supply line PSL. The drive transistor DRT outputs a driving current having an amount of current corresponding to a video signal Vsig to the diode OLED.

Next, the structures of the drive transistor DRT and the diode OLED will be described in detail with reference to FIG. 17.

The N-channel type TFT which forms the drive transistor DRT comprises a semiconductor layer SC as shown in FIG. 17. The semiconductor layer SC is provided on an undercoat layer UC provided on the insulation substrate SUB. The semiconductor layer SC is, for example, a polysilicon layer including a p-type region and an n-type region.

The semiconductor layer SC is covered with a gate insulation film GI. On the gate insulation film GI, a first conductive layer is provided. The gate electrode G of the drive transistor DRT can serve as the first conductive layer. The gate electrode G is opposed to the semiconductor layer SC. On the gate insulation film GI and the gate electrode G, an interlayer insulation film II is provided.

On the interlayer insulation film II, a second conductive layer is provided. A source electrode SE and a drain electrode DE can serve as the second conductive layer. The source electrode SE and the drain electrode DE are connected to a source region and a drain region of the semiconductor layer SC, through contact holes formed in the interlayer insulation film II and the gate insulation film GI, respectively.

A planarizing film PL having an insulating property is provided on the interlayer insulation film II, the source electrode SE and the drain electrode DE. The planarizing film PL functions as a first insulation film. In other words, the planarizing film PL is provided above a plurality of semiconductor layers, the first conductive layer and the second conductive layer formed in mutually different layers.

A third conductive layer is formed on the planarizing film PL. The conductive layer OE can serve as the third conductive layer. In the present embodiment, the conductive layer OE is formed of metal (for example, Al: aluminum). A passivation film PS is provided on the planarizing film PL and the conductive layer OE. The passivation film PS functions as a second insulation film.

A fourth conductive layer is provided on the passivation film PS. A fifth conductive layer is provided above the fourth conductive layer. The diode OLED includes the pixel electrode PE serving as the fourth conductive layer, an organic layer ORG, and a counter electrode CE serving as the fifth conductive layer. In the present embodiment, the pixel electrode PE is an anode while the counter electrode CE is a cathode.

The pixel electrode PE is provided on the passivation film PS. The pixel electrode PE is connected to the source electrode SE through a contact hole CH3 formed in the passivation film PS and a contact hole formed in the planarizing film PL. The pixel electrode PE is a back electrode having a light reflecting property. The pixel electrode PE is formed by stacking a transparent electrode layer and an electrode layer (for example, Al) having the light reflecting property. The transparent electrode layer may be formed of, for example, ITO (indium tin oxide) or IZO (indium zinc oxide).

At formation of the pixel electrode PE, a transparent conductive material is stacked on the passivation film PS, and a conductive material having the light reflecting property is stacked on the transparent conductive material and is subjected to patterning using photolithography. The pixel electrode PE is thereby formed.

A partition insulation film PI is further provided on the passivation film PS. In the partition insulation film PI, a through hole (bank) is formed at a position corresponding to the pixel electrode PE, or a slit is formed at a position corresponding to a column or a row formed by the pixel electrode PE. As an example, the partition insulation film PI has a through hole PIa at a position corresponding to the pixel electrode PE.

On the pixel electrode PE, the organic layer ORG including a luminous layer is formed as an active layer. The luminous layer is, for example, a thin film containing a luminescent organic compound in which a luminous color is red, green, blue or achromatic. The organic layer ORG can further include a hole injection layer, a hole transport layer, a hole blocking layer, an electron transport layer, an electron injection layer and the like, besides the luminous layer.

The luminous color of the diode OLED does not need to be necessarily classified into red, green, blue or achromatic color, but may be the achromatic color alone. In this case, the diode OLED can emit red, green, blue or achromatic color by combining color filters of red, green and blue.

The partition insulation film PI and the organic layer ORG are covered with the counter electrode CE. In this embodiment, the counter electrode CE is an electrode connected to a like electrode among the pixels PX, i.e., a common electrode. In addition, in this embodiment, the counter electrode CE is also a cathode and a light-transmitting front electrode. The counter electrode CE is formed of, for example, the ITO or IZO. The counter electrode CE is electrically connected to the low-potential power supply line PSL (not shown) in a non-display area R2 shaped in a rectangular frame.

In the diode OLED of this structure, an organic molecule constituting the organic layer ORG is excited to cause exciton when a hole injected from the pixel electrode PE and an electron injected from the counter electrode CE are recombined with each other inside the organic layer ORG. Light is emitted while the exciton is radiated and inactivated, and the light is released from the organic layer ORG to the outside through the transparent counter electrode CE.

Next, a structure of the auxiliary capacitance Cad will be described in detail with reference to FIG. 17 and FIG. 18.

Figure 18:
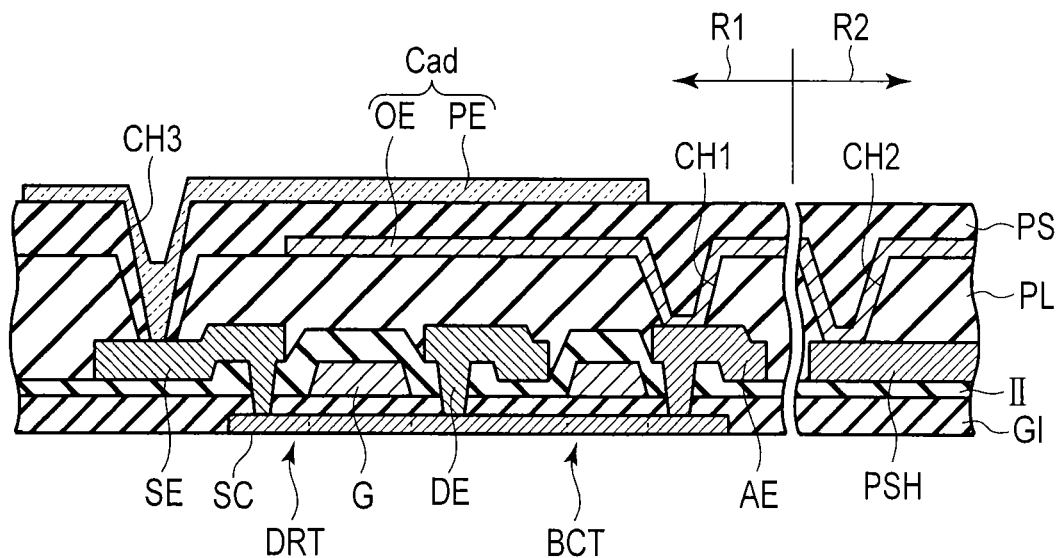
FIG. 18 is a partially sectional view of the display apparatus according to the third embodiment, showing a drive transistor, an output switch, a power supply line, a conductive layer and a pixel electrode.

FIG. 18 is a partially sectional view of the display apparatus according to the present embodiment, showing the drive transistor DRT, the output switch BCT, the high-potential power supply line PSH and the auxiliary capacitance Cad.

The conductive layer OE and the pixel electrode PE are opposed to each other to form the auxiliary capacitance Cad (i.e. capacitance unit). An electric potential of the conductive layer OE is fixed to a high potential Pvdd. The auxiliary capacitance Cad can be formed without using the semiconductor layer. Since the auxiliary capacitance Cad can be formed in the region opposed to the element which uses the semiconductor layer, i.e. since the auxiliary capacitance Cad can be arranged with a good efficiency, use efficiency of space can be increased.

In addition, since the display apparatus according to the present embodiment is an upper-surface illumination type display apparatus, the conductive layer OE can be formed of metal (for example, Al). If the display apparatus is a lower-surface illumination type display apparatus or a light-transmissive type display apparatus such as a liquid crystal display apparatus, the conductive layer OE cannot be formed of metal.

Next, a structure of the conductive layer OE will be described in detail with reference to FIG. 17 to FIG. 20. FIG. 19 is a plan view of a display apparatus of Example 1 according to the present embodiment, showing a schematic overall structure of a first example of the conductive layer OE. FIG. 20 is a plan view of the display apparatus of the Example 1 according to the present embodiment, showing a schematic overall structure of a second example of the conductive layer OE.

The conductive layer OE is provided in the display area R1 as shown in FIG. 19, FIG. 17 and FIG. 18. The conductive layer OE is connected to a drain electrode AE of the output switch BCT through a contact hole CH1 formed in the planarizing film PL. In Example 1, the pixels PX are so called RGBW square pixels.

The output switch BCT is shared by four adjacent pixels PX (i.e., two pixels adjacent in the columnar direction Y and two pixels adjacent in the row direction X). Thus, the contact hole CH1 is provided for every four adjacent pixels PX.

The conductive layer OE comprises a plurality of cut-outs OE1 and a plurality of openings OE2. The cut-outs OE1 and the openings OE2 may be optionally formed in the conductive layer OE. By the cut-outs OE1, load on the wiring lines (for example, the first scanning line Sga and the second scanning line Sgb) opposed to the cut-outs can be reduced. By the openings OE2, load on the wiring lines (for example, the first scanning line Sga, the second scanning line Sgb and the video signal line VL) opposed to the openings can be reduced.

In order to be electrically insulated from a contact portion between the source electrode SE and the pixel electrode PE, the conductive layer OE is spaced apart from the contact portion. For example, in the regions where the cut-outs OE1 and the openings OE2 are formed, insulation between the conductive layer OE and the contact portion can be maintained by using these regions.

The conductive layer OE is provided to extend to the non-display area R2. The conductive layer OE is opposed to the high-potential power supply line PSH, in the non-display area R2. The conductive layer OE is connected to the high-potential power supply line PSH, through contact holes CH2 provided at a plurality of portions on the planarizing film PL.

The high-potential power supply line PSH is electrically connected to the high-potential power supply (Pvdd), provided on an edge of the non-display area R2, and extends in the row direction X. The high-potential power supply line PSH is formed of metal (for example, Al) in the same layer as the source electrode SE, the drain electrode DE and the like. The high-potential power supply line PSH can be formed of the same material as the source electrode SE, the drain electrode DE and the like, simultaneously with the source electrode SE, the drain electrode DE and the like.

Since the high potential Pvdd can be supplied to the pixels PX by using the conductive layer OE provided on the planarizing film PL, the high-potential power supply line set at the high potential Pvdd may not be provided on the interlayer insulation film II and the like. Since the regions (i.e. wiring lines and electrode-formed regions) on the interlayer insulation film II can be used effectively, a layout area of the pixels PX can be maintained in the high-definition display apparatus.

As shown in FIG. 20, FIG. 17 and FIG. 18, a conductive layer OE (i.e., a second example of the conductive layer OE) is formed substantially similarly to the conductive layer OE (i.e., the first example of the conductive layer OE) shown in FIG. 19. A plurality of conductive layers OE like the conductive layer OE are formed in a shape of a band extending along the column direction Y. The conductive layers OE are opposed to the pixels PX positioned in two adjacent columns. The conductive layers OE are positioned to be spaced apart from each other in the row direction X. The conductive layers OE are positioned separately from regions opposed to the video signal lines VL (FIG. 1). Load on the video signal lines VL and the like can be therefore reduced.

The conductive layers OE comprise a plurality of cut-outs OE1. The cut-outs OE1 are opposed to wiring lines such as the first scanning line Sga and the second scanning line Sgb. Load on the wiring lines opposed to the cut-outs OE1 can be reduced.

In addition, since the conductive layers OE are provided on the planarizing film PL, the layout area of the pixels PX can be maintained in the high-definition display apparatus, too.

Each of the conductive layers OE extends to the non-display area R2 and is opposed to the high-potential power supply line PSH in the non-display area R2. Each conductive layer OE is connected to the high-potential power supply line PSH through the contact holes CH2 provided on the planarizing film PL.

The structure of the conductive layer OE is not limited to the structure of the first example (FIG. 19) and the second example (FIG. 20) of the conductive layer OE, but can be variously modified. For example, a plurality of conductive layers OE may be formed in a shape of a band extending along the row direction X. In addition, the conductive layers OE may be formed in a lattice.

Figure 21:
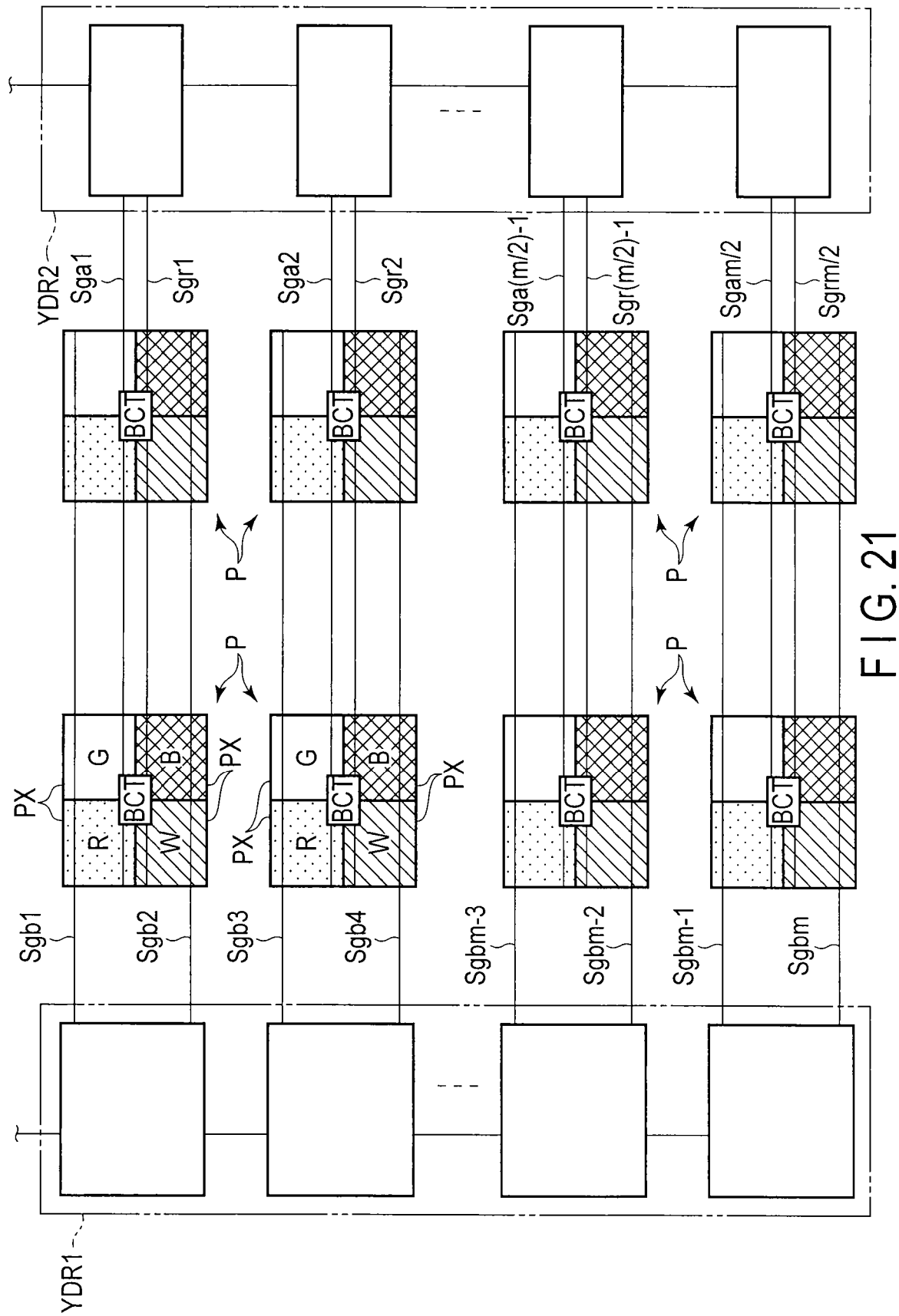
FIG. 21 is a schematic diagram showing a pixel arrangement in the Example 1 according to the third embodiment.

Next, an arrangement of a plurality of pixels PX will be described. A schematic diagram to show the arrangement of the pixels PX according to Example 2 of the present embodiment is the same as FIG. 7. FIG. 21 is a schematic diagram showing the arrangement of the pixels PX in Example 1 according to the present embodiment.

As shown in FIG. 21, the pixels PX are so called RGBW square pixels. The pixels PX include a first pixel, a second pixel adjacent to the first pixel in the column direction Y, a third pixel adjacent to the first pixel in the row direction X, and a fourth pixel adjacent to the second pixel in the row direction X and adjacent to the third pixel in the column direction Y. The first to fourth pixels are a red pix PX, a green pix PX, a blue pixel PX, and an achromatic pixel PX, respectively. A picture element P comprises the first to fourth pixels.

For example, any two of the red, green, blue and achromatic pixels PX are arranged in an even-number row and the remaining two pixels are arranged in an odd-number row. In the Example 2, the red and green pixels PX are arranged in the odd-number row, and the blue and achromatic pixels PX are arranged in the even-number row. The output switch BCT is shared by the first to fourth pixels.

Figure 22:
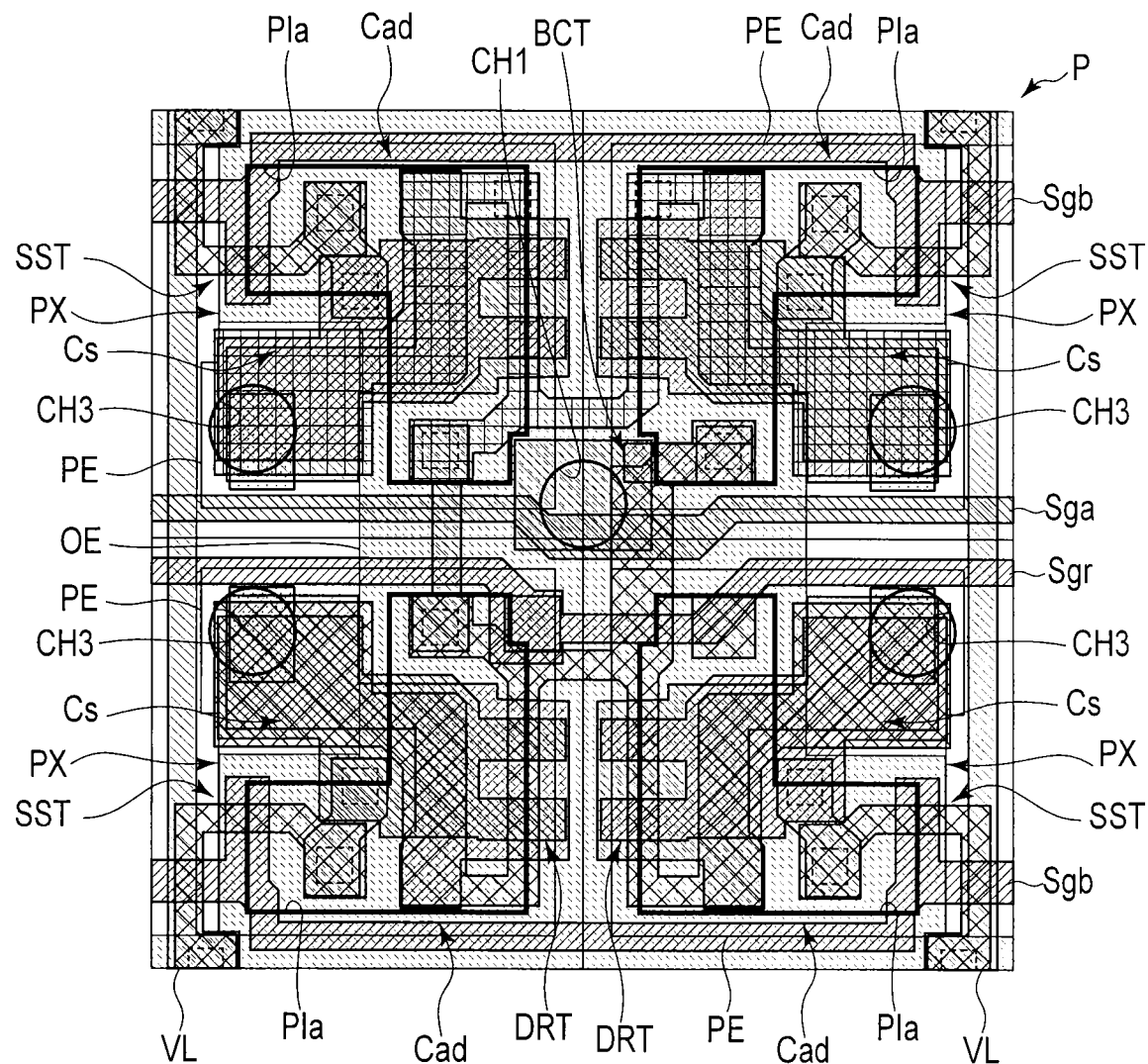
FIG. 22 is a plan view showing a picture element of the Example 1 according to the third embodiment.

FIG. 22 is a plan view showing the pixels PX according to the present embodiment. Structures of the pixels PX in a case where the output switch BCT is shared by four pixels PX (i.e. one picture element P) is illustrated in FIG. 22. RGBW square arrangement pixels are shown as a typical example of the structure.

As shown in FIG. 22, it can be understood that a high-potential power supply line SLa to be described later can be removed. This is because the electric power of high potential Pvdd can be supplied by using the conductive layer OE as described above. The layout area of the pixels PX can be thereby maintained in the high-definition display apparatus as described above.

To arrange the elements in the pixel circuit with a good efficiency, the drive transistors DRT, the pixel switches SST, the holding capacitances Cs, the auxiliary capacitances Cad, and the second scanning lines Sgb are arranged to be substantially symmetrical with respect to a line in the column direction Y and the row direction X, about the output switch BCT, in four pixels PX that share (own) the output switch BCT. In the pixels adjacent in the column direction Y, the contact portion of the pixel switch SST and the video signal line VL is standardized.

In the present embodiment, terms such as the pixels PX and the picture element P are used. The "pixels" can be replaced with "sub-pixels". In this case, the "picture element" is a "pixel".

Figure 23:
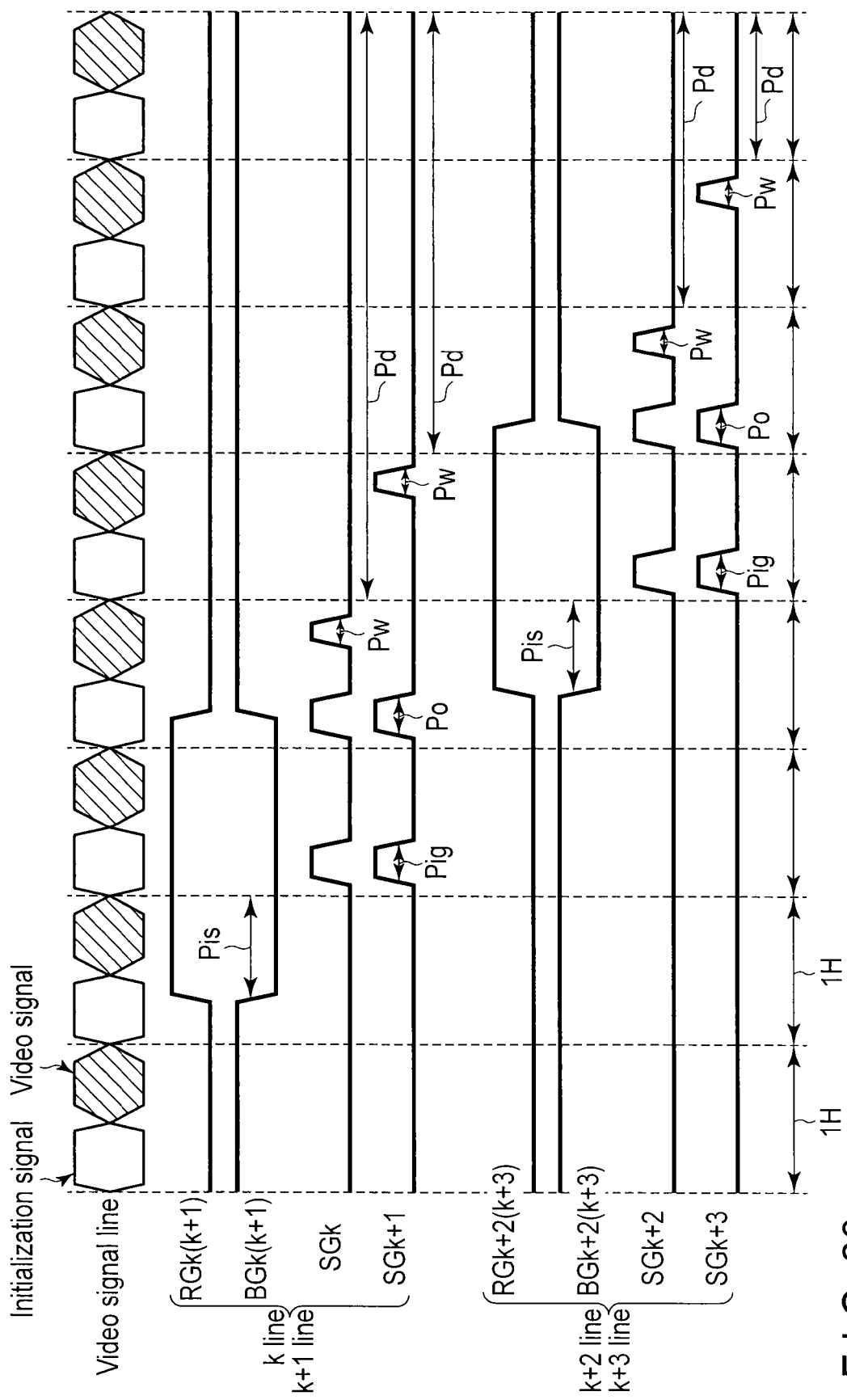
FIG. 23 is a timing chart showing a control signal of a scanning line driving circuit in a case where an offset cancellation is executed once, in the pixel arrangement of the Example 1 according to the third embodiment.
Figure 24:
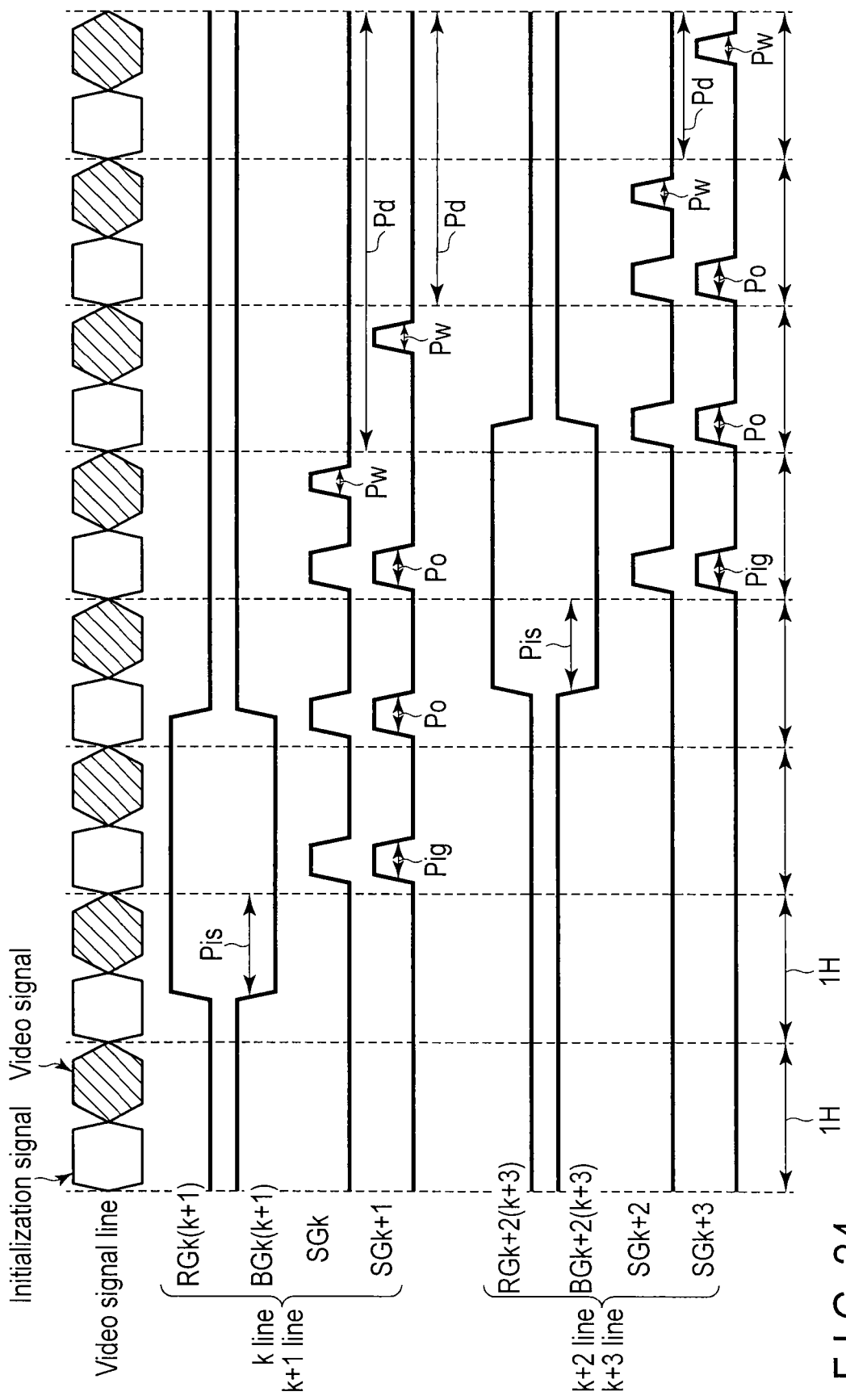
FIG. 24 is a timing chart showing a control signal of a scanning line driving circuit in a case where an offset cancellation is executed twice, in the pixel arrangement of the Example 1 according to the third embodiment.

Next, operations of the display apparatus (i.e. organic EL display apparatus) configured as described above will be explained. FIG. 23 is a timing chart showing a control signal of a scanning line driving circuits YDR1 and YDR2 at display operations. FIG. 24 is a timing chart showing a control signal of a scanning line driving circuits YDR1 and YDR2 at display operations.

FIG. 23 shows a case where an offset cancellation is executed once, in the RGBW square pixel. FIG. 24 shows a case where an offset cancellation is executed at a plurality of times (twice as a typical example in the present embodiment), in the RGBW square pixel. FIG. 8 can be applied as the drawing showing a case where the offset cancellation is executed once, in the longitudinal stripe element, and FIG. 9 can be applied as the drawing showing a case where the offset cancellation is executed at a plurality of times (twice as a typical example in the present embodiment), in the longitudinal stripe element.

For this reason, the display apparatus can be driven with the control signal shown in FIG. 8 or FIG. 9 in the above-described Example 2. In the above-described Example 1, the display apparatus can be driven with the control signal shown in FIG. 23 or FIG. 24.

The scanning line driving circuits YDR1 and TDR2 generate, for example, pulses of a width (Tw-Starta) of one horizontal scanning period corresponding to respective horizontal scanning periods from start signals (STV1 to STV3) and clocks (CKV1 to CKV3), and output the pulses as control signals BG(1–m/2), SG(1–m) and RG(1–m/2). The "one" horizontal scanning period is represented by 1H.

The operations of the pixel circuit are classified into a source initialization operation executed in a source initialization period Pis, a gate initialization operation executed in a gate initialization period Pig, an offset cancellation (OC) operation executed in an offset cancellation period Po, an video signal writing operation executed in an video signal writing period Pw, and a display operation (i.e., an emission operation) executed in a display period (i.e., an emission period).

As shown in FIG. 8, FIG. 9, FIG. 23 and FIG. 24, and FIG. 1 and FIG. 16, first, a driver 10 executes the source initialization operation. In the source initialization operation, the control signal SG is set to a level (off potential: low level) at which the pixel switch SST is turned off, the control signal BG is set to a level (off potential: low level) at which the output switch BCT is turned off, and the control signal RG is set to a level (on potential: high level) at which the reset switch RST is turned on by the scanning line driving circuits YDR1 and TDR2.

Each of the output switch BCT and the pixel switch SST is turned off (non-conductive state), the reset switch RST is turned on (conductive state), and the source initialization operation is started. By turning on the reset switch RST, the source electrode and the drain electrode of the drive transistor DRT are reset to the same electric potential as the electric potential (reset potential Vrst) of the reset power supply and the source initialization operation is completed. The reset power supply (reset potential Vrst) is set to, for example, −2V.

Next, the driver 10 executes the gate initialization operation. In the gate initialization operation, the control signal SG is set to a level (on potential: high level) at which the pixel switch SST is turned on, the control signal BG is set to the level at which the output switch BCT is turned off, and the control signal RG is set to the level at which the reset switch RST is turned on by the scanning line driving circuits YDR1 and TDR2. The output switch BCT is turned off, each of the pixel switch SST and the reset switch RST is turned on, and the gate initialization operation is started.

In the gate initialization period Pig, the initialization signal Vini (initialization voltage) output from the video signal line VL is applied to the gate electrode of the drive transistor DRT via the pixel switch SST. As a result, the electric potential of the gate electrode of the drive transistor DRT is reset to the electric potential corresponding to the initialization signal Vini, and the information in the previous frame is initialized. The voltage level of the initialization signal Vini is set to, for example, 2V.

Next, the driver 10 executes the offset cancellation operation. The control signal SG is set to the on potential, the control signal BG is set to the on potential (high level), and the control signal RG is set to the off potential (low level). As a result, the reset switch RST is turned off, each of the pixel switch SST and the output switch BCT is turned on, and the offset cancellation operation of the threshold value is started.

In the offset cancellation period Po, the initialization signal Vini is provided to the gate electrode of the drive transistor DRT via the video signal line VL and the pixel switch SST, and the electric potential of the gate electrode of the drive transistor DRT is fixed.

The output switch BCT is turned on and the current flows from the high-potential power supply line PSH (conductive layer OE) to the drive transistor DRT. The electric potential of the source electrode of the drive transistor DRT is gradually shifted to the high-potential side while setting the electric potential (reset potential Vrst) written in the source initialization period Pis to the initial value, gradually decreasing the current flowing between the drain electrode and the source electrode of the drive transistor DRT, and absorbing/compensating for the TFT characteristic variation of the drive transistor DRT. According to the present embodiment, the offset cancellation period Po is set to a period of, for example, approximately 1 μsec.

At the end of the offset cancellation period Po, the electric potential of the source electrode of the drive transistor DRT is Vini−Vth. Vini is a voltage value of the initialization signal Vini, and Vth is a threshold voltage of the drive transistor DRT. As a result, the voltage between the gate electrode and the source electrode of the drive transistor DRT reaches a cancellation point (Vgs=Vth), and the potential difference corresponding to the cancellation point is stored (held) in the holding capacitance Cs. The offset cancellation period Po can be provided at a plurality of times as needed, similarly to the examples shown in FIG. 9 and FIG. 24.

Then, in the video signal writing period Pw, the control signal SG is set to the level at which the pixel switch SST is turned on, the control signal BG is set to the level at which the output signal BCT is turned on, and the control signal RG is set to the level at which the reset switch RST is turned off. As a result, each of the pixel switch SST and the output switch BCT is turned on, the reset switch RST is turned off, and the video signal writing operation is started.

In the video signal writing period Pw, the video signal Vsig is written from the video signal line VL to the gate electrode of the drive transistor DRT via the pixel switch SST. The current flows from the high-potential power supply line PSH to the low-potential power supply line PSL via the output switch BCT, the drive transistor DRT and the capacity unit (parasitic capacitance) Cel of the diode LED. The electric potential of the gate electrode of the drive transistor DRT is Vsig(R, G, B, W) and the electric potential of the source electrode of the drive transistor DRT is Vini−Vth+Cs(Vsig−Vini)/(Cs+Cel+Cad), immediately after the pixel switch SST is turned on.

Vsig represents a voltage value of the video signal Vsig, Cs represents a capacity of the holding capacitance Cs, Cel represents a capacity of the capacity unit Cel, and Cad represents a capacity of the auxiliary capacitance.

After that, the current flows to the low-potential power supply line PSL via the capacity unit Cel of the diode OLED. At the end of the video signal writing period Pw, the electric potential of the gate electrode of the drive transistor DRT is Vsig(R, G, B, W) and the electric potential of the source electrode of the drive transistor DRT is Vini−Vth+ΔV1+Cs (Vsig−Vini)/(Cs+Cel+Cad). The relationship between the current Idrt flowing to the drive transistor DRT and the capacity Cs+Cel+Cad is represented by the above-described Expression 1. The variation of the mobility of the drive transistor DRT is thereby corrected.

Finally, in the display period Pd, the control signal SG is set to the level at which the pixel switch SST is turned off, the control signal BG is set to the level at which the output switch BCT is turned on, and the control signal RG is set to the level at which the reset switch RST is turned off. The output switch BCT is turned on, each of the pixel switch SST and the reset switch RST is turned off, and the display operation is started.

The drive transistor DRT outputs a drive current Ie1 in an amount corresponding to the gate control voltage written in the holding capacitance Cs. The drive current Ie1 is supplied to the diode OLED. As a result, the diode OLED emits light in brightness according to the drive current Ie1 and executes the display operation. The diode OLED maintains the light-emitting state until the control signal BG is set to the off potential again after one frame period.

By repeating the above-described source initialization operation, the gate initialization operation, the offset cancellation operation, the video signal writing operation and the display operation in order in each of the pixels PX, a desirable image is displayed.

According to the display apparatus and the method for driving the display apparatus of the third embodiment configured as described above, the display apparatus comprises the first insulation film (planarizing film PL), the third conductive layer (conductive layer OE), the second insulation film (passivation film PS), and the display element (diode OLED) comprising the fourth conductive layer (pixel electrode PE).

The planarizing film PL is provided above the semiconductor layer (semiconductor layer SC), the first conductive layer (gate electrode G), and the second conductive layer (source electrode SE, drain electrode DE and video signal line VL) formed in layers different from each other. The conductive layer OE is connected to the high-potential power supply line PSH (high-potential power supply) provided on the planarizing film PL.

Since the pixels PX can be provided with the high-potential power supply by using the conductive layer OE, the high-potential power supply line SLa to be described later, which serves as the second conductive layer, can be removed. The layout area of the pixels PX can be thereby maintained in the high-definition display apparatus as described above.

The conductive layer OE and the pixel electrode PE are opposed to each other and can form the auxiliary capacitance Cad (capacitance unit). Since the auxiliary capacitance Cad can be formed without using the semiconductor layer, the auxiliary capacitance Cad can be formed in the region opposed to the element which uses the semiconductor layer. Since the auxiliary capacitance Cad can be arranged with a good efficiency as compared to the case of forming the auxiliary capacitance Cad by using the semiconductor layer, utilization efficiency of space can be improved, which can contribute to the high definition in the pixels PX.

The display apparatus comprises a plurality of video signal lines VL, a plurality of scanning lines (first scanning line Sga, second scanning line Sgb and third scanning line Sgc), a plurality of reset lines Sgr, and a plurality of pixels PX. Each of the pixels PX comprises the drive transistor DRT, the diode OLED, the pixel switch SST, the output switch BCT, the holding capacitance Cs, and the auxiliary capacitance Cad.

The diode OLED is connected between the high-potential power supply line PSH and the low-potential power supply line PSL. The drive transistor DRT comprises the source electrode connected to the diode OLED, the drain electrode connected to the reset line Sgr, and the gate electrode. The output switch BCT is connected between the conductive layer OE and the drain electrode of the drive transistor DRT to change a state of the part between the conductive layer OE and the drain electrode of the drive transistor DRT to the conductive state or the non-conductive state.

The pixel switch SST is connected between the video signal line VL and the gate electrode G of the drive transistor DRT to discriminate whether the video signal Vsig provided via the video signal line VL is input to the side of the gate electrode G of the drive transistor DRT. The holding capacitance Cs is connected between the source electrode SE and the gate electrode G of the drive transistor DRT. The drive transistor DRT, the output switch BCT, the pixel switch SST, and the holding capacitance Cs are formed by using a plurality of semiconductor layers.

The pixels PX adjacent in the column direction Y, of a plurality of pixels PX, share the output switch BCT. In the present embodiment, four pixels PX share one output switch BCT.

As compared with providing one output switch BCT in each of the pixels PX, the number of the output switches BCT can be reduced to a quarter, the number of the first scanning lines Sga, the third scanning lines Sgc and reset lines Sgr can be reduced to a half, and the number of the reset switches RST can be reduced to a half. Therefore, the display apparatus can plan slim border, the display apparatus can be improved to be in high definition, or a high-definition display apparatus can be obtained.

Besides the above, the same advantages as the above-described first embodiment can be obtained from the display apparatus and the method of driving the display apparatus according to the present embodiment.

Based on the above descriptions, the high-definition display apparatus and the method of driving the display apparatus can be obtained.

Next, a display apparatus and a method of driving the display apparatus according to a fourth embodiment will be described. In the present embodiment, the same functional portions as those of the above-described third embodiment are denoted by the same reference symbols, and their detailed descriptions are omitted.

Figure 25:
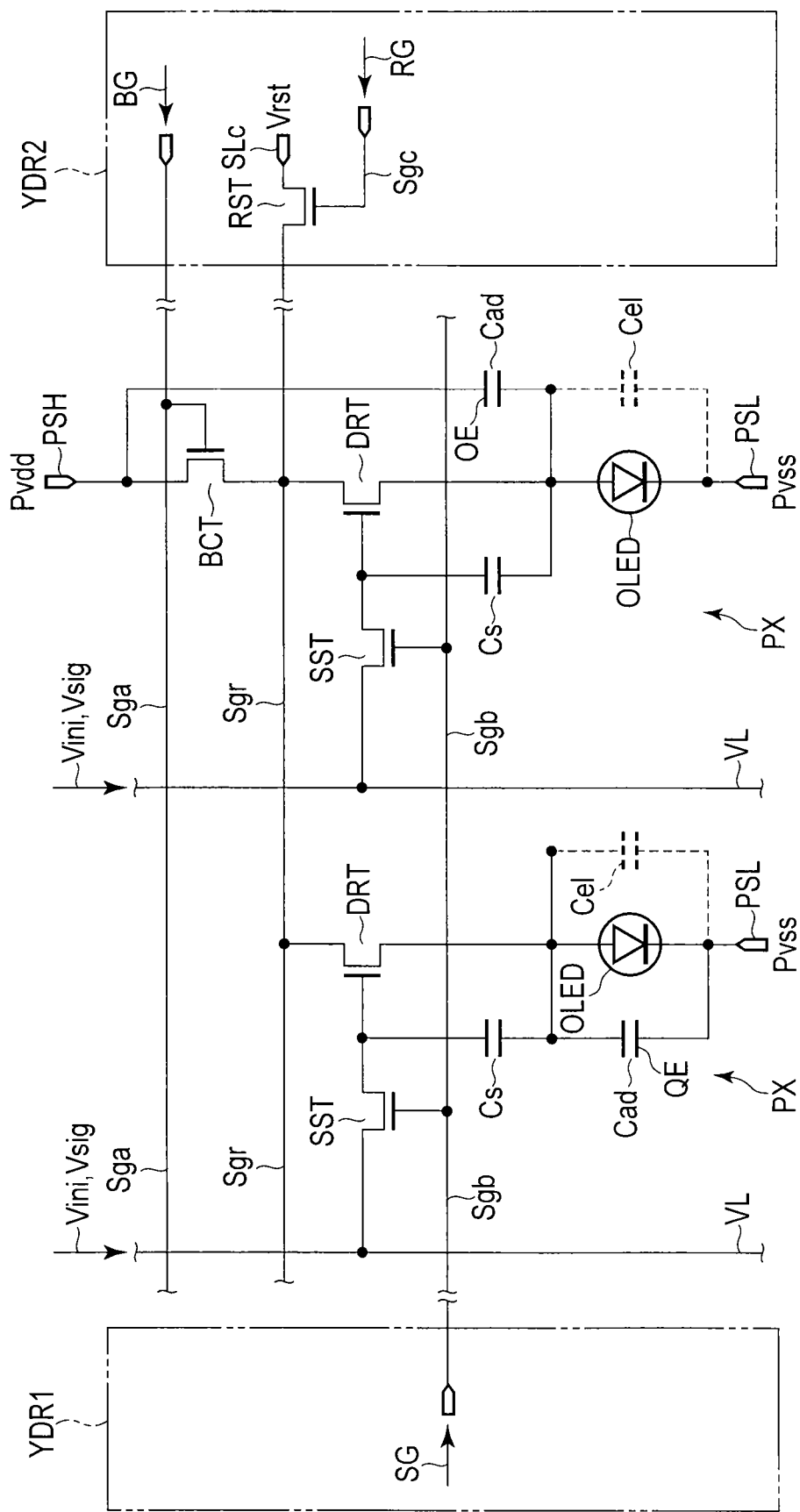
FIG. 25 is an equivalent circuit diagram of a pixel in a display apparatus according to a fourth embodiment.
Figure 26:
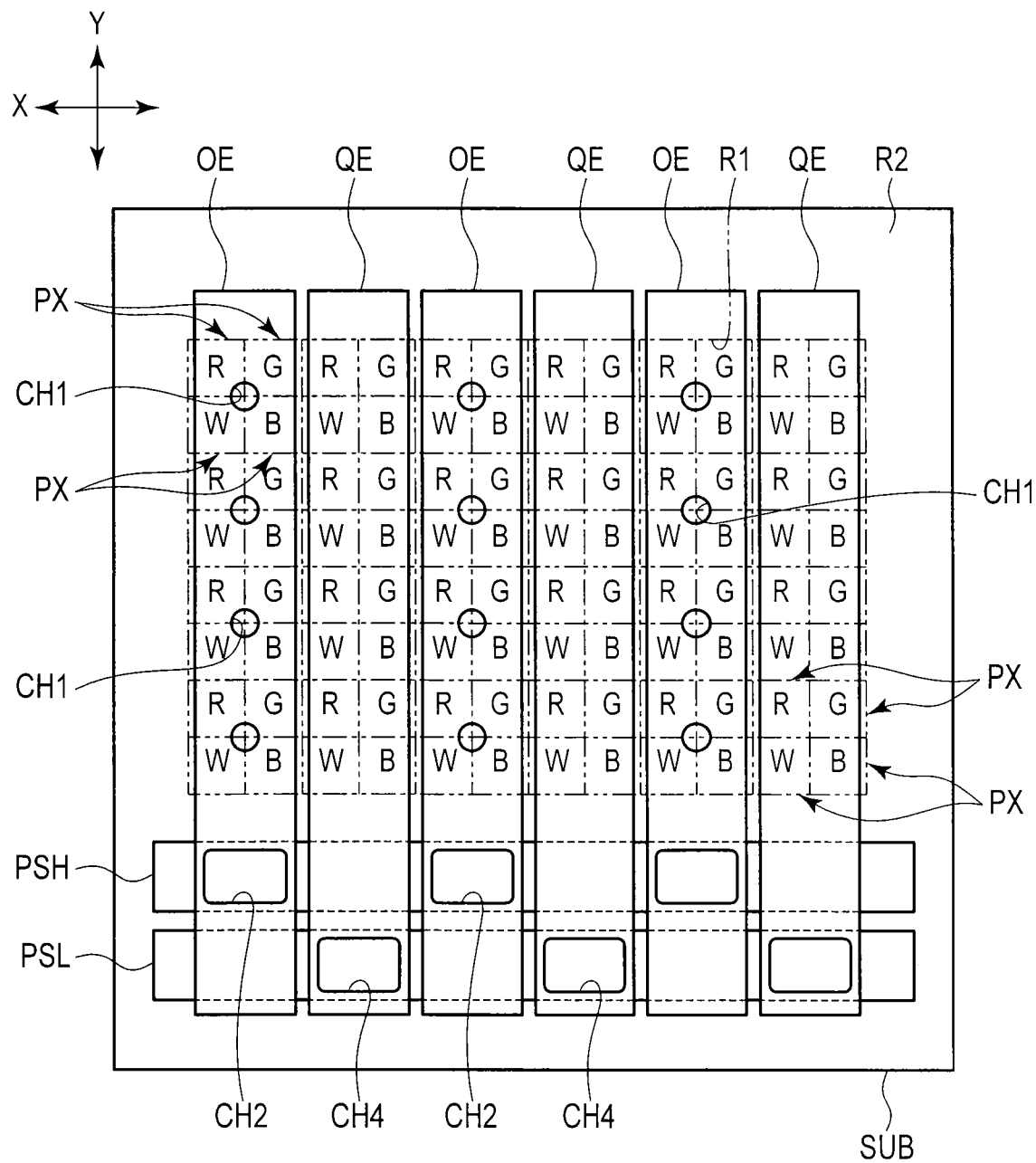
FIG. 26 is a plan view of a display apparatus of Example 1 according to the fourth embodiment, showing a schematic overall structure of conductive layers.

FIG. 25 is an equivalent circuit diagram of a pixel PX in the display apparatus according to the fourth embodiment. FIG. 26 is a plan view of the display apparatus of Example 1 according to the fourth embodiment, showing schematic overall structures of conductive layers OE and QE.

As shown in FIG. 25 and FIG. 26, a third conductive layer provided on a planarizing film PL comprises not only the conductive layer OE, but also the conductive layer QE. In the present embodiment, the conductive layer QE is formed of metal (for example, Al: aluminum). The conductive layer QE can be formed of the same material of the conductive layer OE and the like, simultaneously with the conductive layer OE and the like.

A plurality of conductive layers QE like the conductive layer QE are formed in a shape of a band extending along the column direction Y. The conductive layers QE are opposed to pixels PX positioned in two adjacent columns. The conductive layers OE and the conductive layers QE are alternately aligned in a row direction X and spaced apart from each other. The conductive layers QE are positioned outside regions opposed to the video signal lines VL (FIG. 1). Load on the video signal lines VL and the like can be therefore reduced. The conductive layers OE and the conductive layers QE may comprise the cut-outs as described in the third embodiment.

In order to be electrically insulated from a contact portion between a source electrode SE and a pixel electrode PE, the conductive layer QE is spaced apart from the contact portion.

Since the conductive layer QE is provided on the planarizing film PL, a layout area of the pixels PX can be maintained in the high-definition display apparatus, too.

Each conductive layer QE extends to a non-display area R2 and is opposed to a low-potential power supply line PSL, in the non-display area R2. The conductive layer QE is connected to the low-potential power supply line PSL, through a contact hole CH4 provided in the planarizing film PL.

The low-potential power supply line PSL is electrically connected to a low-potential power supply (Pvss), provided on an edge of the non-display area R2, and extends in the row direction X along with a high-potential power supply line PSH. The low-potential power supply line PSL is formed of metal (for example, Al) in the same layer as the high-potential power supply line PSH, the source electrode SE, the drain electrode DE and the like. The low-potential power supply line PSL can be formed of the same material as the high-potential power supply line PSH and the like, simultaneously with the high-potential power supply line PSH and the like.

In the present embodiment, too, the high-potential power supply line and the like as set at the high potential Pvdd may not be provided on the interlayer insulation film II since the high potential Pvdd can be supplied to the pixels PX by using the conductive layer OE. Since the regions (i.e. wiring lines and electrode-formed regions) on the interlayer insulation film II can be used effectively, a layout area of the pixels PX can be maintained in the high-definition display apparatus, too.

A plurality of pixels PX adjacent in the column direction Y share an output switch BCT. In the present embodiment, eight pixels PX adjacent in the row direction X and the column direction Y (i.e., in two rows×four columns) share one output switch BCT. One output switch BCT therefore provides the power supply of the high potential Pvdd to the eight pixels PX.

In the pixel PX opposed to the conductive layer QE, the conductive layer QE and a pixel electrode PE are opposed to each other and an auxiliary capacitance Cad is thereby formed. In the pixel PX opposed to the conductive layer OE, the conductive layer OE and a pixel electrode PE are opposed to each other and an auxiliary capacitance Cad is thereby formed. The electric potential of the conductive layer OE can be fixed to the low potential Pvss.

In this case, too, the auxiliary capacitance Cad can be formed without using the semiconductor layer. The auxiliary capacitance Cad can be formed in the region opposed to the element which uses the semiconductor layer. In other words, since the auxiliary capacitance Cad can be arranged with a good efficiency, utilization efficiency of space can be improved.

FIG. 27 is a plan view of the display apparatus of Example 2 according to the fourth embodiment, showing a schematic overall structure of the conductive layers OE and QE.

As shown in FIG. 25 and FIG. 27, the conductive layers OE and QE are formed substantially similarly to the conductive layers OE and QE shown in FIG. 26. In Example 2, the ratio of the conductive layers OE and the conductive layers QE is 1 to 2. Since the conductive layers QE are also provided on the planarizing film PL, the layout area of the pixels PX can be maintained in the high-definition display apparatus, too.

A plurality of pixels PX adjacent in the column direction Y share the output switch BCT. In the present embodiment, twelve pixels PX adjacent in the row direction X and the column direction Y (in two rows x six columns) share one output switch BCT. One output switch BCT therefore provides the power supply of the high potential Pvdd to the twelve pixels PX.

According to the display apparatus and the method for driving the display apparatus of the fourth embodiment configured as described above, the display apparatus comprises a first insulation film (planarizing film PL), a third conductive layers (conductive layers OE and QE), a second insulation film (passivation film PS), and a display element (diode OLED) comprising a fourth conductive layer (pixel electrode PE). The above-described method of driving the display apparatus according to the third embodiment can be employed as a method of driving the display apparatus according to the present embodiment. The same advantages as those of the third embodiment can be therefore obtained.

In the auxiliary capacitance Cad (capacitance unit), the conductive layer OE and the pixel electrode PE are formed to be opposed to each other or the conductive layer QE and the pixel electrode PE are formed to be opposed to each other. Since the auxiliary capacitance Cad can be formed without using the semiconductor layers, the auxiliary capacitance Cad can be arranged with a good efficiency.

In addition, since not only the conductive layer OE, but also the conductive layer QE can be arranged on the planarizing film PL, the layout of the third conductive layer can be modified variously.

Furthermore, the conductive layer QE in the display area R1 is connected to the low-potential power supply line PSL and set to the low potential Pvss. A luminance gradient can be therefore reduced. The reduction of the luminance gradient will be described in a fifth embodiment.

Based on the above descriptions, the high-definition display apparatus and the method of driving the display apparatus can be obtained.

Next, a display apparatus and a method of driving the display apparatus according to a fifth embodiment will be hereinafter described. In the present embodiment, the same functional portions as those of the above-described third embodiment are denoted by the same reference symbols, and their detailed descriptions are omitted.

Figure 29:
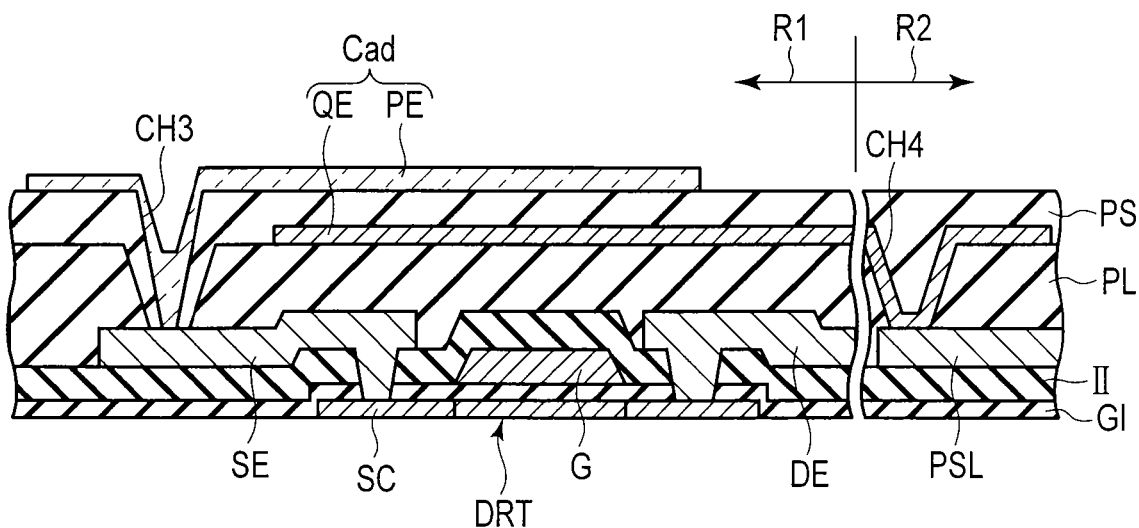
FIG. 29 is a partially sectional view of the display apparatus according to the fifth embodiment, showing a drive transistor, a power supply line, a conductive layer and a pixel electrode.

FIG. 28 is an equivalent circuit diagram of a pixel PX in the display apparatus according to the present embodiment. FIG. 29 is a partially sectional view of the display apparatus according to the present embodiment, showing a drive transistor DRT, a low-potential power supply line PSL, an auxiliary capacitance Cad.

As shown in FIG. 28 and FIG. 29, a third conductive layer comprises a conductive layer QE. The conductive layers QE and pixel electrode PE are opposed to each other to form the auxiliary capacitance Cad (i.e. capacitance unit). An electric potential of the conductive layer QE is fixed to a low potential Pvss. The auxiliary capacitance Cad can be formed without using the semiconductor layer. Since the auxiliary capacitance Cad can be arranged with a good efficiency, use efficiency of space can be increased. In addition, since the display apparatus according to the present embodiment is an upper-surface illumination type display apparatus, the conductive layer OE can be formed of metal (for example, Al).

Figure 30:
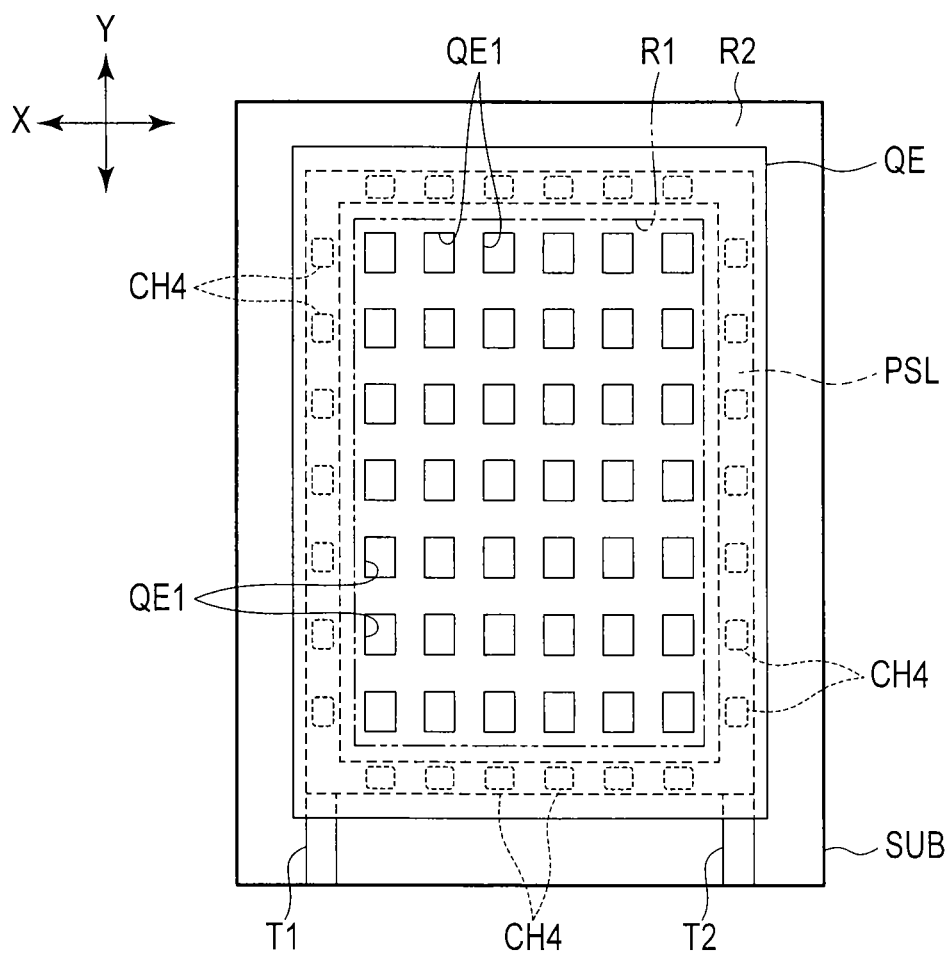
FIG. 30 is a plan view of the display apparatus of Example 1 according to the fifth embodiment, showing a schematic overall structure of the conductive layer and the power supply line.
Figure 31:
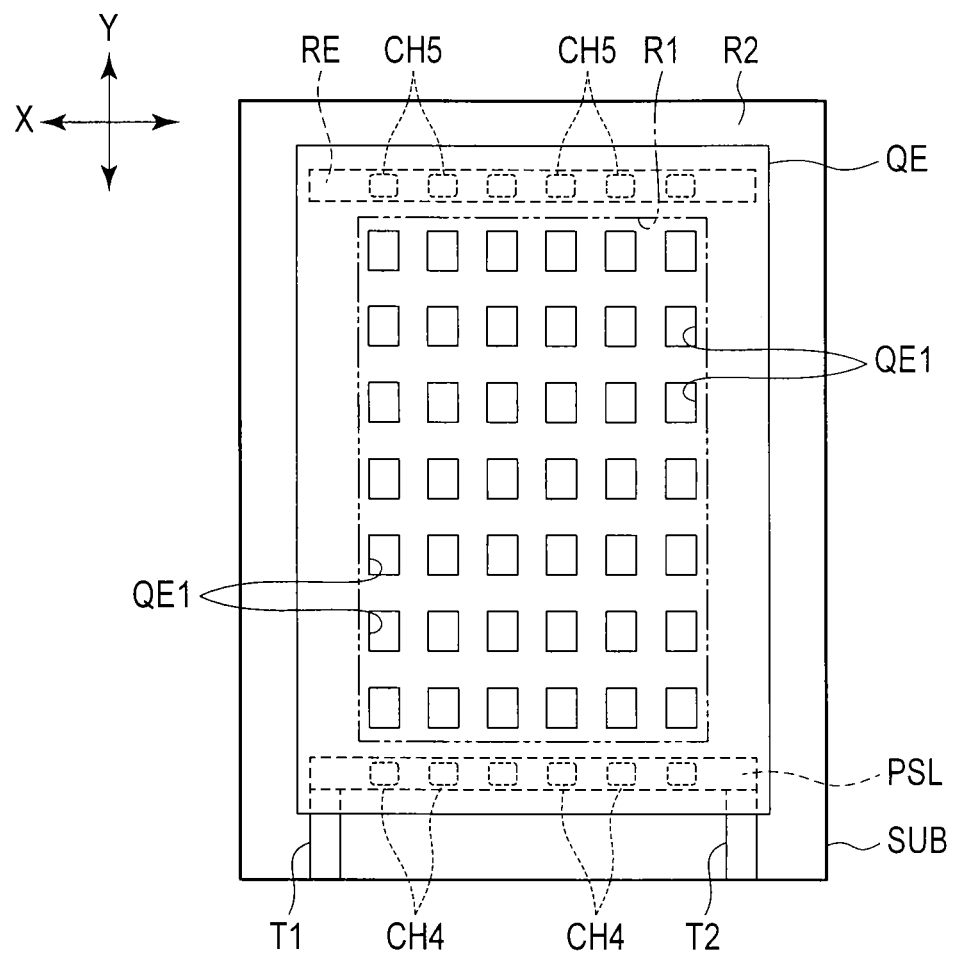
FIG. 31 is a plan view of the display apparatus of Example 2 according to the fifth embodiment, showing a schematic overall structure of the conductive layer and the power supply line.

Next, structures of the conductive layer QE and the low-potential power supply line PSL will be described in detail with reference to FIG. 28 to FIG. 32. FIG. 30 is a plan view of the display apparatus of Example 1 according to the present embodiment, showing a schematic overall structure of the conductive layer QE and the low-potential power supply line PSL. FIG. 31 is a plan view of the display apparatus of Example 2 according to the present embodiment, showing a schematic overall structure of the conductive layer QE and the low-potential power supply line PSL. FIG. 32 is a plan view of the display apparatus of Example 3 according to the fifth embodiment, showing a schematic overall structure of the conductive layer QE and the low-potential power supply line PSL.

As shown in FIG. 30, FIG. 28, and FIG. 29, the low-potential power supply line PSL is provided in a non-display area R2 shaped in a rectangular frame. The low-potential power supply line PSL is formed integrally as one body shaped in a rectangular frame. Terminals T1 and T2 are connected to the low-potential power supply line PSL. The low-potential power supply line PSL, and the terminals T1 and T2 are formed integrally as one body. The low-potential power supply line PSL, and the terminals T1 and T2 are formed of metal (for example, Al), in the same layer as a source electrode SE, a drain electrode DE and the like. The low-potential power supply line PSL, and the terminals T1 and T2 can be formed of the same material as the source electrode SE, the drain electrode DE and the like, simultaneously with the source electrode SE, the drain electrode DE and the like. The low-potential power supply line PSL is connected to a low-potential power supply (Pvss) via the terminals T1 and T2, and fixed to a constant potential (low potential Pvss).

The conductive layer QE is provided in a display area R1. The conductive layer QE comprises a plurality of openings QE1. The openings QE1 may be optionally formed in the conductive layer QE. By the openings QE1, load on wiring lines (for example, first scanning line Sga, second scanning line Sgb and video signal line VL) opposed to the openings can be reduced.

In order to be electrically insulated from a contact portion between the source electrode SE and the pixel electrode PE, the conductive layer QE is spaced apart from the contact portion. For example, in regions where the openings QE1 are formed, insulation between the conductive layer QE and the contact portion can be maintained by using these regions.

The conductive layer QE is provided to extend to a non-display area R2. The conductive layer QE is opposed to the low-potential power supply line PSL, in the non-display area R2. The conductive layer QE is connected to the low-potential power supply line PSL, through contact holes CH4 provided at a plurality of portions in the planarizing film PL. The contact holes CH4 are provided on each of edges of the non-display area R2. In this case, a plurality of contact holes CH4 are provided with substantially equal intervals on each of edges of the non-display area R2.

As shown in FIG. 31, FIG. 28 and FIG. 29, the low-potential power supply line PSL is provided on an edge of the non-display area R2. The low-potential power supply line PSL is formed in a shape of a band extending along the row direction X. The terminals T1 and T2 are connected to the low-potential power supply line PSL. The low-potential power supply line PSL, and the terminals T1 and T2 are formed integrally as one body. The low-potential power supply line PSL and the like are formed of metal (for example, Al). The low-potential power supply line PSL is fixed to a constant potential (low potential Pvss).

A second conductive layer comprises an auxiliary electrode RE besides the low-potential power supply line PSL and the like. The auxiliary electrode RE is provided in the non-display area R2 of side opposite to the low-potential power supply line PSL in view of a display area R1. The auxiliary electrode RE is formed in a shape of a band extending along the row direction X. The auxiliary electrode RE is also formed of metal (for example, Al).

The conductive layer QE is provided in the display area R1. The conductive layer QE comprises a plurality of openings QE1. In order to be electrically insulated from a contact portion between the source electrode SE and the pixel electrode PE, the conductive layer QE is spaced apart from the contact portion.

The conductive layer QE is provided to extend to the non-display area R2. In the non-display area R2, the conductive layer QE is opposed to the low-potential power supply line PSL on one hand, and to the auxiliary electrode RE on the other hand. The conductive layer QE is connected to the low-potential power supply line PSL, through the contact holes CH4 provided at a plurality of portions in the planarizing film PL. The conductive layer QE is connected to the auxiliary electrode RE, through contact holes CH5 provided at a plurality of portions in the planarizing film PL.

If a side where the terminals T1 and T2 (outer lead bonding pads) are provided is assumed to be a lower side, the low-potential power supply line PSL is positioned at a lower side of the non-display area R2, and the auxiliary electrode RE is positioned at an upper side of the non-display area R2.

As shown in FIG. 32, FIG. 28 and FIG. 29, a low-potential power supply line PSL1 (PSL) serving as a first low-potential power supply line is provided on an edge of the non-display area R2. The low-potential power supply line PSL1 is formed in a shape of a band extending along the column direction Y. The terminal T1 is connected to the low-potential power supply line PSL1. The low-potential power supply line PSL1 and the terminal T1 are formed integrally as one body.

A low-potential power supply line PSL2 (PSL) serving as a second low-potential power supply line is provided on the other edge of the non-display area R2. The low-potential power supply line PSL2 is positioned in the non-display area R2 of side opposite to the low-potential power supply line PSL1 in view of the display area R1. The low-potential power supply line PSL2 is formed in a shape of a band extending along the column direction Y. The terminal T2 is connected to the low-potential power supply line PSL2. The low-potential power supply line PSL2 and the terminal T2 are formed integrally as one body. The low-potential power supply lines PSL1 and the low-potential power supply lines PSL2 are formed of metal (for example, Al). The low-potential power supply line PSL1 and the low-potential power supply lines PSL2 are fixed to the constant potential (low potential Pvss).

The conductive layer QE is provided in the display area R1. The conductive layer QE comprises a plurality of openings QE1. In order to be electrically insulated from a contact portion between the source electrode SE and the pixel electrode PE, the conductive layer QE is spaced apart from the contact portion.

The conductive layer QE is provided to extend to the non-display area R2. In the non-display area R2, the conductive layer QE is opposed to the low-potential power supply line PSL1 on one hand, and to the low-potential power supply line PSL2 on the other hand. The conductive layer QE is connected to the low-potential power supply lines PSL1 and PSL2, through the contact holes CH4 provided at a plurality of portions in the planarizing film PL.

The conductive layer QE of each of the Examples 1 to 3 is considered to be formed in a lattice (mesh). However, the shape of the conductive layer QE is not limited to the above-described example, but can be variously changed. For example, the conductive layer QE may be provided in stripes extending in the row direction x or the column direction Y.

Figure 33:
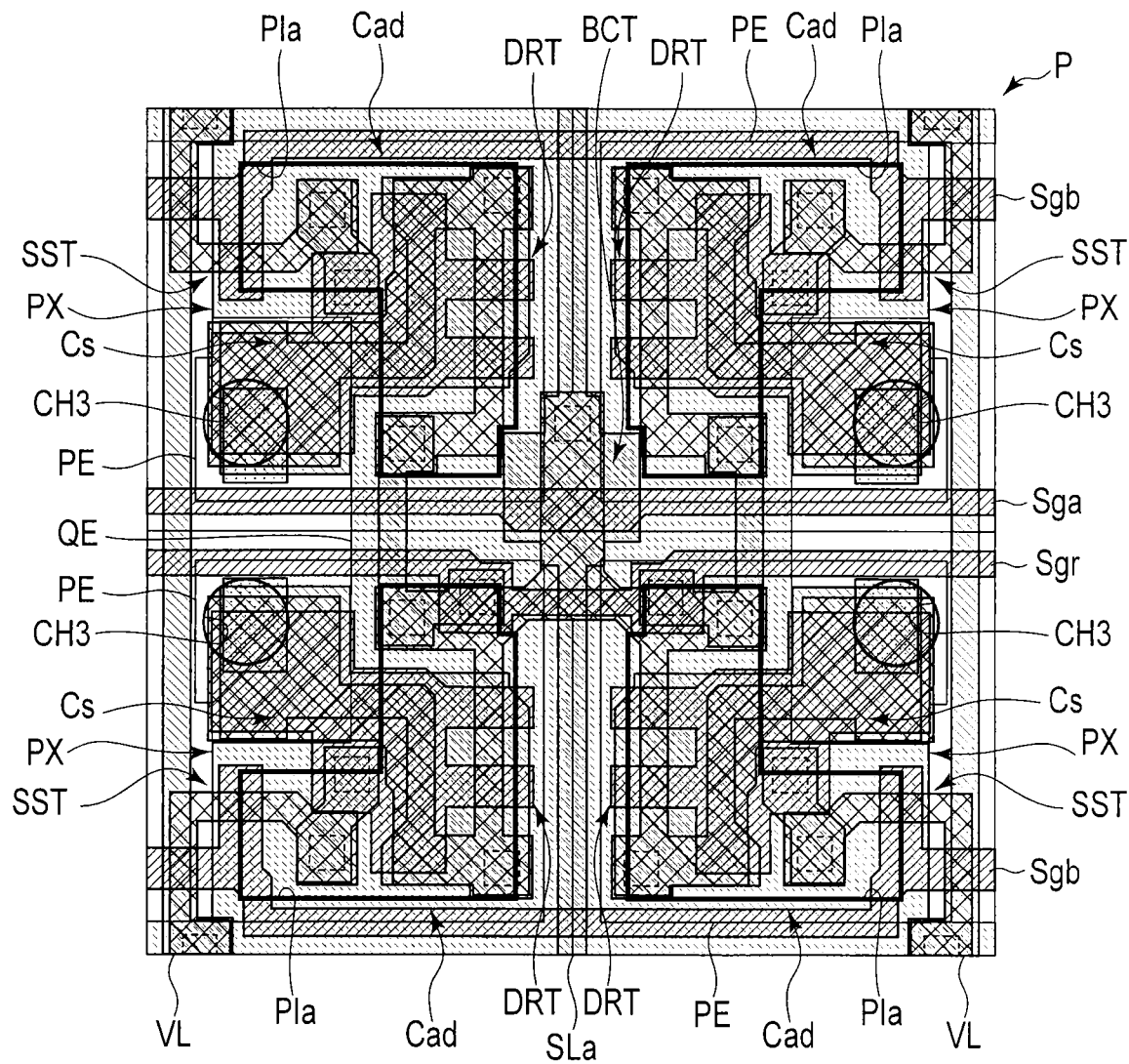
FIG. 33 is a plan view showing a picture element according to the fifth embodiment.

FIG. 33 is a plan view showing a pixel PX according to the present embodiment. FIG. 33 shows a structure of the pixel PX in a case where an output switch BCT is shared by four pixels PX (one picture element P). An RGBW square arrangement pixel is described as a typical example of the pixel.

As shown in FIG. 33, the second conductive layer comprises a high-potential power supply line SLa. In the display area R1, the high-potential power supply line SLa is formed to extend in the column direction Y. The high-potential power supply line SLa is formed to extend up to the non-display area R2 and connected to the high-potential power supply line PSH. A high-potential power supply is provided to a drain electrode AE of the output switch BCT via the high-potential power supply line SLa. This is because the third conductive layer does not comprise the conductive layer OE set at the high potential Pvdd.

To arrange the elements in the pixel circuit with a good efficiency, drive transistors DRT, pixel switches SST, holding capacitances Cs, auxiliary capacitances Cad and second scanning lines Sgb are arranged to be substantially symmetrical with respect to a line in the column direction Y and the row direction X, about the output switch BCT, in four pixels PX that share (own) the output switch BCT.

According to the display apparatus and the method for driving the display apparatus of the fifth embodiment configured as described above, the display apparatus comprises a first insulation film (planarizing film PL), a third conductive layer (conductive layer QE), a second insulation film (passivation film PS), and a display element (diode OLED) comprising a fourth conductive layer (pixel electrode PE). The above-described method of driving the display apparatus according to the third embodiment can be employed as a method of driving the display apparatus according to the present embodiment.

In the auxiliary capacitance Cad (capacitance unit), the conductive layer OE and the pixel electrode PE are formed to be opposed to each other. Since the auxiliary capacitance Cad can be formed without using the semiconductor layers, the auxiliary capacitance Cad can be arranged with a good efficiency. The same advantages as those of the third embodiment can be therefore obtained.

A counter electrode CE serving as a fifth conductive layer is an electrode of a light-emitting side, which is formed of a transparent conductive material such as ITO or IZO. Incidentally, since the material has a higher electric resistance than a metal material, luminance distribution may occur due to potential drop at the counter electrode CE. In the present embodiment, however, not only the low-potential power supply line PSL, but also the conductive layer QE in the display area R1 connected to the low-potential power supply line PSL and the auxiliary electrode RE in the non-display area R2 are set at the low potential Pvss.

A luminance gradient which occurs when the low-potential power supply line PSL in the non-display area R2 alone is set at the low potential Pvss can be reduced. In addition, since the conductive layer QE is provided over the display area R1, the luminance gradient can be more reduced in the present embodiment than in the fourth embodiment.

Based on the above descriptions, the high-definition display apparatus and the method of driving the display apparatus can be obtained.

Next, a display apparatus and a method of driving the display apparatus according to a sixth embodiment will be described. In the present embodiment, the same functional portions as those of the above-described fifth embodiment are denoted by the same reference symbols, and their detailed descriptions are omitted. FIG. 34 is a plan view of the display apparatus according to the sixth embodiment, showing a schematic overall structure of a conductive layer QE, a counter electrode CE, and a low-potential power supply line PSL.

As shown in FIG. 34, a low-potential power supply line PSL1 and a low-potential power supply line PSL2 are provided on an edge of a non-display area R2. The low-potential power supply line PSL1 is formed in a shape of a band extending along the column direction Y, and is connected to a terminal T1. The low-potential power supply line PSL1 and the terminal T1 are formed integrally as one body. The low-potential power supply line PSL2 is formed in a shape of a band extending along the column direction Y, and is connected to a terminal T2. The low-potential power supply line PSL2 and the terminal T2 are formed integrally as one body.

On an edge of the non-display area R2, the conductive layer QE is opposed to the low-potential power supply line PSL1 and the low-potential power supply line PSL2. The conductive layer QE is connected to the low-potential power supply lines PSL1 and PSL2, through contact holes CH4 provided at a plurality of portions in the planarizing film PL.

A counter electrode CE serving as a fifth conductive layer is opposed to the conductive layer QE in a display area R1 and the non-display area R2. The counter electrode CE is connected to the conductive layer QE at two portions in the non-display area R2 which sandwich the display area R1.

The counter electrode CE is connected to the conductive layer QE through contact holes CH6 formed in a passivation film PS and a partition insulation film PI (or the passivation film PS alone if the partition insulation film PI is not positioned), on an edge of the non-display area R2. In addition, the counter electrode CE is connected to the conductive layer OE through contact holes CH7 formed in the passivation film PS and the partition insulation film PI (or the passivation film PS alone if the partition insulation film PI is not positioned), on the other edge of the non-display area R2.

The counter electrode CE and the conductive layer QE may be connected to each other at at least three portions. For example, the counter electrode CE and the conductive layer QE may be connected to each other on three edges of the non-display area R2 or all of four edges of the non-display area R2.

According to the display apparatus and the method for driving the display apparatus of the sixth embodiment configured as described above, the display apparatus comprises a first insulation film (planarizing film PL), a third conductive layer (conductive layer QE), a second insulation film (passivation film PS), and a display element (diode OLED) comprising a fourth conductive layer (pixel electrode PE). The above-described method of driving the display apparatus according to the third embodiment can be employed as a method of driving the display apparatus according to the present embodiment.

The conductive layer QE and the pixel electrode PE are opposed to each other to form the auxiliary capacitance Cad (i.e. capacitance unit). Since the auxiliary capacitance Cad can be formed without using the semiconductor layer, the auxiliary capacitance Cad can be arranged with a good efficiency. The conductive layer QE in the display area R1 connected to the low-potential power supply line PSL is set at a low potential Pvss. The same advantages as those of the fifth embodiment can be therefore obtained.

Furthermore, the counter electrode CE and the conductive layer QE are connected to each other at two portions in the non-display area R2 which are positioned to sandwich the display area R1. A gradient of the electric potential (low potential Pvss) of the counter electrode CE can be more reduced and a luminance gradient can be more reduced as compared with a case where the counter electrode CE and the conductive layer QE are connected to each other at one portion (one edge). The luminance gradient can be more reduced than that in the fifth embodiment.

Based on the above descriptions, the high-definition display apparatus and the method of driving the display apparatus can be obtained.

The above-described third to sixth embodiments have been presented as mere examples, and have not intended to limit the scope of the embodiments. The above-described third to sixth embodiments can be implemented by modifying the constituent elements without departing from the spirit thereof. In addition, various embodiments can be implemented by an arbitrary combination of the plurality of constituent elements disclosed in the above-described embodiments. For example, some of the constituent elements disclosed in the embodiments may be deleted. Furthermore, the constituent elements of different embodiments may be arbitrarily combined.

For example, the third conductive layer may further comprise a connected electrode BE. It is assumed here that the third conductive layer comprises the conductive layer QE and the connected electrode BE. As shown in FIG. 35, the conductive layer QE and the connected electrode BE are formed of metal (for example, Al). The connected electrode BE is connected to the source electrode SE of the drive transistor DRT through a contact hole provided in the planarizing film PL.

The pixel electrode PE is connected to the connected electrode BE through a contact hole CH3 provided in the passivation film PS. The pixel electrode PE may be connected indirectly to the source electrode SE of the drive transistor DRT as described above. The conductive layer QE is formed to be spaced apart from the connected electrode BE.

The third conductive layer may further comprise the connected electrode BE and a connected electrode EE. It is assumed here that the third conductive layer comprises the conductive layer QE, the connected electrode BE, and the connected electrode EE.

The conductive layer QE is formed of metal (for example, Al) as shown in FIG. 36. The connected electrode BE and the connected electrode EE are formed of a transparent conductive material (for example, ITO or IZO). The connected electrode EE is connected to the low-potential power supply line PSL through the contact hole CH4 provided in the passivation film PS. The conductive layer QE is formed of Al or the like after the connected electrode BE and the connected electrode EE are formed of ITO or the like.

In addition, when the connected electrode BE and the connected electrode EE are formed of a transparent conductive material, the electrode layer may be formed of the same material as the wiring lines such as the low-potential power supply line PSL and the video signal line VL, on the wiring lines, in the non-display area R2, though not shown in the figures. The electrode layer formed of ITO or the like has moisture-proof and is exposed to air. In other words, since the wiring lines exposed to the air can be covered with the electrode layer, degradation of the lines (products) can be decreased.

The semiconductor layer of TFT can be formed of not only polysilicon, but amorphous silicon. TFT that structures each of switches and the drive transistor DRT are not limited to N-channel type TFT, but may be P-channel type TFT. Similarly, the reset switch RST may be formed of N-channel or P-channel type TFT. The shape and size of the drive transistor DRT and the switches are not limited to the above-described embodiments, but can be changed as needed.

In addition, the output switch BCT is provided for four, eight or twelve pixels PX and thereby shared, but the number of output switches BCT can be increased or decreased as needed.

All pixels PX in a row may share one output switch BCT. In this case, the output switch BCT and the first scanning line Sga may be provided in the scanning line driving circuit YDR2 (YDR1). That is, in the output switch BCT, the source electrode is connected to the high-potential power supply, the drain electrode is connected to the reset line Sgr and the gate electrode is connected to the first scanning line Sga.

Furthermore, the self-emitting element which structures the pixel PX is not limited to the diode (organic EL diode) OLED, but can be formed by applying various self-emitting display elements.

The auxiliary capacitance Cad may be connected between the source electrode of the drive transistor DRT and the wiring line of a constant potential. The high-potential power supply line PSH or the low-potential power supply line PSL can be used as the wiring line of the constant potential.

The above-described third to sixth embodiments can be applied not only to the above-described display apparatus and the method of driving the display apparatus, but also to various types of display apparatuses and the methods of driving these display apparatuses.

Next, elements on the above-described third to sixth embodiments and their modified embodiments will be described below in (B1)-(B10).

(B1) A display apparatus comprising:
a first insulation film provided above a plurality of semiconductor layers, a first conductive layer and a second conductive layer formed in mutually different layers;
a third conductive layer provided on the first insulation film and connected to one of a high-potential power supply and a low-potential power supply;
a second insulation film provided on the first insulation film and the third conductive layer; and
a display element comprising a fourth conductive layer provided on the second insulation film,
wherein the third conductive layer and the fourth conductive layer are opposed to each other to form a capacitance unit.

(B2) The apparatus according to (B2), further comprising a plurality of pixels arrayed in a matrix along a row direction and a columnar direction, each of the plurality of pixels comprising:
the display element connected between the high-potential power supply and the low-potential power supply;
a drive transistor comprising a source electrode connected to the display element, a drain electrode connected to a reset line and a gate electrode;
an output switch connected between the high-potential power supply and the drain electrode of the drive transistor, and configured to change a state between the high-potential power supply and the drain electrode of the drive transistor to a conductive state or a non-conductive state;
a pixel switch connected between a video signal line and the gate electrode of the drive transistor, and configured to discriminate whether a signal provided via the video signal line is input to a side of the gate electrode of the drive transistor; and
a holding capacitance connected between the source electrode and the gate electrode of the drive transistor,
wherein the drive transistor, the output switch, the pixel switch and the holding capacitance are formed by using the plurality of semiconductor layers.

(B3) The apparatus according to (B2), wherein
the video signal line is formed to extend in the columnar direction, and
the third conductive layer is formed in a band shape to extend in the columnar direction, and is located in a position deviated from an area which is opposed to the video signal line.

(B4) The apparatus according to (B2), wherein the output switch is shared by the plurality of pixels.

(B5) The apparatus according to (B1), further comprising other third conductive layer provided in a layer same as the third conductive layer, formed in a band shape to extend in the columnar direction, located on the third conductive layer at intervals in an area deviated from an area which is opposed to the video signal line, and connected to the other of the high-potential power supply and the low-potential power supply.

(B6) The apparatus according to (B1), further comprising a low-potential power supply line provided in a rectangular frame type non-display area deviated from a rectangular display area, formed of metal and connected to the low-potential power supply, wherein the third conductive layer is provided in the display area and the non-display area, and is connected to the low-potential power supply line in each side of the non-display area.

(B7) The apparatus according to (B1), further comprising:
a low-potential power supply line provided in a non-display area deviated from a display area, formed of metal and connected to the low-potential power supply; and
an auxiliary electrode provided in the non-display area of side opposite to the low-potential power supply line in view of the display area, and formed of metal, wherein the third conductive layer is provided in the display area and the non-display layer, and connected to the low-potential power supply line and the auxiliary electrode.

(B8) The apparatus according to (B1), further comprising:
a first low-potential power supply line provided in a non-display area deviated from a display area, formed of metal and connected to the low-potential power supply; and
a second low-potential power supply line provided in the non-display area of side opposite to the low-potential power supply line in view of the display area, formed of metal and connected to the low-potential power supply, wherein the third conductive layer is provided in the display area and the non-display area, and is connected to the first low-potential power supply line and the second low-potential power supply line.

(B9) The apparatus according to (B1), further comprising:
a low-potential power supply line provided in a non-display area deviated from a display area, formed of metal and connected to the low-potential power supply; and
a fifth conductive layer provided in the display area and the non-display area above the fourth conductive layer, and forming the display element, wherein
the third conductive layer is provided in the display area and the non-display area, and is connected to the low-potential power supply line, and
the fifth conductive layer is connected to the third conductive layer in two points of the non-display area which are located to sandwich the display area.

(B10) The apparatus according to any one of (B1) to (B9), wherein the third conductive layer is formed of metal.

A display apparatus and a method of driving the display apparatus according to a seventh embodiment will be hereinafter described in detail with reference to the drawings. In the present embodiment, the display apparatus is an active matrix type display apparatus and, more specifically, an active matrix type organic EL (electroluminescent) display apparatus. In the present embodiment, the same functional portions as those of the above-described first embodiment are denoted by the same reference symbols, and their detailed descriptions are omitted. FIG. 1, FIG. 2, FIG. 7, FIG. 8 and FIG. 9, and the descriptions thereof can also be applied to the descriptions of the present embodiment.

FIG. 37 is a partially sectional view schematically showing an example of a structure applicable to the display apparatus according to the present embodiment. In FIG. 37, the display apparatus is illustrated such that a display surface, i.e., a front surface or a light emitting surface faces upwardly and a back surface faces downwardly. The display apparatus is a top-surface-emitting type organic EL display apparatus adopting the active matrix type drive.

Structures of a drive transistor DRT and a diode OLED will be described in detail with reference to FIG. 37.

An N-channel type TFT which forms the drive transistor DRT comprises a semiconductor layer SC. The semiconductor layer SC is provided on an insulation film PL serving as a first insulation film. An undercoat layer UC is provided on an insulation substrate SUB. The insulation film PL is provided on the undercoat layer UC. The semiconductor layer SC is, for example, a polysilicon layer including a p-type region and an n-type region.

The semiconductor layer SC is covered with a gate insulation film GI serving as a second insulation film. On the gate insulation film GI, a gate electrode G of the drive transistor DRT is provided. The gate electrode G is opposed to the semiconductor layer SC. On the gate insulation film GI and the gate electrode G, an interlayer insulation film II is provided.

On the interlayer insulation film II, a source electrode SE and a drain electrode DE are further provided. The source electrode SE and the drain electrode DE are connected to a source region and a drain region of the semiconductor layer SC, respectively, through a contact hole formed in the interlayer insulation film II and the gate insulation film GI. A passivation film PS is provided on the interlayer insulation film II, a source electrode SE and a drain electrode DE. The passivation film PS functions as an insulation film.

The diode OLED includes a pixel electrode PE, an organic layer ORG, and a counter electrode CE. In the present embodiment, the pixel electrode PE is an anode while the counter electrode CE is a cathode.

The pixel electrode PE is provided on the passivation film PS. The pixel electrode PE is connected to the source electrode SE through a contact hole formed in the passivation film PS. The pixel electrode PE is a back electrode having a light reflecting property. The pixel electrode PE is formed by stacking a transparent electrode layer (for example, ITO: indium tin oxide) and an electrode layer (for example, Al) having the light reflecting property.

When the pixel electrode PE is formed, a transparent conductive material (for example, ITO) is stacked on the passivation film PS, and a conductive material (for example, Al) having a light reflecting property is stacked on the transparent conductive material and is subjected to patterning using photolithography. The pixel electrode PE is thereby formed.

A partition insulation film PI is further provided on the passivation film PS. In the partition insulation film PI, a through hole is formed at a position corresponding to the pixel electrode PE, or a slit is formed at a position corresponding to a column or a row formed by the pixel electrode PE. As an example, the partition insulation film PI has a through hole at a position corresponding to the pixel electrode PE.

On the pixel electrode PE, the organic layer ORG including a luminous layer is provided as an active layer. The luminous layer is, for example, a thin film containing a luminescent organic compound in which a luminous color is red, green, blue or achromatic. The organic layer ORG can further include a hole injection layer, a hole transport layer, a hole blocking layer, an electron transport layer, an electron injection layer and the like, besides the luminous layer.

The luminous colors of the diode OLED do not need to be divided into red, green, blue and achromatic colors, but may be an achromatic color alone. In this case, the red, green, blue or achromatic color can be emitted by combining the diode OLED with a color filter of red, green, and blue.

The partition insulation film PI and the organic layer ORG are covered with the counter electrode CE. In this example, the counter electrode CE is an electrode connected to a like electrode among the pixels PX, i.e., a common electrode. In addition, in this example, the counter electrode CE is also a cathode and a light-transmitting front electrode. The counter electrode CE is electrically connected to an electrode line (not shown) formed in the same layer as the source electrode SE and the drain electrode DE through, for example, the contact holes formed in the passivation film PS and the partition insulation film PI.

In the diode OLED of this structure, an organic molecule constituting the organic layer ORG is excited to cause exciton to be generated when a hole injected from the pixel electrode PE and an electron injected from the counter electrode CE are recombined with each other inside the organic layer ORG. Light is emitted while the exciton is radiated and inactivated. The light is released from the organic layer ORG to the outside via the transparent counter electrode CE.

Next, structures of the drive transistor DRT, a holding capacitance Cs and an auxiliary capacitance Cad will be described in detail with reference to FIG. 37 and FIG. 38. FIG. 38 is a partially sectional view of the display apparatus according to the present embodiment, showing the drive transistor DRT, a power supply line PSH, a conductive layer AE, the conductive layer OE and the pixel electrode PE.

As shown in FIG. 37 and FIG. 38, a plurality of conductive layers OE serving as a plurality of first conductive layers are provided in a display area R1 and is formed on the undercoat layer UC. The insulation film PL is provided on the undercoat layer UC and the conductive layers OE. The conductive layers OE are formed of metal (for example, aluminum) serving as conductors.

In a non-display area R2 outside the display area R1, the conductive layers OE are connected to the power supply line PSH provided in the non-display area R2. The power supply line PSH is connected to a power supply of a constant potential. In the present embodiment, the power supply line PSH is connected to a high-potential power supply and is fixed to a high potential Pvdd. The conductive layers OE can be thereby set such that conductive layers OE does not become electrically in a floating state (i.e., the auxiliary capacitance Cad functions as a capacitance unit). The power supply line PSH may be connected to a low-potential power supply and fixed to a low potential Pvss.

Each of the conductive layers OE, the insulation film PL and the conductive layer (i.e. a source region of the semiconductor layer SC of the drive transistor DRT) opposed to one another form the auxiliary capacitance Cad (i.e. capacitance unit). The auxiliary capacitance Cad can be formed without using the electrode (conductive layer) in a layer higher than the semiconductor layer SC.

A plurality of conductive layers AE serving as a plurality of second conductive layers are provided in the display area R1 and are located on a gate insulation film GI. The diode OLED is provided above the conductive layers AE. Each of the conductive layers AE is formed of metal (for example, aluminum) serving as a conductor. The conductive layer AE is formed in the same layer as the gate electrode G. The conductive layer AE is connected to the gate electrode G.

In the present embodiment, the conductive layers OE and the conductive layers AE can be formed of metal since the display apparatus is an upper-surface illumination type display apparatus. If the display apparatus is a lower-surface illumination type display apparatus or a light-transmissive type display apparatus such as a liquid crystal display apparatus, formation of the conductive layers OE and the conductive layers AE of metal is undesirable.

Each of the conductive layers AE, the gate insulation film GI and the conductive layer (i.e. source region of the semiconductor layer SC of the drive transistor DRT) opposed to one another form the holding capacitance Cs (capacitance unit). The semiconductor layer SC, the gate insulation film GI and the gate electrode G form a top-gate type TFT.

The conductive layer OE and the conductive layer AE are formed in layers different from each other. The conductive layer OE and the conductive layer AE may be opposed to each other. In other words, since the auxiliary capacitance Cad and the holding capacitance Cs can be arranged with a good efficiency, use efficiency of space can be increased.

The arrangement of a plurality of pixels PX has been described above with reference to FIG. 7.

In addition, the operations of the display apparatus (organic EL display apparatus) constituted as described above have been described with reference to FIG. 8 and FIG. 9.

In the video signal writing period Pw, a relationship between a current Idrt flowing to the drive transistor DRT and the capacity Cs+Cel+Cad is represented by the following expression. $\Delta V1$ represents a displacement of the electric potential of the source electrode corresponding to a voltage value of a video signal Vsig, a video signal writing period Pw and a mobility of the transistor as determined by the following Expressions 2 to 4.

$$\int_0^{Pw} Idrt\,dt = \int_{Vs}^{Vs+\Delta V1}(Cs+Cel+Cad)dV \quad \text{(Expression 2)}$$

$$\int_0^{Pw} Idrt\,dt = \Delta V1 \times (Cs+Cel+Cad) \quad \text{(Expression 3)}$$

$$\Delta V1 = [\int_0^{Pw} Idrt\,dt]/(Cs+Cel+Cad) \quad \text{(Expression 4)}$$

where $$Idrt = \beta \times (Vgs-Vth)^2$$

$$= \beta \times [(Vsig-Vini) \times (Cel+Cad)/(Cs+Cel+Cad)]^2.$$

$\beta$ is defined by the following expression:

$$\beta = \mu \times Cox \times W/2L$$

where W represents a channel width of the drive transistor DRT, L represents a channel length of the drive transistor DRT, μ represents a carrier mobility, and Cox represents a gate capacitance per unit area.

Thus, $\Delta V1$ is proportional to the magnitude of the carrier mobility. As the mobility becomes greater, $\Delta V1$ also becomes greater. At the end of the video signal writing period Pw, Vgs is:

Vsig−[Vini−Vth+ΔV1+(Vsig−Vini)×Cs/(Cs+Cel+Cad)]=Vth−(Vsig−Vini)×(Cel+Cad)/(Cs+Cel+Cad)−ΔV1

If $\Delta V1$ becomes greater, i.e., if the mobility becomes greater, Vgs becomes more lowered, and the current flowing in the drive transistor is suppressed. The current variation depending on the magnitude of the mobility can be thereby corrected.

According to the display apparatus and the method of driving the display apparatus of the seventh embodiment configured as described above, the display apparatus comprises a plurality of conductive layers OE (a plurality of first conductive layers), the insulation film PL (first insulation film), a plurality of semiconductor layers SC (including the conductive layers serving as the source region and the drain region), the gate insulation film GI (second insulation film), a plurality of gate electrodes G and a plurality of conductive layers AE (a plurality of second conductive layers), and a plurality of diodes OLED (a plurality of display elements). The semiconductor layers SC, the gate insulation film GI and the gate electrodes G form the top-gate type TFT. The conductive layers OE, the insulation film PL, and the conductive layers (source regions of the semiconductor layers SC) form the auxiliary capacitances Cad (capacitance units).

The conductive layer OE and the insulation film PL are formed at a lower layer side of the semiconductor layer SC, and the auxiliary capacitance Cad is thereby formed. The auxiliary capacitance Cad can be formed without receiving an influence from the layout at an upper layer side of the semiconductor layer SC. Therefore, extension of the pixel size can be suppressed, and the pixel size can be optionally reduced.

The conductive layer OE and the conductive layer AE are formed in different layers. The conductive layer OE and the conductive layer AE may be opposed to each other. Since the auxiliary capacitance Cad and the holding capacitance Cs can be arranged with a good efficiency, utilization efficiency of space can be improved, which can contribute to the high definition in the pixels PX.

In addition, an effect of preventing incidence of light to the semiconductor layer SC by the conductive layer OE can be expected by providing the conductive layer OE at the lower layer side of the semiconductor layer SC. In this case, the volume of a leak current in the semiconductor layer SC can be suppressed.

Furthermore, production (producing process) can be more facilitated by forming the conductive layer at the lower layer side of the semiconductor layer SC as compared with forming the conductive layer at the upper layer side of the semiconductor layer SC.

Besides the above, the same advantages as the above-described first embodiment can be obtained from the display apparatus and the method of driving the display apparatus according to the present embodiment.

Based on the above descriptions, the high-definition display apparatus and the method of driving the display apparatus can be obtained.

Next, a modified example of the display apparatus according to the seventh embodiment will be explained. FIG. 39 is a partially sectional view of the modified example of the display apparatus according to the seventh embodiment, showing the drive transistor DRT, the power supply line PSH, the connected electrode AE, a connected electrode GE, the conductive layer OE, a conductive layer HE and the pixel electrode PE.

As shown in FIG. 39, the conductive layer OE is provided on the undercoat layer UC and is covered with the insulation film PL. The conductive layer OE is opposed to the conductive layer (i.e., source region of the semiconductor layer SC). The conductive layer OE, the insulation film PL, and the above conductive layer form the holding capacitance Cs. The conductive layer AE shown in FIG. 38 is not provided.

Besides the drain electrode DE and the source electrode SE (not shown), the connected electrode GE and the conductive layer HE are provided on the interlayer insulation film II. The connected electrode GE and the conductive layer HE are formed of the same material as the drain electrode DE and the source electrode SE, simultaneously with drain electrode DE and the source electrode SE.

A part of the connected electrode GE is connected to a gate electrode G through a contact hole formed in the interlayer insulation film II. The other part of the connected electrode GE is connected to the conductive layer OE through a contact hole formed in the insulation film PL, the gate insulation film GI and the interlayer insulation film II. This contact hole is positioned inside an opening formed in the conductive layer (i.e., the source region of the semiconductor layer SC) or is displaced from the above conductive layer.

The conductive layer HE is opposed to the conductive layer (i.e., the source region of the semiconductor layer SC). The conductive layer (i.e., the source region of the semiconductor layer SC), the gate insulation film GI, the interlayer insulation film II and the conductive layer HE form the auxiliary capacitance Cad. The conductive layer OE and the conductive layer HE are opposed to each other while sandwiching the conductive layer and the like.

The holding capacitance Cs may be formed at the lower side and the auxiliary capacitance Cad may be formed at the upper side as described above.

In the non-display area R2 provided outside display area R1, the conductive layer HE is connected to the power supply line PSH provided in the non-display area R2. The power supply line PSH is connected to the power supply of the constant potential as described above. In this example, the power supply line PSH is connected to the high-potential power supply and fixed to the high potential Pvdd. The conductive layer HE can be therefore set not to be electrically in the floating state. The power supply line PSH may be connected to a low-potential power supply and fixed to a low potential Pvss.

The above-described seventh embodiment has been presented as a mere example, and has not intended to limit the scope of the embodiments. The above-described seventh embodiment can be implemented by modifying the constituent elements without departing from the spirit thereof. In addition, various embodiments can be implemented by an arbitrary combination of the plurality of constituent elements disclosed in the above-described embodiment. For example, some of the constituent elements disclosed in the embodiment may be deleted. Furthermore, the constituent elements of different embodiments may be arbitrarily combined.

For example, the semiconductor layer of TFT can be formed of not only polysilicon, but amorphous silicon. TFT that structures each of switches and the drive transistor DRT are not limited to N-channel type TFT, but may be P-channel type TFT. Similarly, the reset switch RST may be formed of P-channel or N-channel type TFT. The shape and size of the drive transistor DRT and the switches are not limited to the above-described embodiment, but can be changed as needed.

One output switch BCT is provided for four pixels PX and thereby shared, but the number of output switches BCT can be increased or decreased as needed. For example, the output switch BCT may be provided for each of the pixels PX. Two pixels PX arrayed in one row x two columns or two rows x one column may share one output switch BCT, or eight pixels PX arrayed in two rows x four columns may share one output switch BCT.

All pixels PX in a row may share one output switch BCT. In this case, the output switch BCT and the first scanning line Sga may be provided in the scanning line driving circuit YDR2 (YDR1). That is, in the output switch BCT, the source electrode is connected to the high-potential power supply, the drain electrode is connected to the reset line Sgr, and the gate electrode is connected to the first scanning line Sga.

Furthermore, the self-emitting element which structures the pixel PX is not limited to the diode (organic EL diode) OLED, but can be formed by applying various self-emitting display elements.

The auxiliary capacitance Cad may be connected between the source electrode of the drive transistor DRT and the wiring line of a constant potential. The high-potential power supply line SLa, the low-potential power supply line PSL or the reset line Sgr can be used as the wiring line of the constant potential.

The above-described seventh embodiment can be applied not only to the above-described display apparatus and the method of driving the display apparatus, but also to various types of display apparatuses and the methods of driving these display apparatuses.

Next, elements on the above-described seventh embodiment and its modified embodiments will be described below in (C1)-(C9).

(C1) A display apparatus comprising:
a plurality of first conductive layers;
a first insulation film provided on the plurality of first conductive layers;
a plurality of conductor layers provided on the first insulation film;
a second insulation film provided on the first insulation film and the plurality of conductor layers;
a plurality of second conductive layers provided on the second insulation film; and
a plurality of display elements provided above the plurality of second conductive layers,
wherein the conductor layers, the second insulation film and the second conductive layer form a top-gate type thin film transistor, and
one of the first conductive layers, the insulation film and one of the conductor layers form a capacitance unit.

(C2) The apparatus according to (C1), further comprising a plurality of pixels arrayed in a matrix along a row direction and a columnar direction, each of the plurality of pixels comprising:
the display element connected between a high-potential power supply and a low-potential power supply;
a drive transistor comprising a source electrode connected to the display element, a drain electrode connected to a reset line and a gate electrode;
an output switch connected between the high-potential power supply and the drain electrode of the drive transistor, and configured to change a state between the high-potential power supply and the drain electrode of the drive transistor to a conductive state or a non-conductive state;
a pixel switch connected between a video signal line and the gate electrode of the drive transistor, and configured to discriminate whether a signal provided via the video signal line is input to a side of the gate electrode of the drive transistor; and
a holding capacitance connected between the source electrode and the gate electrode of the drive transistor,
wherein
the drive transistor is formed by the thin film transistor, and
the holding capacitance is formed by the capacitance unit.

(C3) The apparatus according to (C1), further comprising a plurality of pixels arrayed in a matrix along a row direction and a columnar direction, each of the plurality of pixels comprising:
the display element connected between a high-potential power supply and a low-potential power supply;
a drive transistor comprising a source electrode connected to the display element, a drain electrode connected to a reset line and a gate electrode;
an output switch connected between the high-potential power supply and the drain electrode of the drive transistor, and configured to change a state between the high-potential power supply and the drain electrode of the drive transistor to a conductive state or a non-conductive state;
a pixel switch connected between a video signal line and the gate electrode of the drive transistor, and configured to discriminate whether a signal provided via the video signal line is input to a side of the gate electrode of the drive transistor; and
an auxiliary capacitance connected between the display element and the high-potential power supply,
wherein
the drive transistor is formed by the thin film transistor, and
the auxiliary capacitance is formed by the capacitance unit.

(C4) The apparatus according to (C1), wherein one of the conductor layers, the second insulation film and one of the second conductive layers form the other capacitance unit besides the thin film transistor.

(C5) The apparatus according to (C4), further comprising a plurality of pixels arrayed in a matrix along a row direction and a columnar direction, each of the plurality of pixels comprising:
the display element connected between a high-potential power supply and a low-potential power supply;
a drive transistor comprising a source electrode connected to the display element, a drain electrode connected to a reset line and a gate electrode;
an output switch connected between the high-potential power supply and the drain electrode of the drive transistor, and configured to change a state between the high-potential power supply and the drain electrode of the drive transistor to a conductive state or a non-conductive state;
a pixel switch connected between a video signal line and the gate electrode of the drive transistor, and configured to discriminate whether a signal provided via the video signal line is input to a side of the gate electrode of the drive transistor;
a holding capacitance connected between the source electrode and the gate electrode of the drive transistor; and
an auxiliary capacitance connected between the display element and the high-potential power supply,
wherein
the drive transistor is formed by the thin film transistor,
one of the holding capacitance and the auxiliary capacitance is formed by the capacitance unit,
the other of the holding capacitance and the auxiliary capacitance is formed by the other capacitance unit.

(C6) The apparatus according to any one of (C2), (C3) and (C5), wherein the output switch is shared by the plurality of pixels.

(C7) The apparatus according to (C1), wherein the first conductive layers are formed of metal.

(C8) The apparatus according to (C1), wherein the first conductive layers are connected to power supply lines connected to a constant potential power supply, outside a display area.

(C9) The apparatus according to (C6), wherein the constant potential power supply is the high-potential power supply or the low-potential power supply.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A TFT array substrate comprising:
    a first drive transistor including a gate electrode and a semiconductor layer;
    a first electrode electrically connected to a source electrode or a drain electrode of the first drive transistor;
    a partition insulation layer covering an edge of the first electrode and including a first opening exposing an upper surface of the first electrode; and
    a second conductive layer between the gate electrode of the first drive transistor and the first electrode, wherein
    the second conductive layer extends so as not to be in contact with the gate electrode, the source electrode, and the drain electrode of the first drive transistor,
    the semiconductor layer of the first drive transistor includes a channel region where the semiconductor layer and the gate electrode are overlapped with each other in a plane view, and
    the first opening, the second conductive layer, and the channel region of the first drive transistor are overlapped with each other in the plane view.

2. The TFT array substrate according to claim 1, further comprising:
    a second drive transistor; and
    a second electrode adjacent to the first electrode, the second electrode electrically connected to a source electrode or a drain electrode of the second drive transistor, wherein
    the partition insulation layer covers an edge of the second electrode and includes a second opening exposing an upper surface of the second electrode,
    the second opening and the second conductive layer are overlapped with each other in the plane view, and
    the second conductive layer extends below the first opening and the second opening continuously.

3. The TFT array substrate according to claim 1, further comprising:
    a first signal line and a second signal line intersecting the first signal line, wherein
    the first signal line is formed in a same layer as the gate electrode of the first drive transistor,
    the second signal line extends so as not to be in contact with the first signal line and the second conductive layer, and
    the second conductive layer intersects the second signal line.

4. The TFT array substrate according to claim 3, wherein the second conductive layer intersects the first signal line.

5. The TFT array substrate according to claim 1, further comprising:
    a power supply line electrically connected to the source electrode or the drain electrode of the first drive transistor; and
    an output switch electrically connected between the power supply line and the first drive transistor, wherein
    the output switch is configured to select whether to allow or not to allow current flowing between the power supply line and the first drive transistor.

6. The TFT array substrate according to claim 5, wherein
    the output switch includes an output transistor including a further semiconductor layer extending from the semiconductor layer of the first drive transistor, and
    the semiconductor layer of the first drive transistor and the semiconductor layer of the output transistor are continuous.

* * * * *